(12) United States Patent
Dulle et al.

(10) Patent No.: US 10,468,654 B2
(45) Date of Patent: Nov. 5, 2019

(54) BATTERY MODULE PRINTED CIRCUIT BOARD ASSEMBLY SYSTEM AND METHOD

(71) Applicant: CPS Technology Holdings LLC, New York, NY (US)

(72) Inventors: Ronald J. Dulle, Mequon, WI (US); Mark D. Gunderson, Bristol, WI (US); Bryan L. Thieme, Colgate, WI (US)

(73) Assignee: CPS Technology Holdings LLC, New York, NY (US)

( * ) Notice: Subject to any disclaimer, the term of this patent is extended or adjusted under 35 U.S.C. 154(b) by 0 days.

(21) Appl. No.: 15/658,239

(22) Filed: Jul. 24, 2017

(65) Prior Publication Data

US 2017/0324075 A1    Nov. 9, 2017

Related U.S. Application Data

(63) Continuation of application No. 14/230,915, filed on Mar. 31, 2014, now Pat. No. 9,716,263.
(Continued)

(51) Int. Cl.
*H01M 2/20* (2006.01)
*H01M 2/22* (2006.01)
(Continued)

(52) U.S. Cl.
CPC .............. *H01M 2/22* (2013.01); *B60L 1/003* (2013.01); *B60L 1/02* (2013.01); *B60L 1/14* (2013.01); *B60L 3/0046* (2013.01); *B60L 3/12* (2013.01); *B60L 15/20* (2013.01); *B60L 50/16* (2019.02); *B60L 50/51* (2019.02); *B60L 50/61* (2019.02); *B60L 50/64* (2019.02); *B60L 50/66* (2019.02); *B60L 58/12* (2019.02); *B60L 58/21* (2019.02); *B60L 58/26* (2019.02); *B60R 16/03* (2013.01); *B60R 16/033* (2013.01); *G01R 31/3835* (2019.01); *H01H 47/325* (2013.01);
(Continued)

(58) Field of Classification Search
CPC .............. H01M 2010/4271; H01M 2010/4278
See application file for complete search history.

(56) References Cited

U.S. PATENT DOCUMENTS 5,179,340 A    1/1993   Rogers
6,304,062 B1   10/2001  Batson
(Continued)

FOREIGN PATENT DOCUMENTS

JP    2002170536    6/2002
JP    2010236980    10/2010
(Continued)

OTHER PUBLICATIONS

International Search Report & Written Opinion for International Application No. PCT/US2014/052554 dated Nov. 6, 2014.
CN 201480048653.5 Office Action dated Nov. 1, 2017.

*Primary Examiner* — Jeremiah R Smith
(74) *Attorney, Agent, or Firm* — Boardman & Clark LLP

(57) ABSTRACT

A battery module includes a housing, a plurality of battery cells disposed in the housing, and a printed circuit board (PCB) assembly disposed in the housing. The PCB assembly includes a PCB and a shunt disposed across a first surface of the PCB. A second surface of the shunt directly contacts the first surface of the PCB, and the shunt is electrically coupled between the battery cells and a terminal of the battery module.

17 Claims, 41 Drawing Sheets

Related U.S. Application Data

(60) Provisional application No. 61/874,472, filed on Sep. 6, 2013.

(51) Int. Cl.

| | | |
|---|---|---|
| *G01R 31/3835* | (2019.01) | |
| *B60R 16/03* | (2006.01) | |
| *H02J 7/00* | (2006.01) | |
| *H01M 10/04* | (2006.01) | |
| *H01M 10/42* | (2006.01) | |
| *H01M 10/058* | (2010.01) | |
| *H01M 2/12* | (2006.01) | |
| *H01M 2/10* | (2006.01) | |
| *H01M 2/24* | (2006.01) | |
| *H01M 2/34* | (2006.01) | |
| *H01H 47/32* | (2006.01) | |
| *H01M 10/48* | (2006.01) | |
| *H05K 1/18* | (2006.01) | |
| *H05K 3/32* | (2006.01) | |
| *H01M 2/30* | (2006.01) | |
| *H01M 10/6551* | (2014.01) | |
| *B60L 1/00* | (2006.01) | |
| *B60L 1/02* | (2006.01) | |
| *B60L 1/14* | (2006.01) | |
| *B60L 3/00* | (2019.01) | |
| *B60L 3/12* | (2006.01) | |
| *B60L 15/20* | (2006.01) | |
| *B60R 16/033* | (2006.01) | |
| *B60L 50/61* | (2019.01) | |
| *B60L 50/16* | (2019.01) | |
| *B60L 50/51* | (2019.01) | |
| *B60L 58/12* | (2019.01) | |
| *B60L 58/21* | (2019.01) | |
| *B60L 58/26* | (2019.01) | |
| *B60L 50/60* | (2019.01) | |
| *B60L 50/64* | (2019.01) | |
| *G01R 31/385* | (2019.01) | |
| *H01R 12/71* | (2011.01) | |
| *H05K 1/02* | (2006.01) | |
| *H02H 7/18* | (2006.01) | |
| *G01R 31/02* | (2006.01) | |
| *H01M 2/32* | (2006.01) | |
| *H01M 4/66* | (2006.01) | |

(52) U.S. Cl.
CPC ....... *H01M 2/1077* (2013.01); *H01M 2/1205* (2013.01); *H01M 2/1211* (2013.01); *H01M 2/1252* (2013.01); *H01M 2/20* (2013.01); *H01M 2/206* (2013.01); *H01M 2/24* (2013.01); *H01M 2/305* (2013.01); *H01M 2/34* (2013.01); *H01M 10/04* (2013.01); *H01M 10/0413* (2013.01); *H01M 10/058* (2013.01); *H01M 10/425* (2013.01); *H01M 10/4257* (2013.01); *H01M 10/482* (2013.01); *H01M 10/486* (2013.01); *H01M 10/6551* (2015.04); *H02J 7/0021* (2013.01); *H02J 7/0063* (2013.01); *H05K 1/18* (2013.01); *H05K 3/32* (2013.01); *B60L 2210/10* (2013.01); *B60L 2210/40* (2013.01); *B60L 2240/34* (2013.01); *B60L 2240/545* (2013.01); *B60L 2240/547* (2013.01); *B60L 2240/549* (2013.01); *B60L 2250/10* (2013.01); *B60L 2260/26* (2013.01); *B60L 2270/20* (2013.01); *G01R 31/025* (2013.01); *G01R 31/385* (2019.01); *H01M 2/32* (2013.01); *H01M 2/342* (2013.01); *H01M 4/661* (2013.01); *H01M 4/665* (2013.01); *H01M 2010/4271* (2013.01); *H01M 2010/4278* (2013.01); *H01M 2200/103* (2013.01); *H01M 2220/20* (2013.01); *H01M 2250/20* (2013.01); *H01R 12/716* (2013.01); *H02H 7/18* (2013.01); *H05K 1/0262* (2013.01); *H05K 1/0263* (2013.01); *H05K 2201/1053* (2013.01); *H05K 2201/10492* (2013.01); *H05K 2201/10545* (2013.01); *Y02T 10/6217* (2013.01); *Y02T 10/645* (2013.01); *Y02T 10/7005* (2013.01); *Y02T 10/705* (2013.01); *Y02T 10/7011* (2013.01); *Y02T 10/7016* (2013.01); *Y02T 10/7022* (2013.01); *Y02T 10/7044* (2013.01); *Y02T 10/7061* (2013.01); *Y02T 10/7077* (2013.01); *Y02T 10/7216* (2013.01); *Y02T 10/7241* (2013.01); *Y02T 10/7275* (2013.01); *Y10T 29/4911* (2015.01); *Y10T 29/49108* (2015.01); *Y10T 29/49114* (2015.01)

(56) References Cited

U.S. PATENT DOCUMENTS

| | | |
|---|---|---|
| 7,012,404 B2 | 3/2006 | Batson |
| 7,319,304 B2 | 1/2008 | Veloo et al. |
| 7,688,022 B2 | 3/2010 | Alvarez-Troncoso et al. |
| 8,305,034 B2 | 11/2012 | Rubio |
| 2004/0238205 A1* | 12/2004 | Miller ............ H05K 1/0293 174/250 |
| 2009/0041994 A1* | 2/2009 | Ockenfuss ......... H01L 24/18 428/209 |
| 2009/0224768 A1 | 9/2009 | Dollansky et al. |
| 2010/0124693 A1 | 5/2010 | Kosugi et al. |
| 2011/0292617 A1* | 12/2011 | Darroman ......... H02M 7/003 361/728 |
| 2012/0019061 A1* | 1/2012 | Nishihara ......... H01M 2/1077 307/10.1 |
| 2013/0200700 A1 | 8/2013 | Ohkura et al. |
| 2014/0154535 A1* | 6/2014 | Olsson ............ H01M 2/1264 429/53 |
| 2014/0363711 A1 | 12/2014 | Zhao |

FOREIGN PATENT DOCUMENTS

| | | |
|---|---|---|
| WO | 2012042912 | 4/2012 |
| WO | 2013143768 | 10/2013 |

* cited by examiner

BATTERY MODULE PRINTED CIRCUIT BOARD ASSEMBLY SYSTEM AND METHOD

CROSS REFERENCE TO RELATED APPLICATIONS

This application is a continuation of U.S. patent application Ser. No. 14/230,915, filed Mar. 31, 2014, entitled "BATTERY MODULE PRINTED CIRCUIT BOARD ASSEMBLY SYSTEM AND METHOD," which claims priority from and the benefit of U.S. Provisional Application Ser. No. 61/874,472, entitled "Battery Module System and Method" filed Sep. 6, 2013, each of which is hereby incorporated by reference.

BACKGROUND

The present disclosure relates generally to the field of batteries and battery modules. More specifically, the present disclosure relates to battery modules that may be used in vehicular contexts, as well as other energy storage/expending applications.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

A vehicle that uses one or more battery systems for providing all or a portion of the motive power for the vehicle can be referred to as an xEV, where the term "xEV" is defined herein to include all of the following vehicles, or any variations or combinations thereof, that use electric power for all or a portion of their vehicular motive force. As will be appreciated by those skilled in the art, hybrid electric vehicles (HEVs) combine an internal combustion engine propulsion system and a battery-powered electric propulsion system, such as 48 volt or 130 volt systems. The term HEV may include any variation of a hybrid electric vehicle. For example, full hybrid systems (FHEVs) may provide motive and other electrical power to the vehicle using one or more electric motors, using only an internal combustion engine, or using both. In contrast, mild hybrid systems (MHEVs) disable the internal combustion engine when the vehicle is idling and utilize a battery system to continue powering the air conditioning unit, radio, or other electronics, as well as to restart the engine when propulsion is desired. The mild hybrid system may also apply some level of power assist, during acceleration for example, to supplement the internal combustion engine. Mild hybrids are typically 96V to 130V and recover braking energy through a belt or crank integrated starter generator. Further, a micro-hybrid electric vehicle (mHEV) also uses a "Stop-Start" system similar to the mild hybrids, but the micro-hybrid systems of a mHEV may or may not supply power assist to the internal combustion engine and operates at a voltage below 60V. For the purposes of the present discussion, it should be noted that mHEVs typically do not technically use electric power provided directly to the crankshaft or transmission for any portion of the motive force of the vehicle, but an mHEV may still be considered as an xEV since it does use electric power to supplement a vehicle's power needs when the vehicle is idling with internal combustion engine disabled and recovers braking energy through an integrated starter generator. In addition, a plug-in electric vehicle (PEV) is any vehicle that can be charged from an external source of electricity, such as wall sockets, and the energy stored in the rechargeable battery packs drives or contributes to drive the wheels. PEVs are a subcategory of electric vehicles that include all-electric or battery electric vehicles (BEVs), plug-in hybrid electric vehicles (PHEVs), and electric vehicle conversions of hybrid electric vehicles and conventional internal combustion engine vehicles.

xEVs as described above may provide a number of advantages as compared to more traditional gas-powered vehicles using only internal combustion engines and traditional electrical systems, which are typically 12 volt systems powered by a lead acid battery. For example, xEVs may produce fewer undesirable emission products and may exhibit greater fuel efficiency as compared to traditional internal combustion vehicles and, in some cases, such xEVs may eliminate the use of gasoline entirely, as is the case of certain types of PHEVs.

As xEV technology continues to evolve, there is a need to provide improved power sources (e.g., battery systems or modules) for such vehicles. For example, it is desirable to increase the distance that such vehicles may travel without the need to recharge the batteries. Additionally, it may also be desirable to improve the performance of such batteries and to reduce the cost associated with the battery systems.

SUMMARY

Certain embodiments commensurate in scope with the originally claimed subject matter are summarized below. These embodiments are not intended to limit the scope of the disclosure, but rather these embodiments are intended only to provide a brief summary of certain disclosed embodiments. Indeed, the present disclosure may encompass a variety of forms that may be similar to or different from the embodiments set forth below.

The present disclosure relates to batteries and battery modules. More specifically, the present disclosure relates to all electrochemical and electrostatic energy storage technologies (e.g. ultracapacitors, nickel-zinc batteries, nickel-metal hydride batteries, and lithium batteries). Particular embodiments are directed to lithium ion battery cells that may be used in vehicular contexts (e.g., xEVs) as well as other energy storage/expending applications (e.g., energy storage for an electrical grid).

Battery modules in accordance with present embodiments include printed circuit board (PCB) assemblies configured to monitor characteristics of a flow of electric current through respective shunts of the battery modules. The shunt generally provides a low resistance electrical path for current originating from battery cells to flow toward an output terminal of the battery module, while aiding in the detection of a voltage output from the battery module. In accordance with present embodiments, a PCB assembly incorporates a PCB and a shunt in an arrangement that efficiently utilizes packaging volume and simplifies manufacturing processes relative to traditional battery module configurations.

Specifically, embodiments of the present disclosure relate to a battery module with a PCB assembly and a shunt that is mounted directly onto a PCB of the PCB assembly. The shunt may be disposed directly on a surface (e.g., a top surface) of the PCB, such that a metal portion of the shunt is in direct contact with electrical connectors exposed through the top surface of the PCB. Through this electrical engagement between the electrical connectors and the shunt, the shunt may be put into electrical communication with features on the PCB. For example, the electrical connectors may be coupled to a processor or measurement device of the PCB, such that current flowing through the shunt may flow through the electrical connectors to the processor or measurement device on the PCB, which may measure voltage output of the battery module.

Additionally, the shunt may be coupled to a bus bar and a connector such that the shunt provides an electrical pathway between the bus bar and the connector. The bus bar may be in electrical communication with a terminal of a battery cell in the battery module, and the connector may be in electrical communication with a terminal post of the battery module. Accordingly, the flow of electric current may proceed in order through the terminal of the battery cell, through the bus bar, through the shunt, through the connector, and through the terminal post of the battery module. Further, the terminal post may be coupled to a load that is powered by the battery module.

The shunt may be forced against (e.g., sandwiched against) the PCB by the bus bar, the connector, shunt clips of a lid of the battery module, or a combination thereof. For example, the bus bar and the connector may contact a top surface of the shunt and apply a downward force downwardly against the top surface of the shunt, pushing the shunt against the top surface of the PCB. Further, the PCB may be disposed atop the lid of the battery module, where the shunt clips of the lid extend upwardly and above the shunt. The shunt clips may include extensions that exert a downward force on the top surface of the shunt in the same manner as described with reference to the bus bar and the connector above. In some embodiments, an adhesive may be applied between a bottom surface of the shunt and the top surface of the PCB for coupling the shunt to the PCB.

A first embodiment of the present disclosure includes a battery module that includes a housing, a plurality of battery cells disposed in the housing, and a printed circuit board (PCB) assembly disposed in the housing. The PCB assembly includes a PCB and a shunt disposed across a first surface of the PCB. A second surface of the shunt directly contacts the first surface of the PCB, and the shunt is electrically coupled between the battery cells and a terminal of the battery module.

A second embodiment of the present disclosure includes a method. The method includes enabling an electric current to flow from one or more battery cells in a battery module to an output terminal of the battery module via a shunt of a printed circuit board (PCB) assembly in the battery module. A bottom surface of the shunt directly contacts a top surface of a PCB of the PCB assembly. The bottom surface of the shunt directly contacts an electrical connection of the PCB exposed through the top surface of the PCB. The method also includes receiving a signal indicative of the electric current flowing through the shunt at a measurement device of the PCB via the electrical connection. Further, the method includes measuring characteristics of the battery module based on the signal received via the measurement device.

A third embodiment of the present disclosure includes a method of manufacturing a battery module. The method includes disposing a printed circuit board (PCB) on top of a lid of the battery module, disposing a shunt on top of the PCB and directly against the PCB, and coupling the shunt to a bus bar on a first end of the shunt and to a connector on a second end of the shunt opposite the first end, where the connector is also coupled to an output terminal of the battery module. The method also includes coupling the bus bar to a terminal of a battery cell of the battery module. Further, the method includes coupling a bottom surface of the shunt with electrical connectors exposed on a top surface of the PCB and restraining the shunt on top of the PCB via a shunt clip. The shunt clips extend upwardly from the lid and over the shunt. The shunt clip includes an extension configured to exert a downward force against a top surface of the shunt.

The assemblies and individual components that make up the battery module may include various features that enable smaller packaging, efficient assembly, lowered cost, and enhanced operational characteristics of the battery module. These different features and their specific effects are described in detail below.

DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

Figure 1:
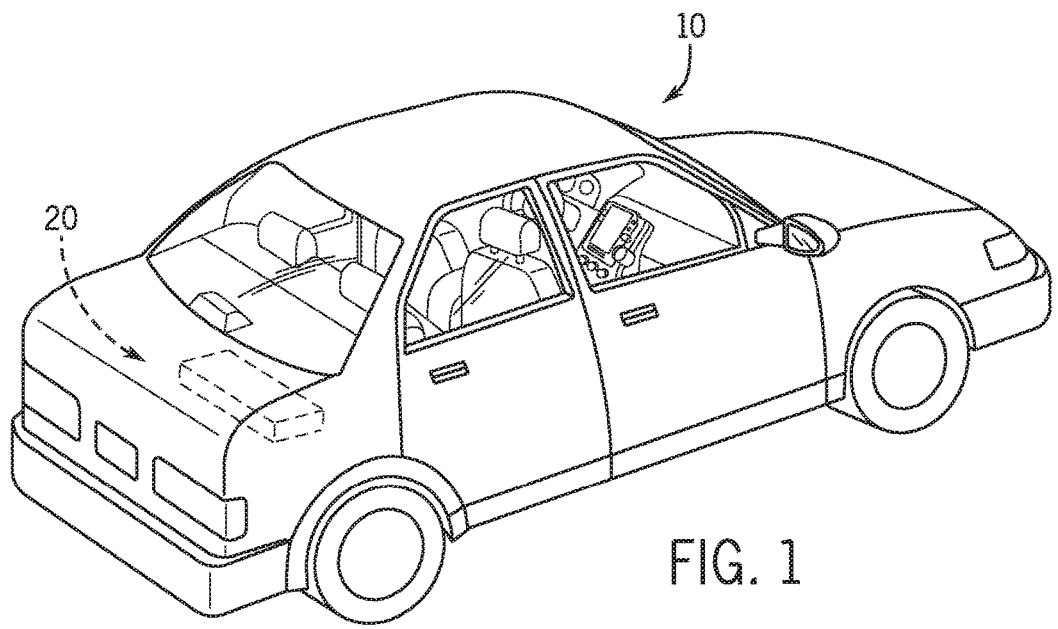
FIG. 1 is a perspective view of a vehicle (an xEV) having a battery system contributing all or a portion of the power for the vehicle, in accordance with an embodiment of the present approach.

It should be noted that terms such as "above", "below", "on top of", and "beneath" may be used to indicate relative positions for elements (e.g., layered components of the power and battery assemblies described below) and are not limiting embodiments to either of a horizontal or vertical stack orientation. Further, it should be noted that terms such as "above", "below", "proximate", or "near" are intended to indicate the relative positions of two components or layers that may or may not be in direct contact with one another. Additionally, geometric references are not intended to be strictly limiting.

As discussed above, there are several different types of xEVs. Although some vehicle manufacturers produce only xEVs and, thus, can design the vehicle from scratch as an xEV, most vehicle manufacturers produce primarily traditional internal combustion vehicles. Thus, when one of these manufacturers also desires to produce an xEV, it often utilizes one of its traditional vehicle platforms as a starting point. As can be appreciated, when a vehicle has been initially designed to use a traditional electrical system powered by a single lead acid battery and to utilize only an internal combustion engine for motive power, converting such a vehicle into its HEV version can pose many packaging problems. For example, a FHEV uses not only these traditional components, but one or more electric motors must be added along with other associated components. As another example, a mHEV also uses not only these traditional components, but a higher voltage battery (e.g., a 48V lithium ion battery module) must be placed in the vehicle in addition to the 12V lead acid battery along with other components such as a belt integrated starter-generator, sometimes referred to as a belt alternator starter (BAS) as described in further detail below. Hence, if a battery system can be designed to reduce such packaging problems, it would make the conversion of a traditional vehicle platform into an xEV less costly and more efficient.

The battery systems described herein may be used to provide power to a number of different types of xEVs as well as other energy storage applications (e.g., electrical grid power storage systems). Such battery systems may include one or more battery modules, each battery module having a number of battery cells (e.g., lithium ion electrochemical cells) arranged to provide particular voltages and/or currents useful to power, for example, one or more components of an xEV.

Present embodiments also include physical battery module features, assembly components, manufacturing and assembling techniques, and so forth, that facilitate providing disclosed battery modules and systems that have a desired form factor (e.g., dimensions approximately corresponding to or smaller than a traditional lead acid battery). Further, as set forth in detail below, the disclosed battery module embodiments include a lower housing configured to receive battery cells of the battery module. In addition, the disclosed battery module embodiments include a lid assembly, a PCB assembly, battery terminal posts extending from the battery module, and a cover. Each of these assemblies may include features that facilitate relatively easy assembly of the battery module, lowered cost of assembling the battery module, longer life of the battery module, and reduced packaging of the battery module. These features are discussed in further detail below.

With the foregoing in mind, FIG. 1 is a perspective view of an xEV 10 in the form of an automobile (e.g., a car) having a battery system 20 in accordance with present embodiments for providing all or a portion of the power (e.g., electrical power and/or motive power) for the vehicle 10, as described above. Although the xEV 10 may be any of the types of xEVs described above, by specific example, the xEV 10 may be a mHEV, including an internal combustion engine equipped with a microhybrid system which includes a start-stop system that may utilize the battery system 20 to power at least one or more accessories (e.g., AC, lights, consoles, etc.), as well as the ignition of the internal combustion engine, during start-stop cycles.

Further, although the xEV 10 is illustrated as a car in FIG. 1, the type of vehicle may differ in other embodiments, all of which are intended to fall within the scope of the present disclosure. For example, the xEV 10 may be representative of a vehicle including a truck, bus, industrial vehicle, motorcycle, recreational vehicle, boat, or any other type of vehicle that may benefit from the use of electric power. Additionally, while the battery system 20 is illustrated in FIG. 1 as being positioned in the trunk or rear of the vehicle, according to other embodiments, the location of the battery system 20 may differ. For example, the position of the battery system 20 may be selected based on the available space within a vehicle, the desired weight balance of the vehicle, the location of other components used with the battery system 20 (e.g., battery management systems, vents or cooling devices, etc.), and a variety of other considerations.

Figure 2:
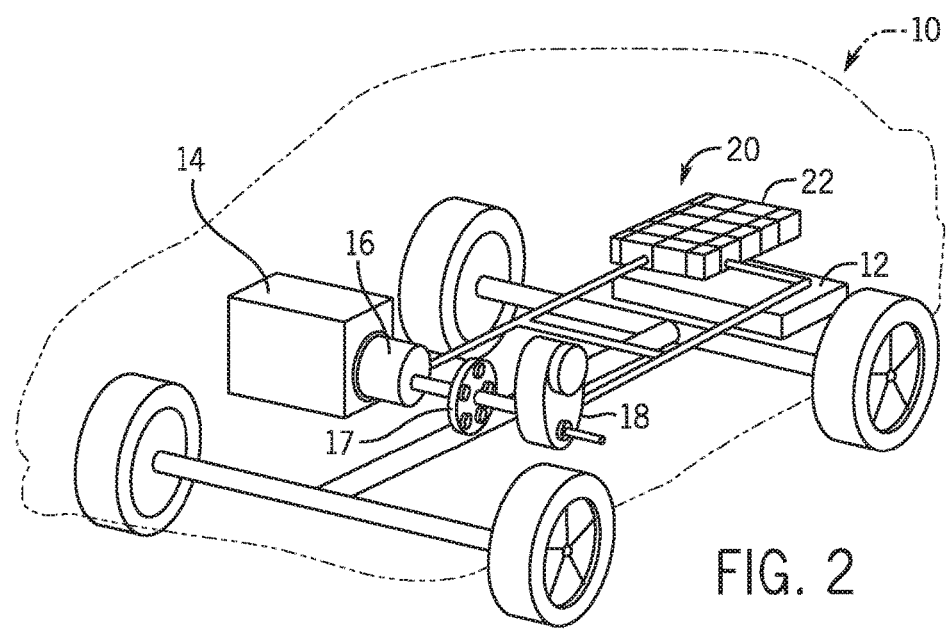
FIG. 2 is a cutaway schematic view of the xEV of FIG. 1 in the form of a hybrid electric vehicle (HEV), in accordance with an embodiment of the present approach.

FIG. 2 illustrates a cutaway schematic view of an embodiment of the xEV 10 of FIG. 1, provided in the form of an HEV having the battery system 20, which includes one or more battery modules 22. In particular, the battery system 20 illustrated in FIG. 2 is disposed toward the rear of the vehicle 10 proximate a fuel tank 12. In other embodiments, the battery system 20 may be provided immediately adjacent the fuel tank 12, provided in a separate compartment in the rear of the vehicle 10 (e.g., a trunk), or provided in another suitable location in the xEV 10. Further, as illustrated in FIG. 2, an internal combustion engine 14 may be provided for times when the xEV 10 utilizes gasoline power to propel the vehicle 10. The vehicle 10 also includes an electric motor 16, a power split device 17, and a generator 18 as part of the drive system.

The xEV 10 illustrated in FIG. 2 may be powered or driven by the battery system 20 alone, by the combustion engine 14 alone, or by both the battery system 20 and the engine 14. It should be noted that, in other embodiments of the present approach, other types of vehicles and configurations for the vehicle drive system may be utilized, and that the schematic illustration of FIG. 2 should not be considered to limit the scope of the subject matter described in the present application. According to various embodiments, the size, shape, and location of the battery system 20, the type of vehicle, the type of xEV technology, and the battery chemistry, among other features, may differ from those shown or described.

The battery system 20 may generally include one or more battery modules 22, each having a plurality of battery cells (e.g., lithium ion electrochemical cells), which are discussed in greater detail below. The battery system 20 may include features or components for connecting the multiple battery modules 22 to each other and/or to other components of the vehicle electrical system. For example, the battery system 20 may include features that are responsible for monitoring and controlling the electrical and thermal performance of the one or more battery modules 22.

Figure 3:
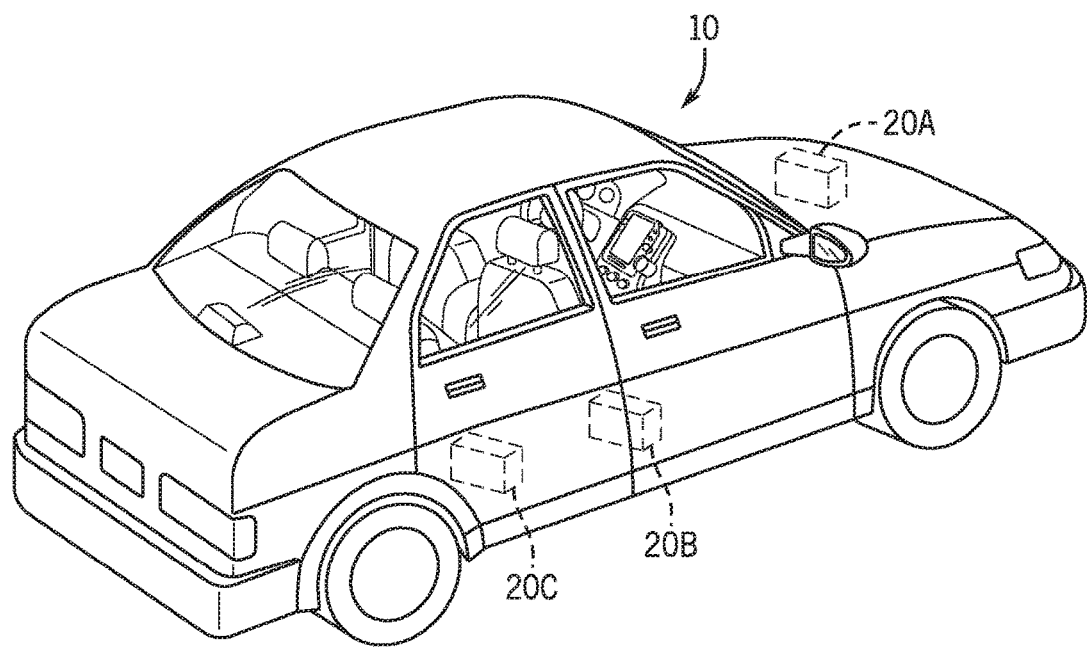
FIG. 3 is a cutaway schematic view of the xEV of FIG. 1 in the form of a microhybrid electric vehicle (mHEV), in accordance with an embodiment of the present approach.

FIG. 3 illustrates a cutaway schematic view of another embodiment of the xEV 10 of FIG. 1, provided in the form of a mHEV 10 having the battery system 20. Such a battery system 20 may be placed in a location in the mHEV 10 that would have housed a traditional battery prior to conversion to an mHEV. For example, as illustrated in FIG. 3, the mHEV 10 may include the battery system 20A positioned similarly to a lead-acid battery of a typical combustion-engine vehicle (e.g., under the hood of the vehicle 10). By further example, in certain embodiments, the mHEV 10 may include the battery system 20B positioned near a center of mass of the mHEV 10, such as below the driver or passenger seat. By still further example, in certain embodiments, the mHEV 10 may include the battery system 20C positioned below the rear passenger seat or near the trunk of the vehicle. It should be appreciated that, in certain embodiments, positioning a battery system 20 (e.g., battery system 20B or 20C) in or about the interior of the vehicle may enable the use of air from the interior of the vehicle to cool the battery system 20 (e.g., using a forced-air cooling design).

Figure 4:
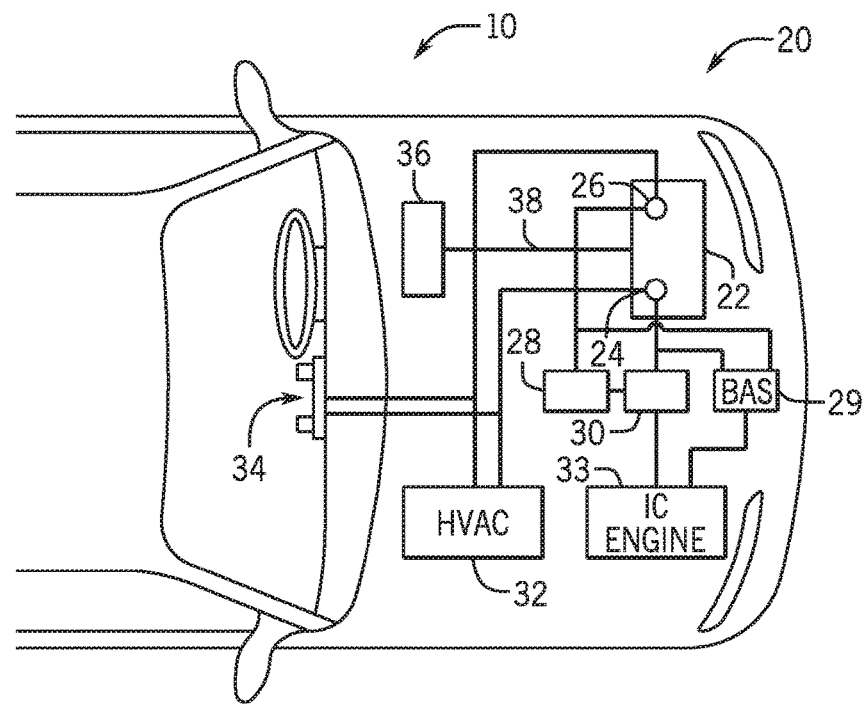
FIG. 4 is a schematic view of the mHEV of FIG. 3 illustrating power distribution throughout the mHEV, in accordance with an embodiment of the present approach.

FIG. 4 is a schematic view of an embodiment of the mHEV 10 of FIG. 3 having an embodiment of the battery system 20 disposed under the hood of the vehicle 10. As previously noted and as discussed in detail below, the battery system 20 may include a battery module 22 having dimensions comparable to those of a typical lead-acid battery to limit or eliminate modifications to the mHEV 10 design to accommodate the battery system 20. The battery module 22 illustrated in FIG. 4 is a two-terminal battery that is capable of providing approximately a 48V output. For example, a first terminal 24 may provide a ground connection, and a second terminal 26 may provide a 48V output. However, it should be noted that other embodiments of the battery module 22 described herein may be capable of storing and outputting power at a different voltage. The battery system 20 may include a DC-DC converter 28 for converting the output of the battery module 22 to a lower voltage (e.g., 12V). As illustrated, the 48V output of the battery module 22 may be coupled to a belt alternator starter (BAS) 29, which may be used to start an internal combustion engine 33 during start-stop cycle, and the 12 V output of the DC-DC converter 28 may be coupled to a traditional ignition system (e.g., starter motor 30) to start the internal combustion engine 33 during instances when the BAS 29 is not used to do so. It should also be understood that the BAS 29 may also capture energy from a regenerative braking system or the like (not shown) to recharge the battery module 22.

It should be appreciated that the 48 V and 12 V outputs of the battery system 20 may also be provided to other components of the mHEV 10. Examples of components that may utilize the 48 V output in accordance with present embodiments include radiator cooling fans, climate control fans, electric power steering systems, active suspension systems, electric air-conditioning systems, auto park systems, cooled seats, electric oil pumps, electric super/turbochargers, electric water pumps, heated seats, heated windscreen/defrosters, and engine ignitions. Examples of components that may utilize the 12 V output from the DC-DC converter 28 in accordance with present embodiments include window lift motors, vanity lights, tire pressure monitoring systems, sunroof motor controls, power seats, alarm systems, infotainment online features, navigation features, lane departure warning systems, electric parking brakes, and external lights. The examples set forth above are not exhaustive and there may be overlap between the listed examples. Indeed, in some embodiments, features listed above as being associated with a 48 V load may utilize the 12 V output instead and vice versa.

In the illustrated embodiment, the 48 V output of the battery module 22 may be used to power one or more accessories of the mHEV 10. For example, as illustrated in FIG. 4, the 48 V output of the battery module 22 may be coupled to a heating, ventilation, and air conditioning (HVAC) system 32 (e.g., including compressors, heating coils, fans, pumps, and so forth) of the mHEV 10 to enable the driver to control the temperature of the interior of the mHEV 10 during operation of the vehicle. This is particularly important in an mHEV 10 during idle periods when the internal combustion engine 33 is stopped and, thus, not providing any electrical power via engine charging. As also illustrated in FIG. 4, the 48 V output of the battery module 22 may be coupled to the vehicle console 34, which may include entertainment systems (e.g., radio, CD/DVD players, viewing screens, etc.), warning lights and indicators, controls for operating the mHEV 10, and so forth. Hence, it should be appreciated that the 48 V output may, in certain situations, provide a more efficient voltage at which to operate the accessories of the mHEV 10 (e.g., compared to 12 V), especially when the internal combustion engine 33 is stopped (e.g., during start-stop cycles). It should also be appreciated that, in certain embodiments, the 48 V output of the battery module 22 may also be provided to any other suitable components and/or accessories (e.g., lights, switches, door locks, window motors, windshield wipers, and so forth) of the mHEV 10.

Also, the mHEV 10 illustrated in FIG. 4 includes a vehicle control module (VCM) 36 that may control one or more operational parameters of the various components of the vehicle 10, and the VCM 36 may include at least one memory and at least one processor programmed to perform such tasks. Like other components of the mHEV 10, the battery module 22 may be coupled to the VCM 36 via one or more communication lines 38, such that the VCM 36 may receive input from the battery module 22, and more specifically, a battery control module (BCM) of the battery module 22. For example, the VCM 36 may receive input from the battery module 22 regarding various parameters, such as state of charge and temperature, and the VCM 36 may use these inputs to determine when to charge and/or discharge the battery module 22, when to discontinue charging the battery module 22, when to start and stop the internal combustion engine 33 of the mHEV 10, whether to use the BAS 29 or the starter 30, and so forth.

Figure 5:
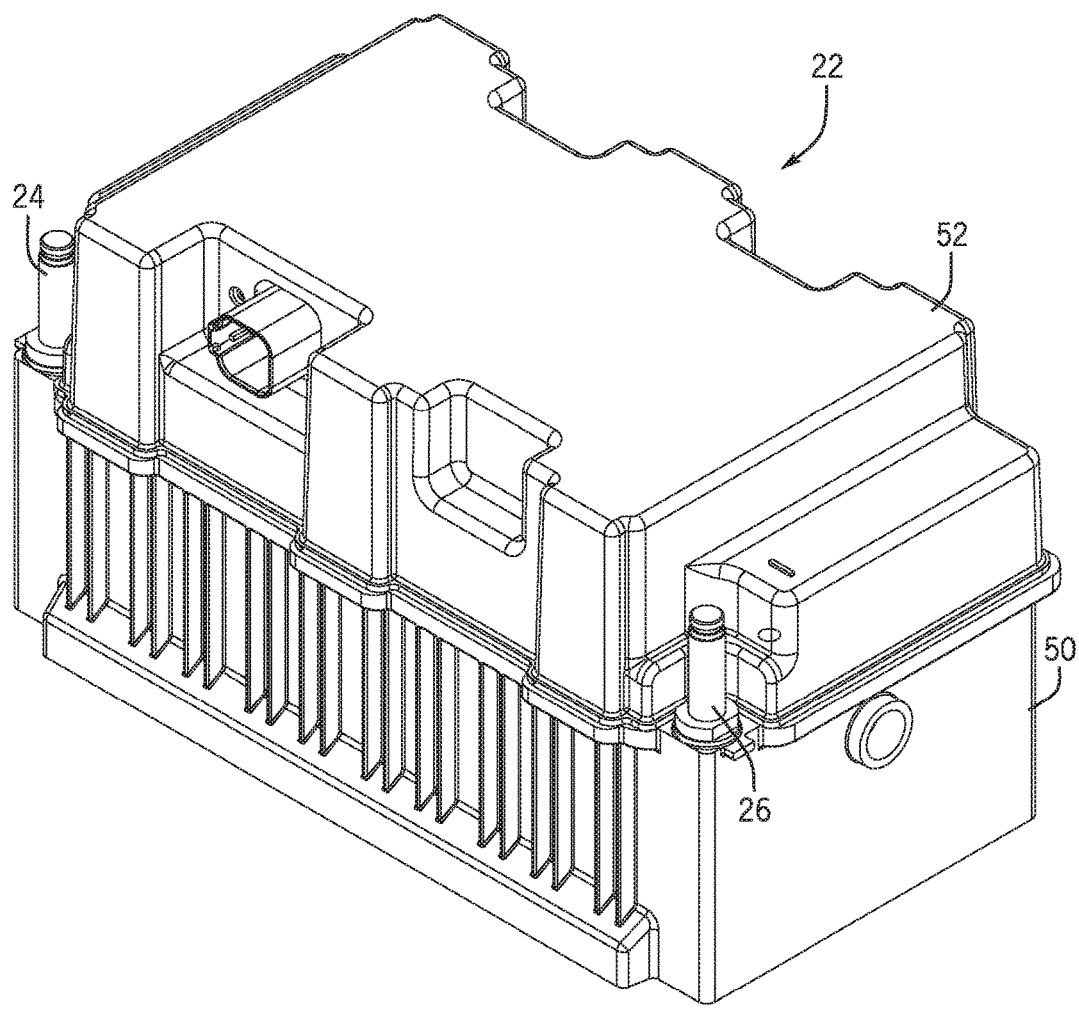
FIG. 5 is a perspective view of a battery module for use in the battery system of FIG. 1, in accordance with an embodiment of the present approach.

Turning to FIG. 5, present embodiments include the battery module 22, which may be considered generally representative of a battery module that is a non-lead acid battery (e.g., a battery module including ultracapacitors, nickel-zinc batteries, nickel-metal hydride batteries, and lithium batteries). In particular, the battery module 22 illustrated in FIG. 5 is a lithium ion battery module. Further, the battery module 22 may include certain features, described in detail below, that facilitate the relatively easy and cost efficient manufacture of the battery module 22. Additionally, the battery module 22 may include features that enable a relatively small packaging of the battery module 22, such that the battery module 22 may conform to an overall geometry or dimensions that are comparable to, or smaller than, the dimensions of a lead-acid battery.

In the illustrated embodiment, the battery module 22 includes a lower housing 50 and a cover 52 that are coupled together to form an enclosure of the battery module 22. As described in detail below, this enclosure may hold a number of prismatic battery cells, bus bars, printed circuit boards, and other equipment used to provide store and provide power at a desired voltage output. The battery terminals 24 and 26 extend out of the enclosed battery module 22 for coupling of an external load to the battery module 22.

Figure 6:
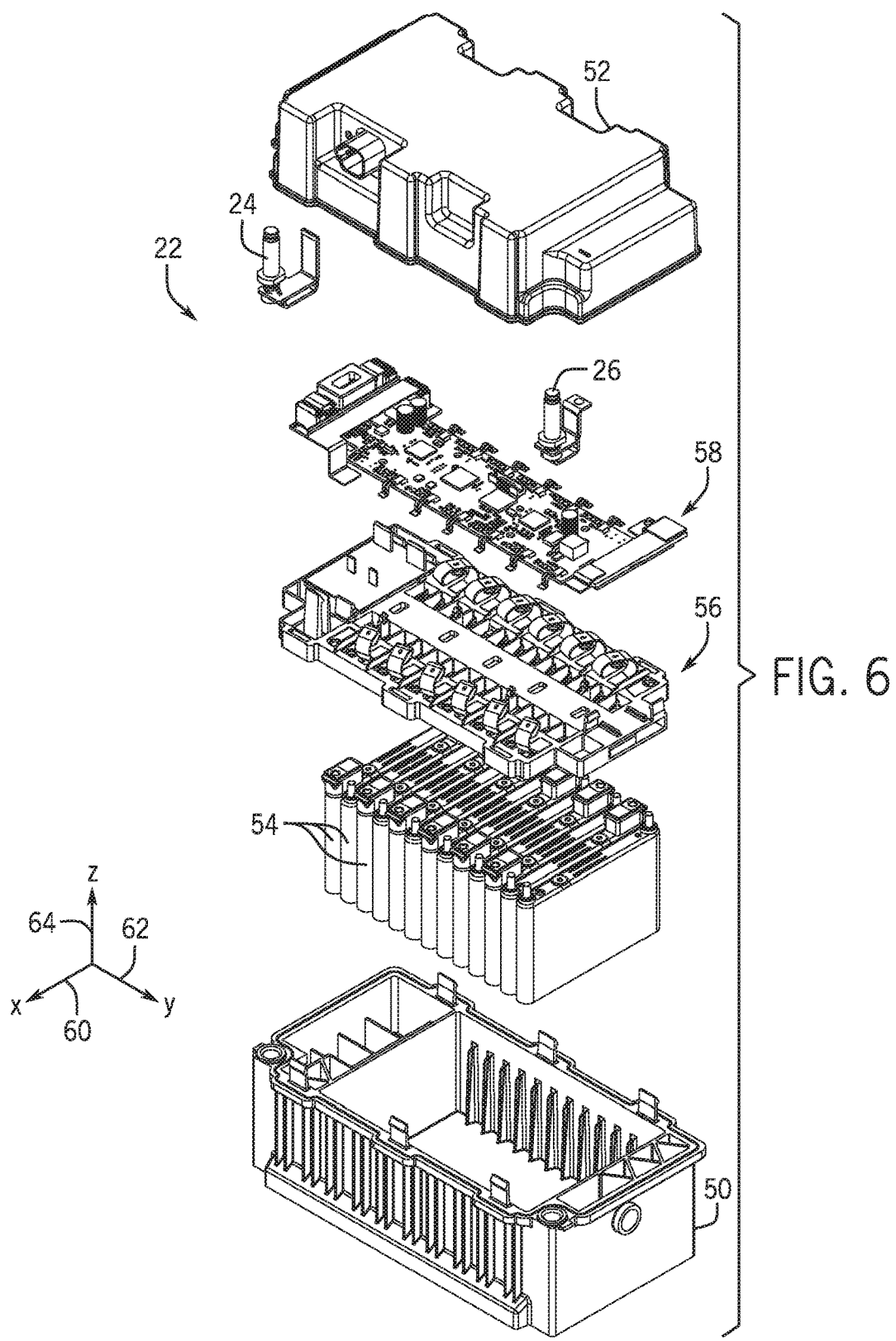
FIG. 6 is an exploded perspective view of the battery module of FIG. 5, in accordance with an embodiment of the present approach.

FIG. 6 is an exploded perspective view of the battery module 22 of FIG. 5. As illustrated, the battery module 22 may include, among other things, the lower housing 50, battery cells 54 disposed in the lower housing 50, a lid assembly 56, a printed circuit board (PCB) assembly 58, battery terminals 24 and 26, and the cover 52. The lower housing 50 and the cover 52 form an outer enclosure for the battery module 22, and the battery cells 54, the lid assembly 56, and the PCB assembly 58 are held within this enclosure. The battery terminals 24 and 26 are configured to protrude out of the enclosure formed by the lower housing 50 and the cover 52, in order to facilitate attachment of an outside electric load to the battery module 22. Each of the illustrated sections (e.g., lower housing 50, lid assembly 56, PCB assembly 58, terminals 24 and 26, and cover 52) include features, discussed in detail below, that facilitate the efficient assembly of a relatively compact battery module 22.

It should be noted that, in the illustrated embodiment, the battery module 22 includes thirteen individual battery cells 54. As illustrated, the battery cells 54 may be arranged in a face-to-face, or stacked, orientation relative to each other. As discussed in detail below, these battery cells 54 may be coupled in series within the battery module 22 to provide a desired voltage output. For example, to output a desired voltage of approximately 48V, each of the thirteen battery cells 54 may be configured to provide a voltage within a range of approximately 3.5V to 3.9V. Although the illustrated embodiment includes thirteen such battery cells 54, the battery module 22 may include any number of individual battery cells 54 coupled together in series, parallel, or a combination thereof, to provide the desired voltage output.

Having now generally introduced the features (e.g., lower housing 50, battery cells 54, lid assembly 56, PCB assembly, and cover 52) within the presently disclosed battery module 22, a more detailed discussion of these features will be provided. To facilitate discussion of the battery module 22 and the various assemblies and components thereof, an X axis 60 is defined as extending through a width of the battery module 22, a Y axis 62 is defined as extending through a length of the battery module 22, and a Z axis 64 is defined as extending through a height of the battery module 22.

Enclosure for Holding Battery Cells of a Lithium Ion Battery Module

Figure 7:
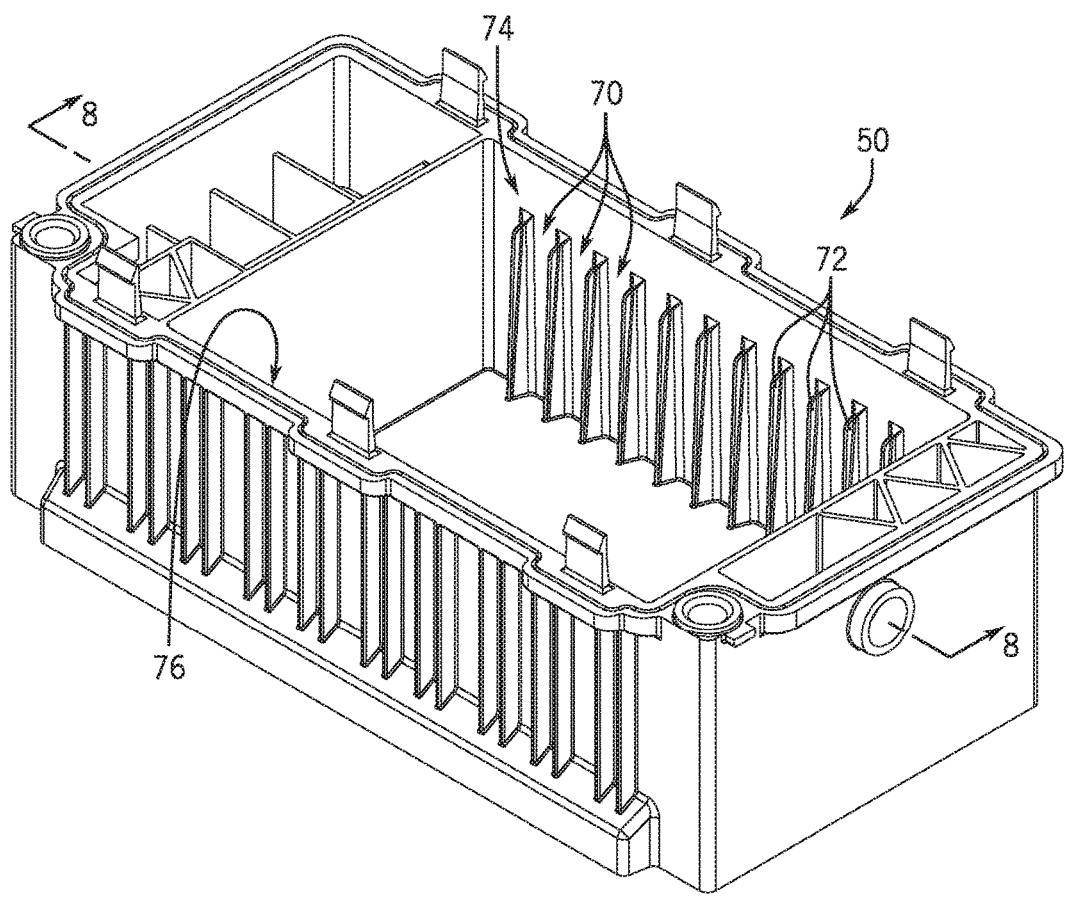
FIG. 7 is a perspective view of a lower housing of the battery module of FIG. 5, in accordance with an embodiment of the present approach.

FIG. 7 illustrates the lower housing 50 that may be used to hold the battery cells 54 of the battery module 22. As mentioned above, the battery module 22 may be a lithium ion battery with a number of individual lithium ion battery cells (e.g., battery cells 54) for outputting a desired voltage from the battery module 22. The illustrated lower housing 50, in conjunction with other components of the battery module 22 (e.g., cover 52) is configured to hold and secure a number of prismatic battery cells 54 in a face-to-face arrangement. As discussed in detail below, the lower housing 50 may include a number of features that facilitate effective positioning, expansion force management, cooling, and overall enclosure of the battery cells 54. The lower housing 50 may be injection molded into a single piece having one or more of the features described below. The lower housing 50 may be constructed from any desirable materials, including, for example, glass-filled nylon or plastic.

In the illustrated embodiment, the lower housing 50 includes slots 70 defined by ribs 72 (e.g., partitions) along an interior edge (e.g., interior wall) of the lower housing 50. These slots 70 are designed to receive and hold the prismatic battery cells 54 within the battery module 22. Although the ribs 72 are only visible on one interior wall 74 of the lower housing 50 in FIG. 7, another row of ribs 72 may be present along an opposing interior wall 76 of the lower housing 50, in order to maintain the battery cells 54 in alignment relative to each other, the lower housing 50, and other components of the battery module 22. The ribs 72 (e.g., partitions) of the interior wall 74 may align with the ribs 72 (e.g., partitions) of the opposing interior wall 76.

Figure 8:
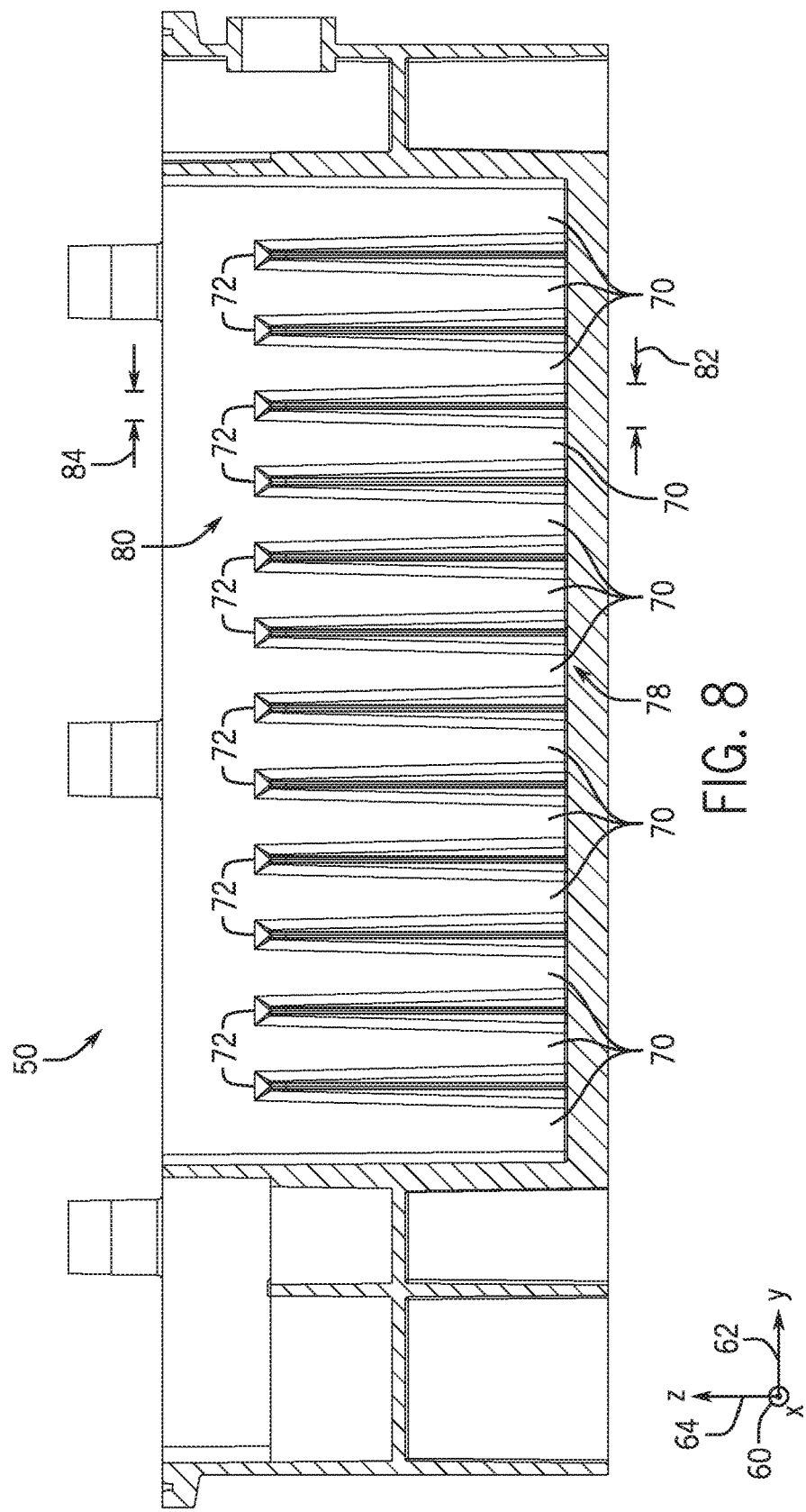
FIG. 8 is a side cutaway view of the lower housing of FIG. 7, in accordance with an embodiment of the present approach.

FIG. 8 is a side view of the lower housing 50 showing the ribs 72 (e.g., partitions) formed in the interior wall 74. The ribs 72 are substantially equally spaced relative to each other and designed to hold one prismatic battery cell 54 within each slot 70 formed between adjacent ribs 72. The ribs 72 may maintain the battery cells 54 in a position spaced slightly apart from each other. This allows the battery cells 54 to swell and change dimensions without putting an undesirable strain on the lower housing 50. That is, the ribs 72 are configured to hold the battery cells 54 therebetween in such a way that the battery cells 54 are restrained within the battery module 22 and are also allowed to expand due to temperature increases within the battery module 22.

In traditional battery modules that utilize multiple prismatic battery cells, the battery cells are often clamped or otherwise bound together and then placed in an enclosure. As temperatures increase and each of the battery cells expands, the accumulated expansion force from all of the battery cells may be transferred to the structure that is holding them. However, the presently disclosed lower housing 50 features the ribs 72, which allow each battery cell 54 to expand separately against the ribs 72, without applying an accumulated expansion force to each of the opposing ends of the lower housing 50. Decreasing this force on the lower housing 50 may allow a more compact packaging of the battery module 22 than would be available with traditional designs where the battery cells are held together tightly.

In the illustrated embodiment, the ribs 72 are wider along a bottom portion 78 of the lower housing 50 than at a top portion 80 of the lower housing 50. That is, the ribs 72 extend further in the direction of the Y axis 62 at the bottom portion 78 than they do at the top portion 80, as illustrated by a lower width dimension 82 of one of the ribs 72 with respect to an upper width dimension 84 of the rib 72. This widening (e.g., reverse tapering) of the ribs 72 toward the bottom portion 78 facilitates a narrowing of the slots 70 used to hold the battery cells 54. This dimensioning of the ribs 72 may result in the battery cells 54 being held more tightly at the bottom portion 78 of the lower housing 50 than at the top portion 80.

The widening ribs 72 may facilitate relatively easy assembly of the battery module 22. For example, the larger openings of the slots 70 at the top portion 80 act as a lead-in for the battery cells 54 to assist in placement of the battery cells 54 into corresponding slots 70. The widening ribs 72 may accommodate tolerances inherent within pick-and-place machinery used to lower the battery cells 54 into the slots 70 during assembly. In addition, the widening ribs 72 may enable movement of the battery cells 54 near the top portion 80 so that the battery cells 54 can be aligned with and welded to other components within the battery module 22. The flexibility of movement of the battery cells 54 within the slots 70 may facilitate a simplified assembly process while ensuring the battery cells 54 are held in place within the battery module 22.

Figure 9:
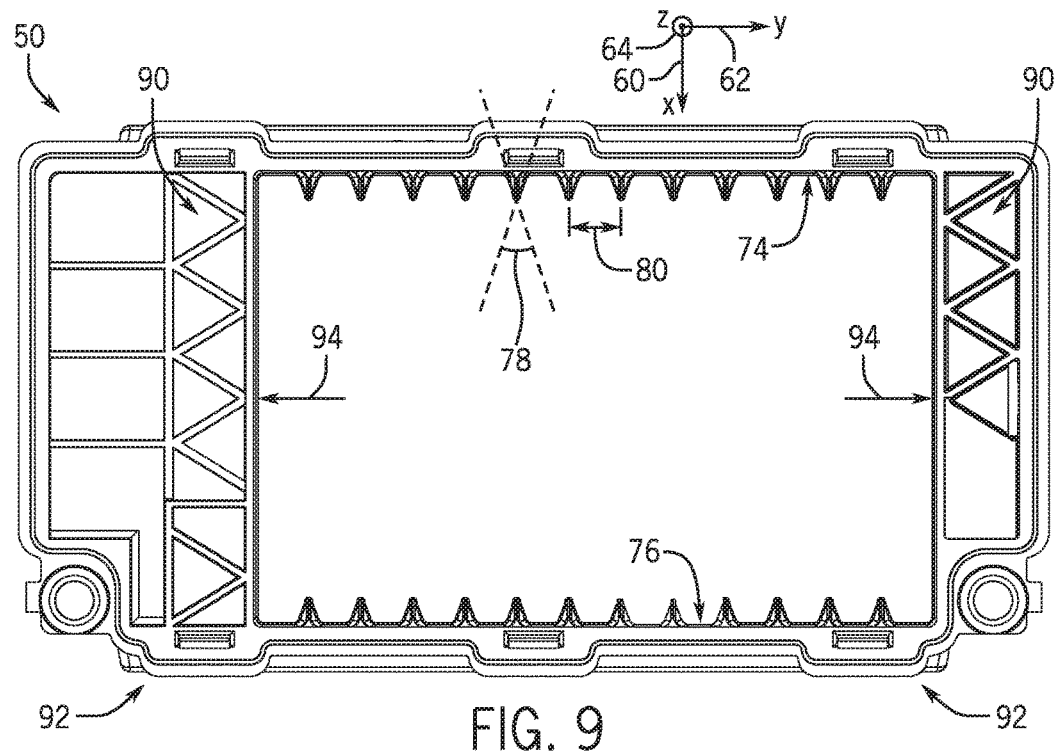
FIG. 9 is a top view of the lower housing of FIG. 7, in accordance with an embodiment of the present approach.

Additionally, the ribs 72 (e.g., partitions) may taper inwards with respect to their thickness as they extend outwards (e.g., in direction x) from the interior walls 74, 76. In other words, the ribs 72 may taper inwards such that each of the ribs 72 forms a V-shaped cross section when observed from a top of the lower housing 50. For example, the V-shaped cross section of one of the ribs 72 may taper inwards at angle 48, as shown in FIG. 9. The angle 78 may fall within a range of approximately 30 and 50 degrees, 35 and 47 degrees, 40 and 44 degrees, or 41 and 43 degrees. In some embodiments, the taper may culminate into an edge of each of the ribs 72.

The ribs 72 may be dimensioned such that there is a space between each of the battery cells 54 when the battery cells 54 are aligned within the slots 70. For example, at the thickest part of the ribs (e.g., at the bottom portion 78), the ribs 72 may be positioned apart from each other a distance 80, where distance 80 may be in a range of approximately 10 to 20 millimeters (mm), 11 to 18 mm, 12 to 16 mm, or 13 to 15 mm. Further, at the thickest part of the ribs 72 (e.g., at the bottom portion 78), a portion of the ribs 72 extend in a direction of the X axis 60 to a position between the battery cells 54 in the slots 70. This extended portion of each rib 72 may be approximately 1 mm in width in some embodiments. This may be wide enough to accommodate swelling and expansion of the battery cells 54 within the slots 70, while keeping the battery cells 54 anchored relative to each other within the battery module 22. The additional space between the battery cells 54 may reduce an amount of expansion force that is transferred to the lower housing 50 from the expanding battery cells 54. Because the force on the lower housing 50 is lessened, the lower housing 50 does not have to be able to withstand as much force as it would if the battery module 22 included battery cells 54 held in direct contact with each other. Thus, the lower housing 50 may be dimensioned smaller because of the lessened forces applied to the lower housing 50.

Other features of the lower housing 50 may be configured to accommodate or counteract the forces of expanding battery cells 54 within the battery module 22. As illustrated in FIG. 9, for example, the lower housing 50 may include a truss structure 90 to counteract forces of cell stacking and expansion within the lower housing 50. The truss structure 90 may be formed along one or both ends 92 of the lower housing 50. The truss structure 90 may dissipate forces in a direction of the Y axis 62 exerted from the battery cells 54 as they expand due to increased temperature within the battery module 22. The expanding battery cells 54 may press against each other and/or the ribs 72, transferring the expansion forces toward the opposite ends 92 of the lower housing 50, as shown by arrows 94. The truss structure 90 may include any desired pattern of oriented beams and gusseting for moving the force in directions along the X axis 60 as well as the Y axis 62. The illustrated embodiment includes a particular arrangement of adjacent triangular structures formed partially by inner and outer walls of the lower housing 50. The pattern may extend all the way through the height of the lower housing 50 in some embodiments. The truss structure 90 may withstand expansion forces from the battery cells 54 without adding substantial volume or weight to the battery module 22. This may allow the lower housing 50 to accommodate the expansion of the battery cells 54 that occurs throughout the lifetime of the battery cells 54 within the battery module 22.

Figure 10:
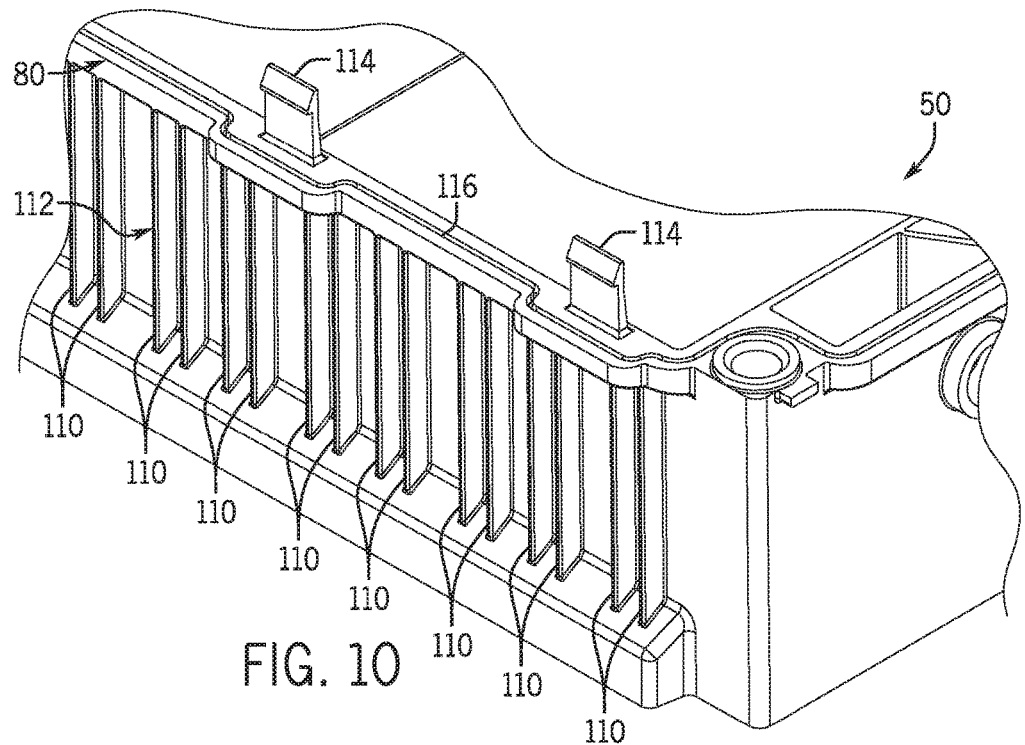
FIG. 10 is a partial perspective view of the lower housing of FIG. 7 illustrating heat fins on an outer surface of the lower housing, in accordance with an embodiment of the present approach.

In addition to features for holding and accommodating the expansion of battery cells 54, the lower housing 50 may include thermal management features as well. As illustrated in FIG. 10, for example, the lower housing 50 may include ribs 110 disposed on an outer wall 112 of the lower housing 50. These ribs 110 may function as heat fins, transferring heat from the battery cells 54 within the lower housing 50 to the outside atmosphere. There may be any desirable number of such ribs 110 disposed along the outer wall 112 of the lower housing 50. The ribs 110 may be specifically dimensioned and spaced from one another to encourage air flow between the ribs 110 while providing a large surface area along which heat transfer may occur. In some embodiments, the ribs 110 may enable passive cooling of the battery module 22. In other embodiments, however, the ribs 110 may be used in conjunction with an active cooling component, such as a fan within the vehicle 10, to promote heat exchange through the ribs 110. Although only one outer wall 112 of the lower housing 50 is shown in the illustrated embodiment, the ribs 110 may be present on an opposite outer wall 112 as well. This may ensure that approximately the same amount of heat transfer occurs along both longitudinal sides of the lower housing 50, and of the battery cells 54 disposed therein.

The lower housing 50 may include features for securing the battery cells 54, and other battery module components, within the battery module 22. In addition, the lower housing 50 may be configured to secure different components of the battery module 22 in place relative to one another without those components being themselves coupled to each other. For example, in the illustrated embodiment, the lower housing 50 includes clips 114 protruding upward from the lower housing 50. The clips 114 may be designed to mate with the lid assembly 56 introduced in FIG. 6. The lid assembly 56 may include slots configured to couple with the clips 114 on the lower housing 50 to secure the lid assembly 56 relative to the lower housing 50. It should be noted that in other embodiments, the lower housing 50 may be equipped with a slot for receiving a complementary clip built into the lid assembly 56, and that in further embodiments, the lower housing 50 and lid assembly 56 may include entirely different types of mating connectors or alternating connectors.

Figure 11:
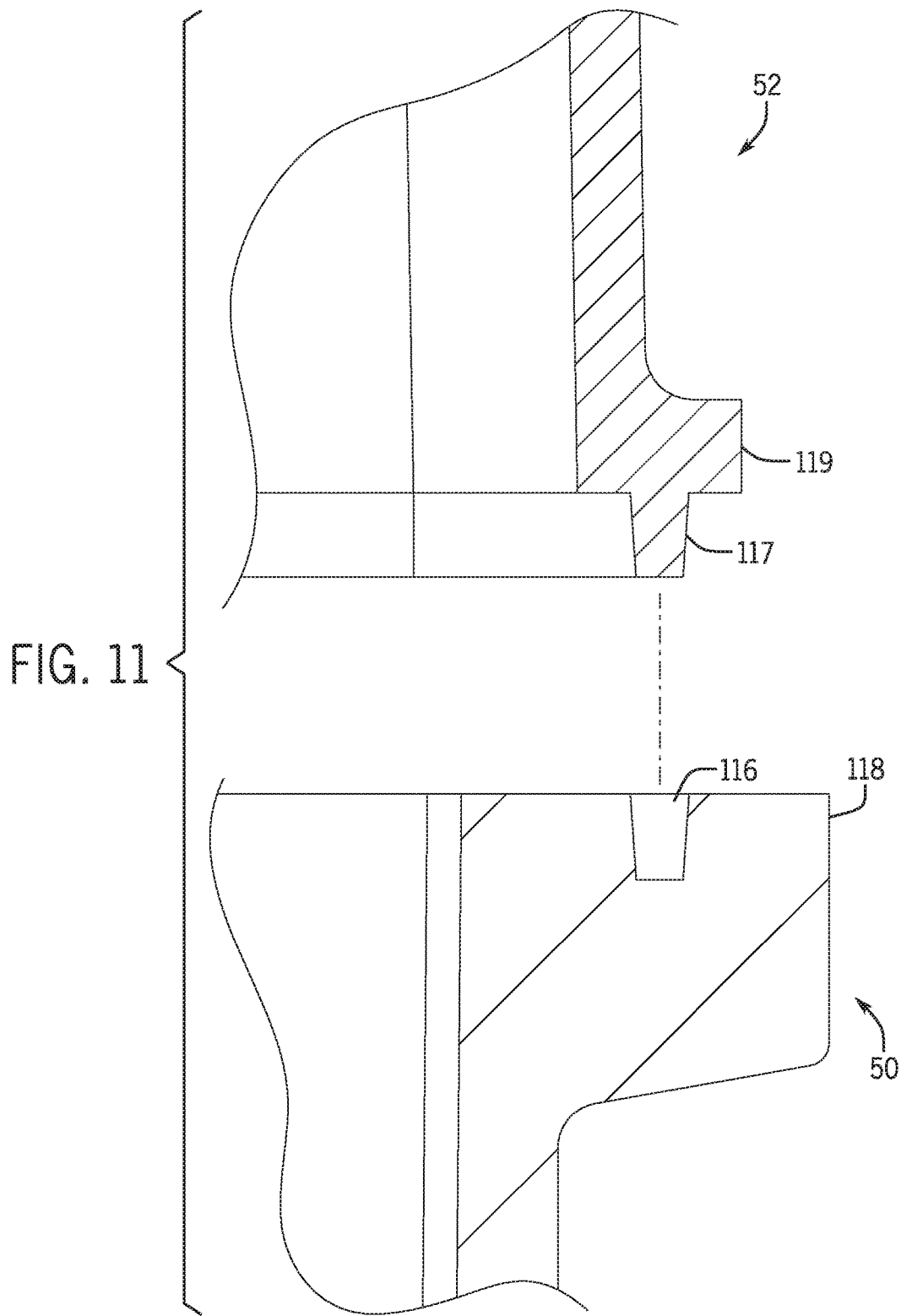
FIG. 11 is a cross sectional view of an interface between the lower housing and a cover of the battery module of FIG. 5, in accordance with an embodiment of the present approach.

In addition to the clips 114, the lower housing 50 may include a groove 116 extending along a circumference of the top portion 80 of the lower housing 50. The groove 116 may be configured to mate with a corresponding extension that is built into the cover 52 of the battery module 22. FIG. 11 provides an example of the groove 116 of the lower housing 50 configured to mate with an extension 117 protruding from the cover 52. In other embodiments, the lower housing 50 may include an extension while the cover 52 is equipped with a complementary groove. By using the groove 116 and the extension 117 to mate the lower housing 50 and the cover 52, it may be possible to hermetically seal the battery module 22. Once positioned within the groove 116, that is, the cover 52 may be attached to the lower housing 50 via adhesive, ultrasonic welding, or any other desirable method for hermetically sealing the battery module 22. This may prevent moisture, particulate matter, and other foreign agents from entering the more sensitive interior components of the battery module 22. In the illustrated embodiment, the lower housing 50 and the cover 52 each include lips 118 and 119 that extend outward beyond the groove 116 and the extension 117, respectively. This may increase the mating surface area between the lower housing 50 and the cover 52, thereby enhancing the seal between the two components.

Battery Terminal Post System and Method of Manufacture

Figure 12:
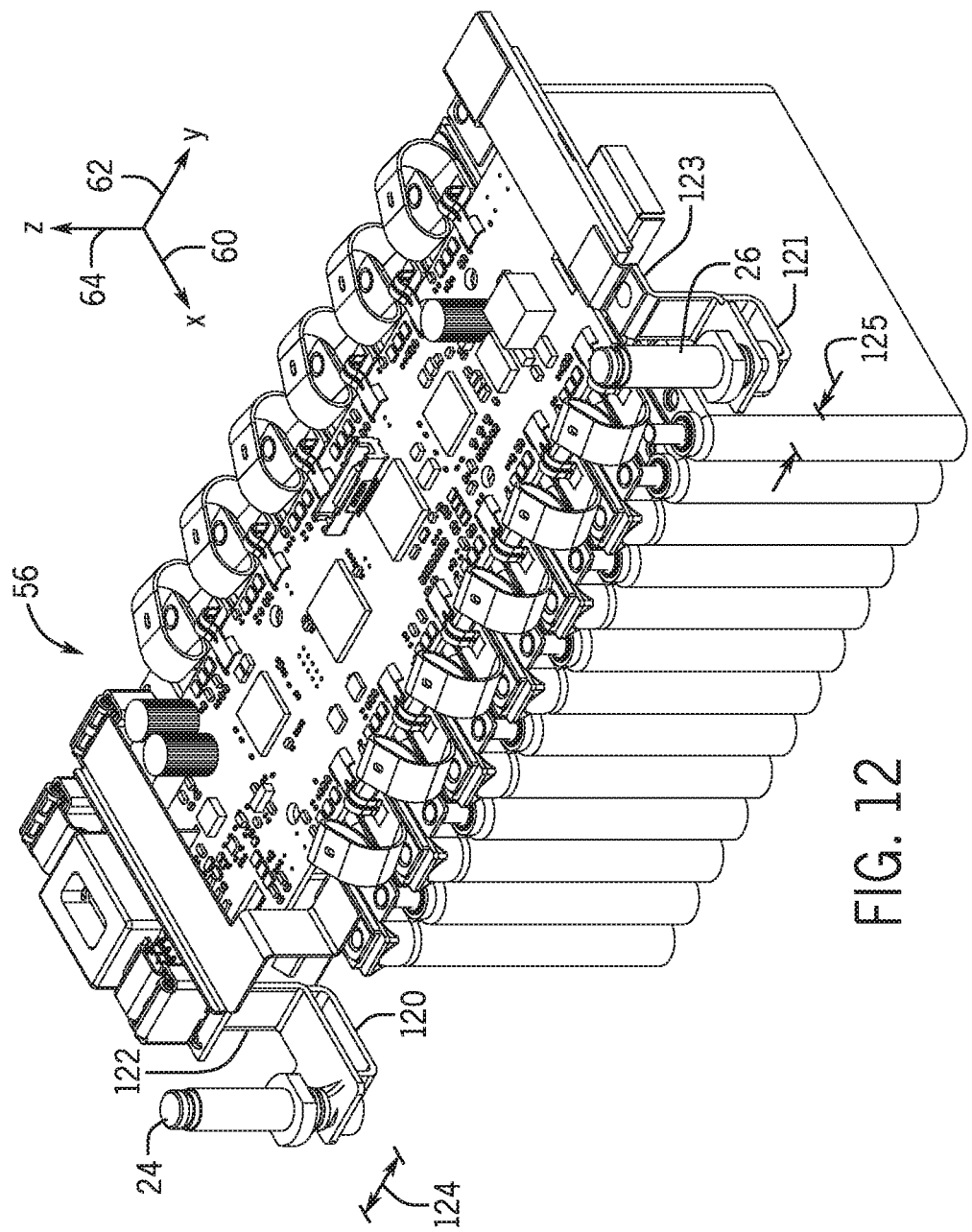
FIG. 12 is a perspective view of certain components of the battery module of FIG. 5 illustrating terminal posts of the battery module, in accordance with an embodiment of the present approach.

As noted above with reference to FIG. 5, the battery terminals 24 and 26 are designed to protrude from the enclosure formed by the lower housing 50 and the cover 52. At one end, these terminals 24 and 26 are designed to be coupled to electric equipment within the vehicle 10 via a wiring harness, and at an opposite end, the battery terminals 24 and 26 are coupled to internal components (e.g., bus bars) of the battery module 22. FIG. 12 is a perspective view illustrating the interface of the battery terminals 24 and 26 with the internal components of the battery module 22.

In the illustrated embodiment, the battery terminals 24 and 26 each include straight cylindrical posts configured to carry the output voltage (e.g., 48V) of the battery module 22 from the battery cells 54 to vehicle components external to the battery module 22. These battery terminals 24 and 26 may be constructed from copper, or any other desirable material that is electrically conductive. The battery terminals 24 and 26 may be coupled to internal components (e.g., PCB assembly 58) via connectors 120 and 121, respectively. In some embodiments, the connectors 120 and 121 may be electrically coupled to a bus bar of the battery module 22. Additionally, in other embodiments the connectors 120 and 121 may be electrically coupled to a high current interconnect 140. In some embodiments, the battery terminals 24 and 26 and/or the connectors 120 and 121 may conform to a known standard type of pin connection. For example, the cylindrical portions of the battery terminals 24 and 26 may be RADLOCK pins, and the corresponding connectors 120 and 121 may be RADLOCK connectors used to form the internal connections between the RADLOCK pins and the PCB assembly 58. Other types of cylindrical posts and/or connectors may be used in other embodiments.

In the illustrated embodiment, the connectors 120 and 121 used in the battery module 22 may each conform to a different size and/or shape. For example, a RADLOCK #9 connector may be used for the connector 120 attaching the first terminal 24 to the PCB assembly 58 and a RADLOCK #10 connector may be used for the connector 121 attaching the second terminals 26 to the PCB assembly 58. In the illustrated embodiment, the connectors 120 and 121 are bladed connectors configured to couple with the PCB assembly 58 via bladed portions 122 and 123. Differences between the connectors 120 and 121 may be evidenced in the approximate width and/or in the bent shape of these bladed portions 122 and 123. Specifically, the bladed portion 122 of the connector 120 may have a width 124 that is substantially larger than a width 125 of the bladed portion 123 of the connector 121. In addition, in the illustrated embodiment, the bladed portion 122 extends upward (e.g., in a direction of the Z axis 64) to couple the connector 120 to an interconnect component of the PCB assembly 58. The bladed portion 123, however, extends laterally in a direction of the X axis 60 to couple the connector 121 to another portion of the PCB assembly 58. That is, in the illustrated embodiment, the battery terminals 24 and 26 may have a bent portion between the cylindrical posts and the connector 121. The different types of connectors 120 and 121 may prevent the battery terminals 24 and 26 from being connected in reverse during assembly of the battery module 22. The cylindrical posts of the battery terminals 24 and 26 may or may not conform to the same standard for similar reasons.

In some embodiments, the battery terminals 24 and 26 may be separate components from the connectors 120 and 121. Specifically, the cylindrical posts of the battery terminals 24 and 26 may be screwed into, laser welded to, or otherwise secured to the connectors 120 and 121. In other words, the cylindrical posts of the battery terminals 24 and 26 may, in some embodiments, not be integrally connected to the connectors 120 and 121 because of the additional mechanical connections utilized to secure the battery terminals 24 and 26 to the connectors 120 and 121. In other embodiments, however, the battery terminal connectors 120 and 121 may be integral with the battery terminals 24 and 26. For instance, the battery terminals 24 and 26 and the battery terminal connectors 120 and 121 may be formed from a single piece of material without additional connections (e.g., welds, threads, etc.) coupling components together. The term "integral" refers to the battery terminals 24 and 26 being the same piece of material as the battery terminal connectors 120 and 121 without being welded, bolted, threaded, or otherwise coupled together.

Figure 13:
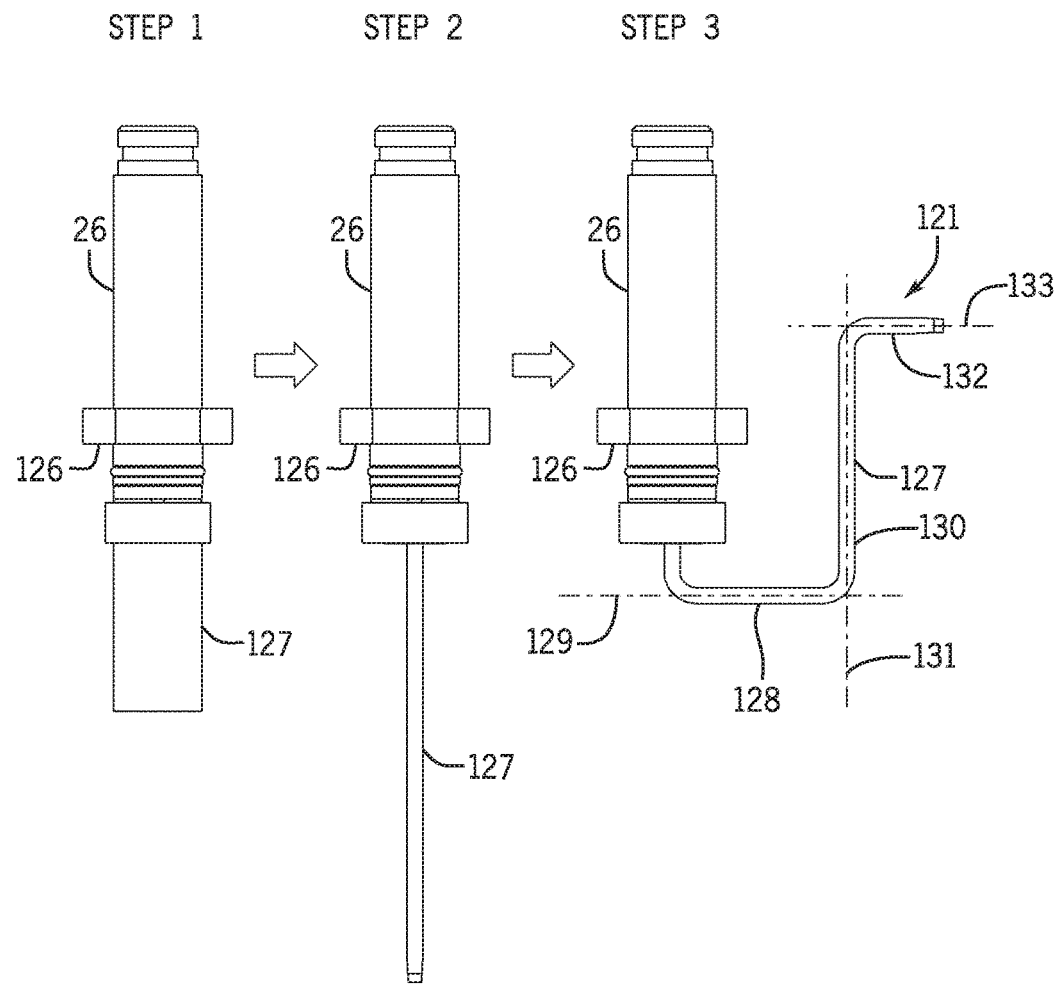
FIG. 13 illustrates one of the terminal posts of FIG. 12 being manufactured via a cold-forming technique; in accordance with an embodiment of the present approach.

As an example, FIG. 13 illustrates physical changes that are made during a method of manufacturing one such embodiment of the battery terminal 26 that is integral with the battery terminal connector 121. The battery terminal 26 begins at "step 1" as a substantially straight cylindrical post of electrically conductive material (e.g., copper). In the illustrated embodiment, the battery terminal 26 includes a flange 126 for supporting the battery terminal 26 in an opening of the lower housing 50. Below the flange 126, the battery terminal 26 continues to extend along a lower portion 127. The lower portion 127 may be cold-formed to create the connector 121 integral with the battery terminal 26. Cold-forming may involve compressing the lower portion 127 until it has a relatively flattened cross section similar to that of a bus bar at "step 2", and bending the flattened lower portion 127 into a desired shape of the connector 121 at "step 3". Compressing the lower portion 127 deforms the lower portion 127 such that it is lengthened and flattened, as illustrated.

As a result of the bending shown in "step 3", the lower portion 127 of the battery terminals 24 and 26 may be substantially step shaped. For example, in the illustrated embodiment, a first portion 128 of the battery terminal 26 extends in a horizontal direction aligned with a first axis 129. A center portion 130 of the battery terminal 26 extends in a vertical direction aligned with a second axis 131, the second axis 131 being substantially perpendicular to the first axis 129 after cold forming. Furthermore, a second portion 132 of the battery terminal 26 extends in a horizontal direction along a third axis 133. As illustrated, the center portion 130 of the battery terminal 26 is disposed between the first and second portions 128 and 132. Additionally, the first axis 129 and third axis 133 are substantially parallel to one another and substantially perpendicular to the second axis 131, thereby forming the step shaped lower portion 127 of the battery terminal 26. To that end, an integral battery terminal connector 121 may be formed into this shape from a straight cylindrical post without coupling additional components via mechanical connections (e.g., welding, fasteners). As a result, electrical communication from the battery cells 54 to the battery terminals 24 and 26 may be improved by reducing or eliminating the resistance due to mechanical connections between the battery terminals 24 and 26 and the battery terminal connectors 120 and 121.

As mentioned above, the lower portion 127 may be coupled to a bus bar of the battery module 22. The bus bar may transfer electrical energy from the battery cells 54. In some embodiments, the lower portion 127 may be welded to the bus bar of the battery module. Additionally, the lower portion 127 may be coupled to the high current interconnect 140. As described in detail below, the high current interconnect 140 may contain a slot to receive the connectors 120 and 121 and electrically couple the battery terminals 24 and 26 to the battery cells 54.

Figure 14:
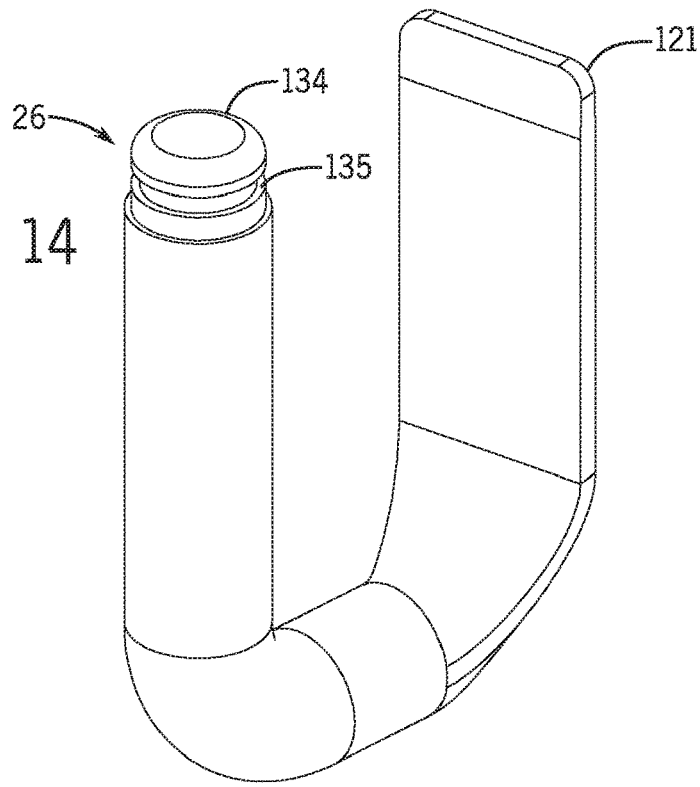
FIG. 14 is a perspective view of a terminal post in accordance with an embodiment of the present approach.
Figure 15:
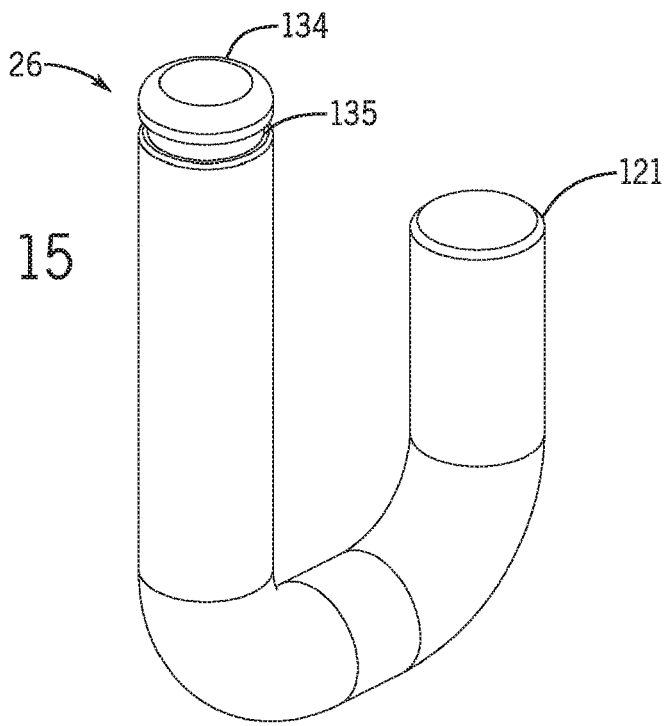
FIG. 15 is a perspective view of a terminal post in accordance with an embodiment of the present approach.

In another embodiment, illustrated in FIG. 14, the battery terminal 24, the battery terminal 26, or both may be generally U-shaped. Additionally, a first vertical portion of the battery terminal 24 may be generally cylindrical as described above. However, a second vertical portion may be the bladed connector 121. That is, the second vertical portion may have a substantially flattened cross section. In some embodiments, the bladed connector 121 is welded to the high current interconnect 140. As shown, the U-shaped battery terminal 24 may have a transition point where the cross section of the battery terminal 24 changes from generally cylindrical to generally flattened. The battery terminals 24 and 26 may be formed by the cold-forming process described above. In a further embodiment, the entire length of the battery terminals 24 and 26 may consist of a generally cylindrical cross section, as illustrated in FIG. 15. In some embodiments, the connector 121 of the battery terminal 26 may be welded to a bus bar of the battery module 22. Additionally, in the illustrated embodiment, the battery terminals 24 and 26 include caps 134. The caps 134 are be chamfered and rounded to facilitate easy installation of connectors (e.g., RADLOCK connectors). Moreover, the caps 134 include grooves 135 to further enable installation of connectors. It should be noted that different methods of manufacture may be used to form a battery terminal connector that is integral with the corresponding battery terminal 26. Since the battery terminal 26 and the connector 121 are made from the same piece of material in such embodiments, the resistance through the battery terminal connection is lower than it may be in embodiments where the battery terminal 26 and the connector 121 are initially separate.

Printed Circuit Board with Shunt

Figure 16:
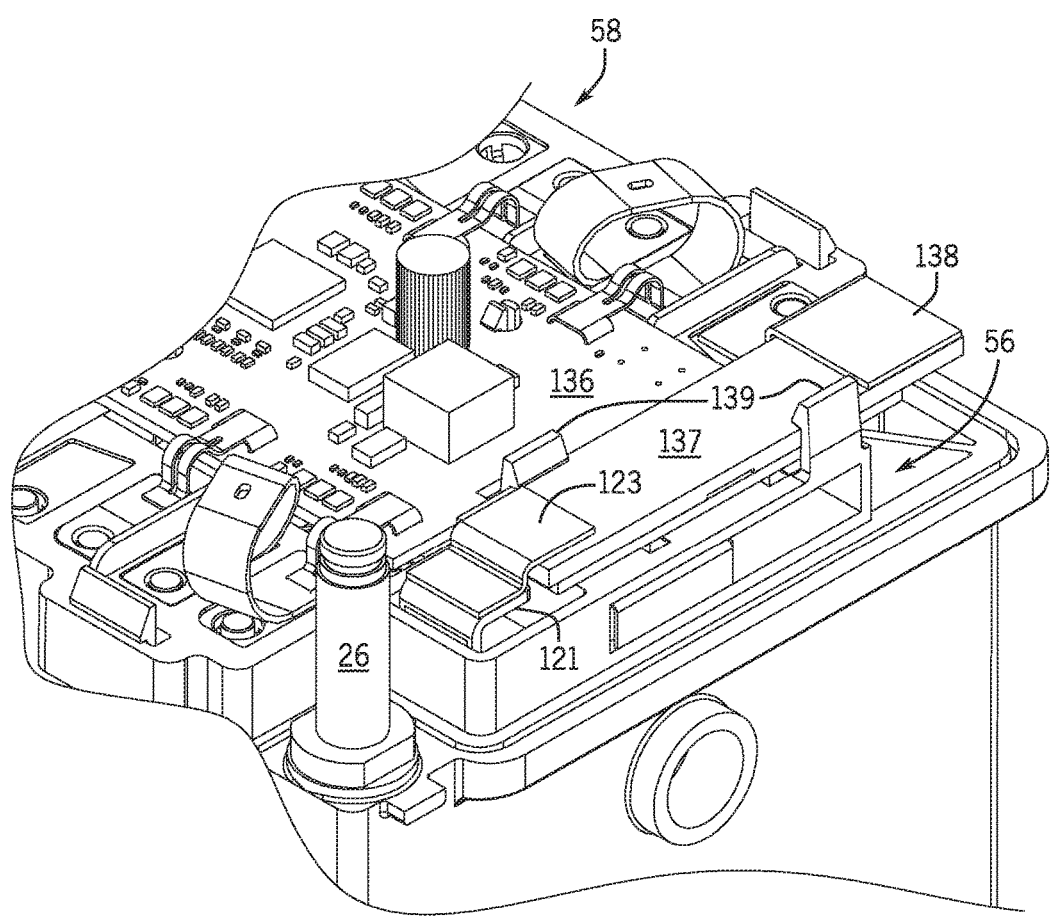
FIG. 16 is a perspective view of a shunt mounted directly onto a printed circuit board (PCB) of the battery module of FIG. 12, in accordance with an embodiment of the present approach.
Figure 34:
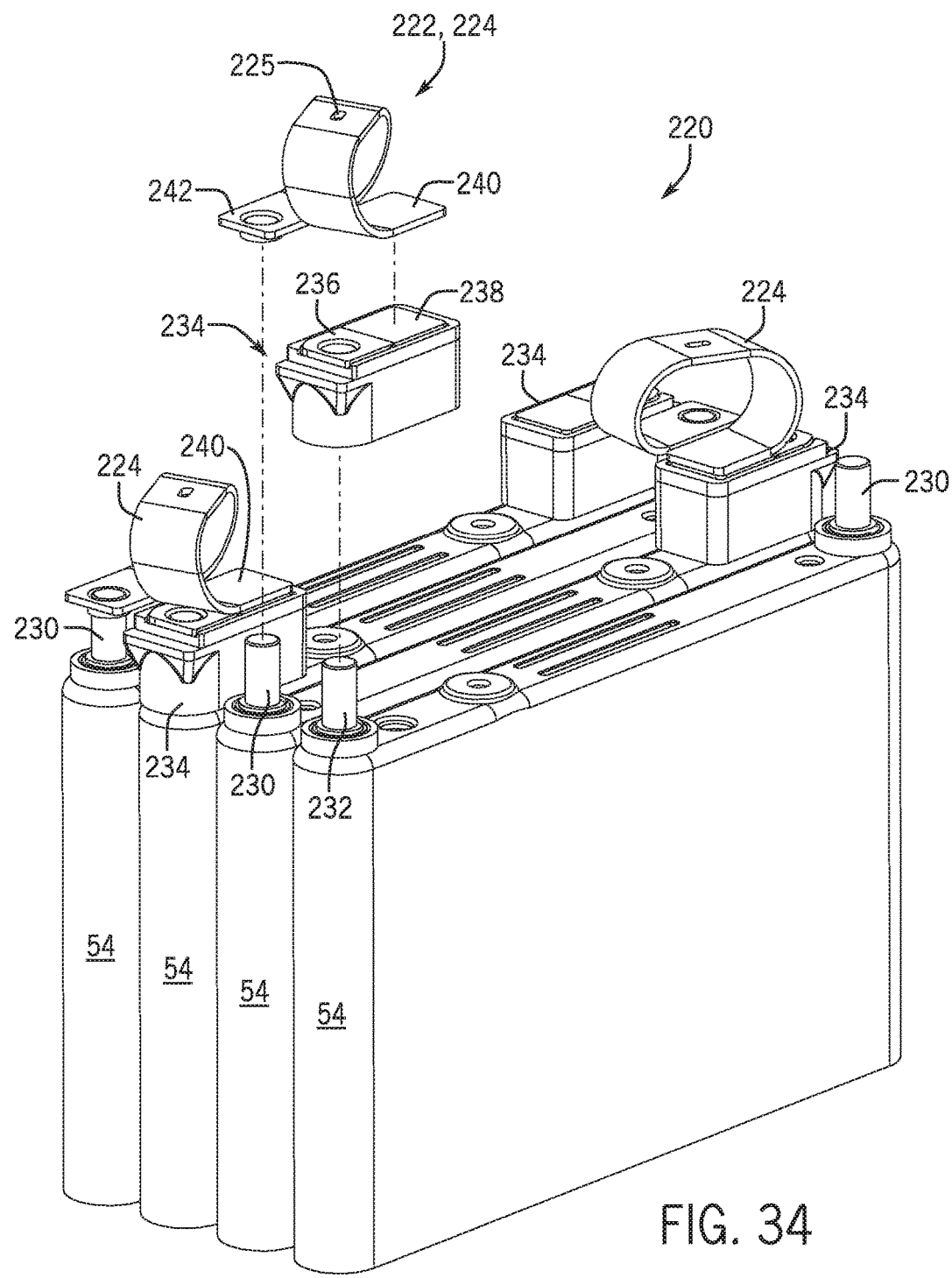
FIG. 34 is an exploded perspective view of the bus bar cell interconnect assembly of FIG. 31 for electrically coupling battery cells, in accordance with an embodiment of the present approach.

FIG. 16 shows a portion of an embodiment of the PCB assembly 58 within the battery module 22. The illustrated PCB assembly 58 includes a single PCB 136 and a shunt 137 that is directly mounted to the PCB 136. As noted above, the battery terminal 26 may be coupled to the PCB assembly 58 via the bladed terminal connector 121. For example, the bladed portion 123 of the bladed terminal connector 121 may fit over a top surface of the shunt 137 to contact the shunt 137 and, in some embodiments, to hold the shunt 137 against a top of the PCB 136 in a clamping manner. In other words, the shunt 137 may be held between a bottom surface of the bladed portion 123 of the bladed terminal connector 121 and a top surface of the PCB 136. It should be noted that, in some embodiments, the bladed portion 123 of the bladed terminal connector 121 may be integral with the bladed terminal connector 121 (e.g., as one structure). In other embodiments, the bladed portion 123 that contacts the shunt 137 may be a non-integral, separate bus bar of the bladed terminal connector 121 that may be welded to the bladed terminal connector 121 after being placed in contact with the shunt 137. For example, in embodiments where the bladed portion 123 is separate from the bladed terminal connector 121 (e.g., as shown in FIG. 6), the bladed terminal connector 121 may be disposed through an aperture in the lid assembly 56 and proximate the shunt 137, such that the bladed portion 123 may be placed over and in contact with both the bladed terminal connector 121 and the shunt 137 and may be welded (or otherwise coupled) to these components. In embodiments where the bladed portion 123 is integral with the bladed terminal connector 121 (e.g., as shown in FIG. 34), the bladed portion 123 may be disposed in contact with the shunt 137, and welded to the shunt 137. Thus, the electrical connection between the shunt 137 and the terminal may be formed without using a separate process for coupling (e.g., welding) the bladed portion 123 to the bladed terminal connector 121.

Depending on the arrangement of the battery terminals 24 and 26 of the battery module 22, at least one of these terminals (e.g., 26) may be electrically connected, via the shunt 137, with a bus bar 138 located on an opposite side of the PCB assembly 58 from the battery terminal 26. For example, on one end of the shunt 137, the shunt 137 may be held (e.g., clamped) between a bottom surface of the bus bar 138 and a top surface of the PCB 136 such that the shunt 137 physically contacts the bottom surface of the bus bar 138 and the top surface of the PCB 136, while on the opposite end of the shunt 137, the shunt 137 is disposed between the bladed portion 123 and the PCB 136. In such instances, because the bladed portion 123 is coupled or integral with the terminal 26, the shunt 137 may function as a low resistance path between the terminal 26 and the bus bar 138. The shunt 137 may also be coupled to various conductors (e.g., electrical connections) present on the PCB 136, thereby enabling the PCB 136 to monitor the voltage output of the battery module 22, among other things. In other words, the electrical connections present on the PCB 136 may be coupled to a measurement device or processor such that the measurement device or processor gains access to the shunt 137, via the electrical connections, for measuring the voltage output.

In the illustrated embodiment, the shunt 137 is directly mounted to the PCB 136 that provides control and monitoring functions to the battery module 22. That is, the shunt 137 is in direct contact with and coupled to the PCB 136, instead of being disposed on a separate board or module that is coupled to the PCB 136 via wires or ribbon cables. For example, a bottom surface of the shunt 137 may be entirely disposed on a top surface of the PCB 136. The close proximity of the shunt 137 and the PCB 136 may reduce noise over an assembly with a separate shunt and a separate PCB, where the separate shunt is, for example, coupled to the separate PCB via wires or ribbon cables. In the illustrated embodiment, by disposing the shunt 137 proximate the PCB 136 (and, thus, proximate electrical connections and the measurement device of the PCB 136), a clearer signal with reduced noise may be transmitted from the shunt 137 through the electrical connections to the measurement device on the PCB 136.

Additionally, the shunt 137 may be pressed against the top surface of the PCB 136 via a number of components. These components may include, for example, an extension of the bus bar 138, a bladed portion 123 of the connector 121, and/or shunt clips 139 of the lid assembly 56. In particular, the shunt clips 139 may extend upwardly from the lid assembly 56 and an extension of the shunt clips 139 may extend over the shunt 137. The extension of each shunt clip 139 may extend over the shunt 137 and exert a downward force against the shunt 137, pressing the shunt 137 into place on top of the PCB 136. One or more of the shunt clips 139 may extend through an aperture in the PCB 136. In some embodiments, an adhesive (e.g., a conductive adhesive) may be applied between the shunt 137 and the PCB 136 for coupling the shunt 137 directly to the PCB 136. Further, in some embodiments, the shunt 137 and/or a footprint of the shunt 137 may be entirely disposed on or over the PCB 136, such that no portion of the shunt 137 or the footprint of the shunt 137 extends beyond sides of the PCB 136. The illustrated arrangement of the shunt 137 in direct contact with the PCB 136, and the features of the shunt 137 in direct contact with the PCB 136 described above, may facilitate relatively compact packaging of the PCB assembly 58 and simplified manufacturing as compared to a shunt that is mounted separately from the PCB 136.

As mentioned above, the shunt 137 may provide a low resistance electrical path for current originating from the battery cells 54 to flow toward the terminal 26, while aiding in the detection of a voltage output from the battery module 22. Specifically, the shunt 137 may be held in direct contact with an upper surface of the PCB 136 via one or more of clips, connectors, or adhesive, as described above. The PCB 136 may include the electrical connectors with a lead extending out from the upper surface of the PCB 136. Thus, the shunt 137 may be held into physical and electrical contact with the sensor lead extending from the PCB 136. This lead may communicate an electrical signal to a measurement device on the PCB 136. The measurement device may also receive an electrical signal from a connection to a high current component of the battery module 22 (e.g., contactor, fuse assembly, bus bar) on an opposite side of the battery cells 54 electrically coupled together. The measurement device may then determine a voltage drop between the terminals 24 and 26 of the battery module 22, thus indicating the voltage output of the battery module 22. Thus, the shunt 137, which is directly disposed against the PCB 136, may enable relatively direct electrical connections for determining a voltage output of the battery module 22, without the use of additional cables, wires, or other external connectors.

Further, in some embodiments, the shunt 137 may be integral with the PCB 136. That is, the shunt 137 may make up a portion of the PCB 136 structure. For example, the shunt 137 may be embedded within the PCB 136 or the shunt 137 may be an extension of the PCB 136. Accordingly, the electrical leads of the PCB 136 may extend from the shunt 137 (e.g., integrated with the PCB 136) to a measurement device of the PCB 136, as described above.

High Current Interconnects Mounted to Printed Circuit Board

Figure 17:
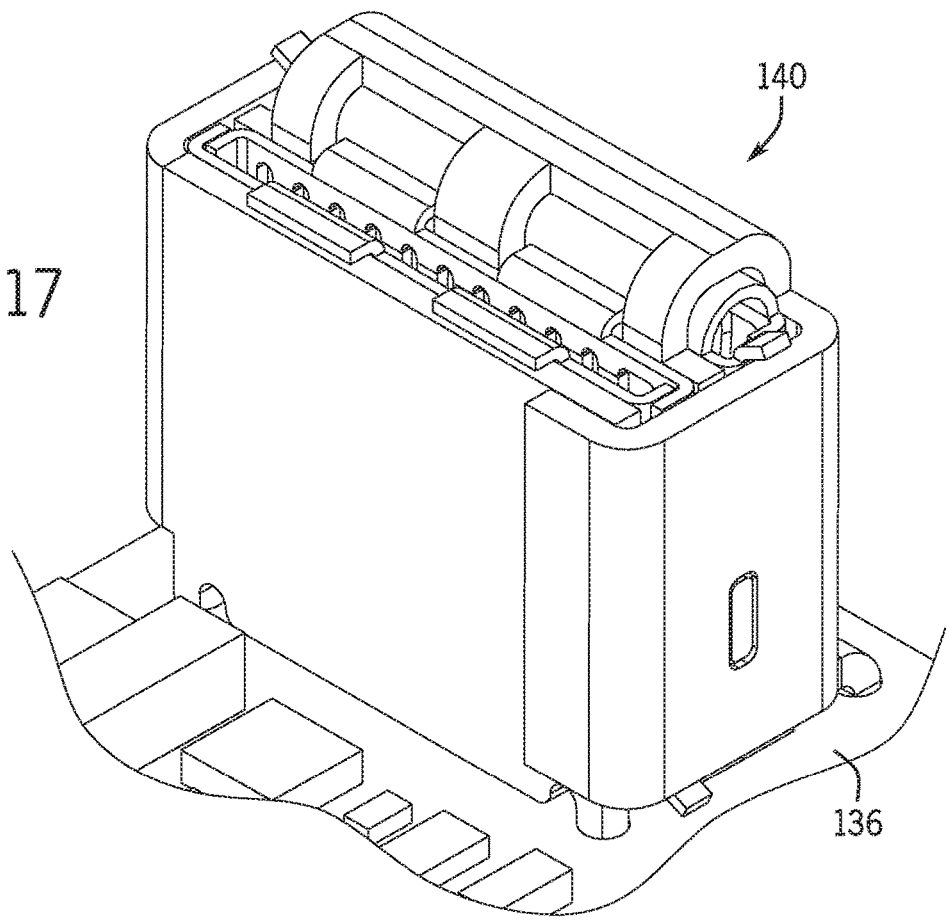
FIG. 17 is a perspective view of a high current interconnect assembly for use on a PCB of the battery module of FIG. 12 in accordance with an embodiment of the present approach.

To facilitate compact packaging of the battery module, and effective electrical coupling of high current components together within the battery module 22, the PCB assembly 58 may include one or more high current interconnects 140, as shown in FIG. 17. Each high current interconnect 140 may electrically couple two high current components (e.g., bus bars, fuses, contactors, etc.) to one another. In certain embodiments, the high current interconnect 140 may also be mounted to the PCB 136, as illustrated in FIG. 17. The board-mounted high current interconnect 140 may couple the two high current components to traces on the PCB 136 in addition to coupling the high current components to one another. In this way, the high current interconnect 140 may act as an interfacing mechanism between various high current components of the battery module 22 and the PCB 136.

Figure 18:
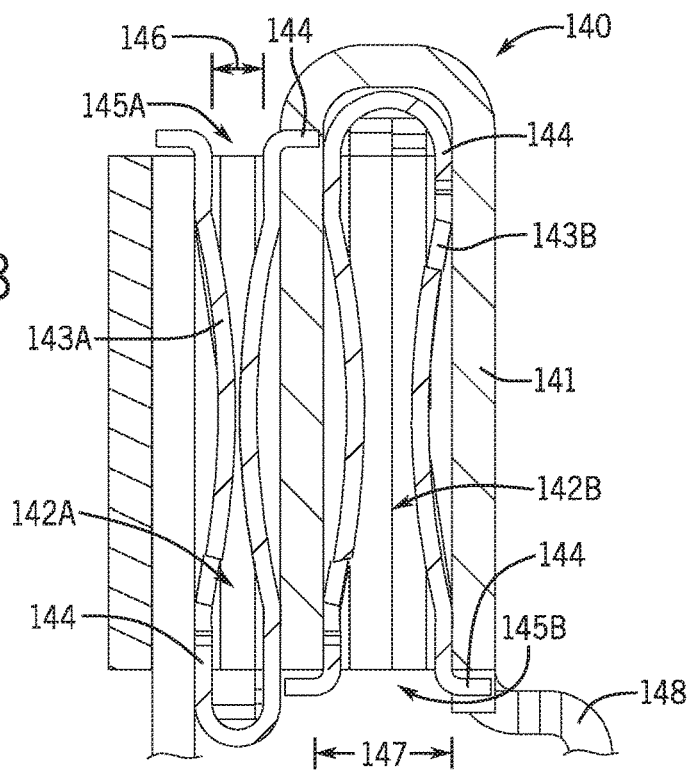
FIG. 18 is a side cutaway view of the high current interconnect assembly of FIG. 17, in accordance with an embodiment of the present approach.

Turning to FIG. 18, the high current interconnect 140 may include a frame portion 141, which may be a single piece of conductive material such as copper. The frame portion 141 may include pockets 142A and 142B formed therein. These pockets 142A and 142B are configured to receive bladed high current components, e.g., the conductive blades or contacts of high current components. Since the frame portion 141 is electrically conductive, the frame portion 141 may electrical couple the high current components to each other. In the illustrated embodiment, the pockets 142A and 142B are oppositely facing from each other, such that the pocket 142A can receive a bladed component from above and the pocket 142B can receive a bladed component from below.

In some embodiments, the frame portion 141 may house a spring 143A and a spring 143B, and these springs 143A and 143B are disposed in the pockets 142A and 142B, respectively. The springs 143A and 143B allow one to slide the blades of the high current components into the pockets 142A and 142B such that the springs 143A and 143B exert a compressive force on the blades to hold the high current components in place. The springs 143A and 143B may be any suitable object made of a conductive material that is capable of receiving a bladed high current component in the corresponding pocket and exerting a compressive force on the bladed high current component. In some embodiments, the springs 143A and 143B may each include a relatively flexible sheet of conductive material bent in a U-shape such that opposite sides of the sheet face inwardly toward each other, as shown in FIG. 18. The springs 143A and 143B may be formed such that they line the pockets 142A and 142B, respectively. More specifically, the springs 143A and 143B may be folded such that opposite sides of the sheets form the inner "walls" of each pocket 142A and 142B. The springs 143A and 143B may also be configured such that portions 144 of the springs 143A and 143B directly contact the frame portion 141.

During construction of the high current interconnect 140, the frame portion 141 may be compressed (e.g., stamped) around the springs 143A and 143B such that only an opening 145A and an opening 145B in the frame portion 141 allows access to the pockets 142A and 142B, respectively. Again, in the illustrated embodiment, the pockets 142A and 142B are oriented towards opposite sides of the frame portion 141 and the respective openings 145A and 145B are on opposite sides of the frame portion 141. This allows the high current interconnect to receive one bladed high current component from above, and one from below.

Further, the frame portion 141 may be compressed such that the openings 145A and 145B conform to a desired size based on the high current components that the high interconnect will couple together. For example, one of the high current components may be a thicker bladed component than the other, and the high current interconnect 140 may be constructed accommodate these different sized bladed components. To that end, the frame portion 141 may be compressed on one side more than on the opposing side such that the openings 145A and 145B (and pockets 142A and 142B) are different sizes. For example, in FIG. 18, the opening 145A has a width 146 while the opening 145B has a width 147; as shown, the width 146 is smaller than the width 147. For instance, the width 146 of the smaller opening may be approximately 0.8 mm, while the width 147 may be approximately 1.8 mm. By having openings of differing sizes, the high current interconnect 140 may be able to couple high current components of differing sizes. In other embodiments, however, the openings 145A and 145B may be approximately the same size in order to accommodate high current components of approximately the same size.

Further, as mentioned above, the high current interconnect 140 may be mounted to the PCB 136. To mount to the PCB 136, the frame portion 141 may include feet 148 that extend from the frame portion 141 and that may be welded to the PCB 136. Alternatively or additionally, the PCB 136 may contain receptacles configured to receive the feet 148 of the high current interconnect 140. For example, the feet 148 of the high current interconnect 140 may be disposed in the corresponding receptacles of the PCB 136, and welded to a face of the PCB 136 opposite the side of the PCB 136 from which the frame portion 141 extends.

In addition to mounting to the PCB 136, the high current interconnect 140 may be mechanically coupled to high current components of the battery module 22. As mentioned above, each high current component may include a bladed portion, which is a flattened piece of conductive material configured to carry a relatively high current originating from the plurality of battery cells 54 in the battery module 22. The bladed portion of a high current component may be inserted into the pocket 142A or 142B via the respective opening 145A or 145B, such that the bladed portion directly contacts the corresponding spring 143A or 143B. The springs 143A and 143B, which form the walls of the pockets 142A and 142B, exert a compressive force on the bladed portion disposed within the corresponding pocket. This compressive force may reduce the effect of any forces that might otherwise remove the bladed portion from the pocket 142A or 142B, thereby securing the bladed components in the high current interconnect 140. As a result, the high current interconnect 140 may be mechanically coupled to the bladed portions of the high current components without the use of additional fasteners to secure the bladed portions in place. Foregoing the additional fasteners may reduce the complexity of manufacturing and assembling the PCB assembly 58, since no additional screws, bolts, or other fastener components have to be handled.

It should be noted that the compressive force exerted by the springs 143A and 143B may still allow for small movements of the bladed portions within the pockets 142A and 142B. For example, as the battery module 22 may be disposed within a vehicle, the springs 143A and 143B may allow for slight shifts of the bladed portions up and down within the pockets 142A and 142B that may occur during movement of the vehicle. This makes the high current interconnect 140 a relatively flexible mechanical coupling feature. This flexibility would not be possible using other fasteners (e.g., bolts, screws) or welding to join the high current components, since these joining methods do not allow for slight movements of the bladed components relative to each other.

Figure 19:
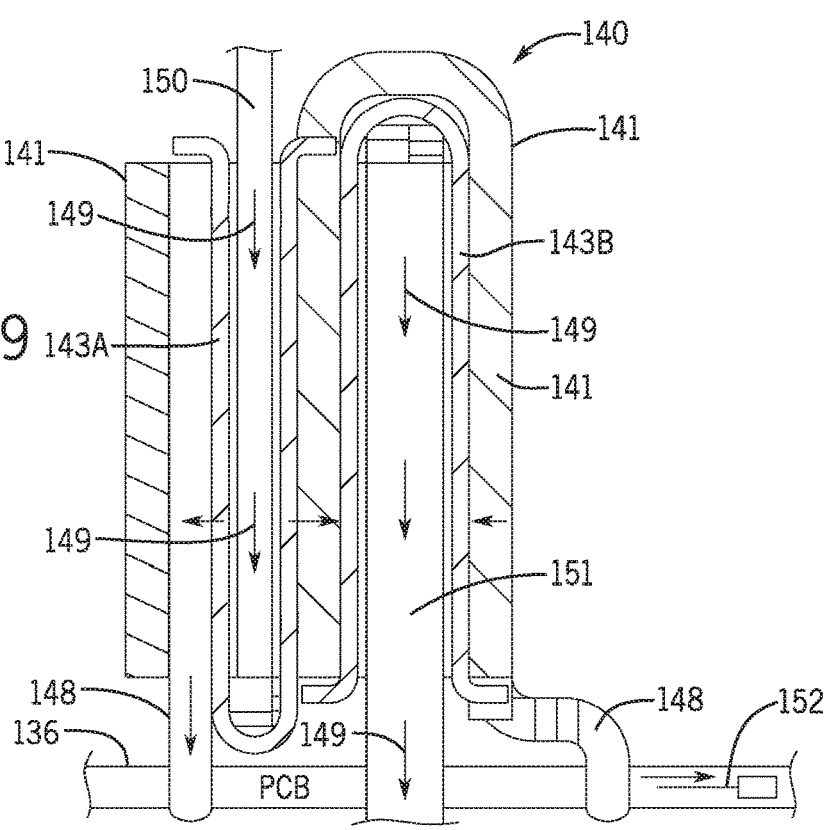
FIG. 19 is a current flow diagram of the high current interconnect assembly of FIG. 18, in accordance with an embodiment of the present approach.

In addition to mechanically coupling the high current components together, the high current interconnect 140 electrically couples the high current components together. Further, the high current interconnect 140 is designed to be electrically coupled with the PCB 136 as well. A current flow 149 illustrated in FIG. 19 depicts how the high current interconnect 140 may be electrically coupled to two high current components and to traces on the PCB 136. Current may flow from a bladed portion 150 of a first high current component disposed in the pocket 142A to the conductive spring 143A that directly contacts the bladed portion 150. Current may then flow from the spring 143A to the frame portion 141 via the portions 144 that contact the frame portion 141. As the frame portion 141 is entirely conductive, the current that flows into the frame portion 141 may flow from the spring 143A to the spring 143B. Specifically, the current may flow through an outer layer of the frame portion 141 that wraps around both of the springs 143A and 143B, as well as through an inner layer located directly between the springs 143A and 143B. Current may then flow from the spring 143B to a bladed portion 151 of a second high current component disposed in the pocket 142B that directly contacts the spring 143B. Current may also flow from the frame portion 141 into the feet 148 that extend into the PCB 136. One or more traces 152 on the PCB 136 may be in contact with the feet 148 to detect the current flow. Thus, the feet 148 of the high current interconnect 140 may provide both a mechanical connection and an electrical connection between the high current components disposed in the high current interconnect 140 and the PCB 136.

As illustrated and discussed above, the high current interconnect 140 (i.e., frame portion 141, springs 143A and 143B, and feet 148) may be electrically coupled to the high current components and to traces on the PCB 136. Because the high current interconnect 140 is entirely conductive, the high current components and the PCB 136 are effectively electrically coupled to one another by virtue of their electrical coupling to the high current interconnect 140. This may allow the high current interconnect 140 to electrically couple high current components and the PCB 136 to one another without the use of cabling and other means traditionally used to make electrical connections between components and connectors. Foregoing cabling and similar means to form electrical connections between the high current components may reduce the complexity of manufacturing and assembling the PCB assembly 58 and may reduce the space requirements of the PCB assembly 58 within the battery module 22.

Figure 20:
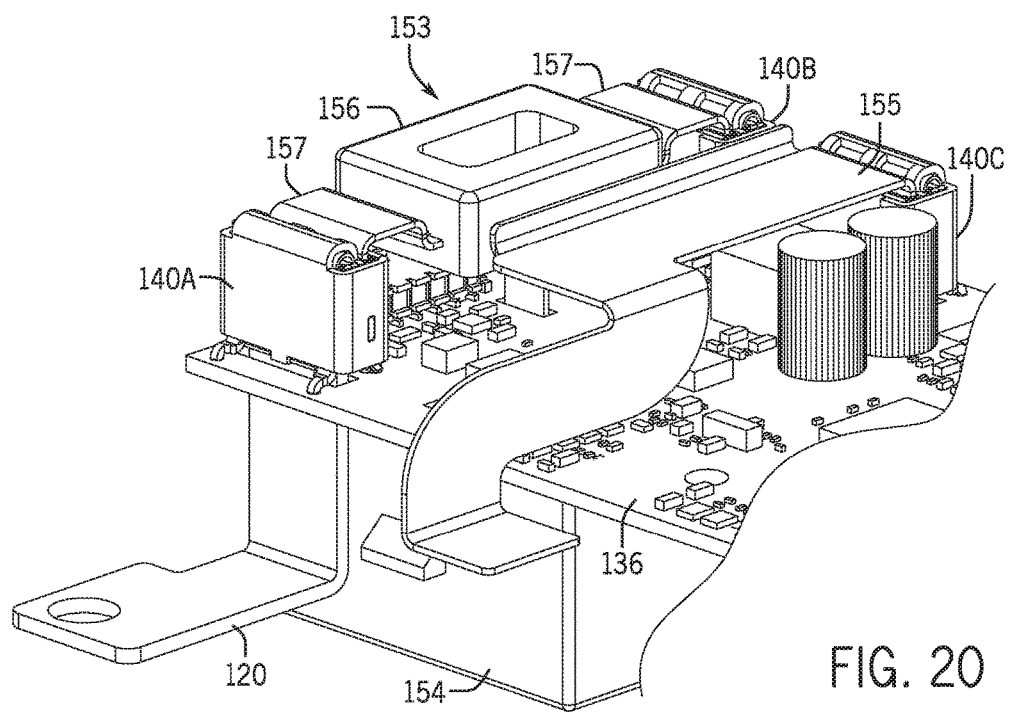
FIG. 20 is a perspective view of bus bars, a bladed fuse assembly, and other high current components coupled to one another and to the PCB via the high current interconnect assembly of FIG. 17, in accordance with an embodiment of the present approach.
Figure 21:
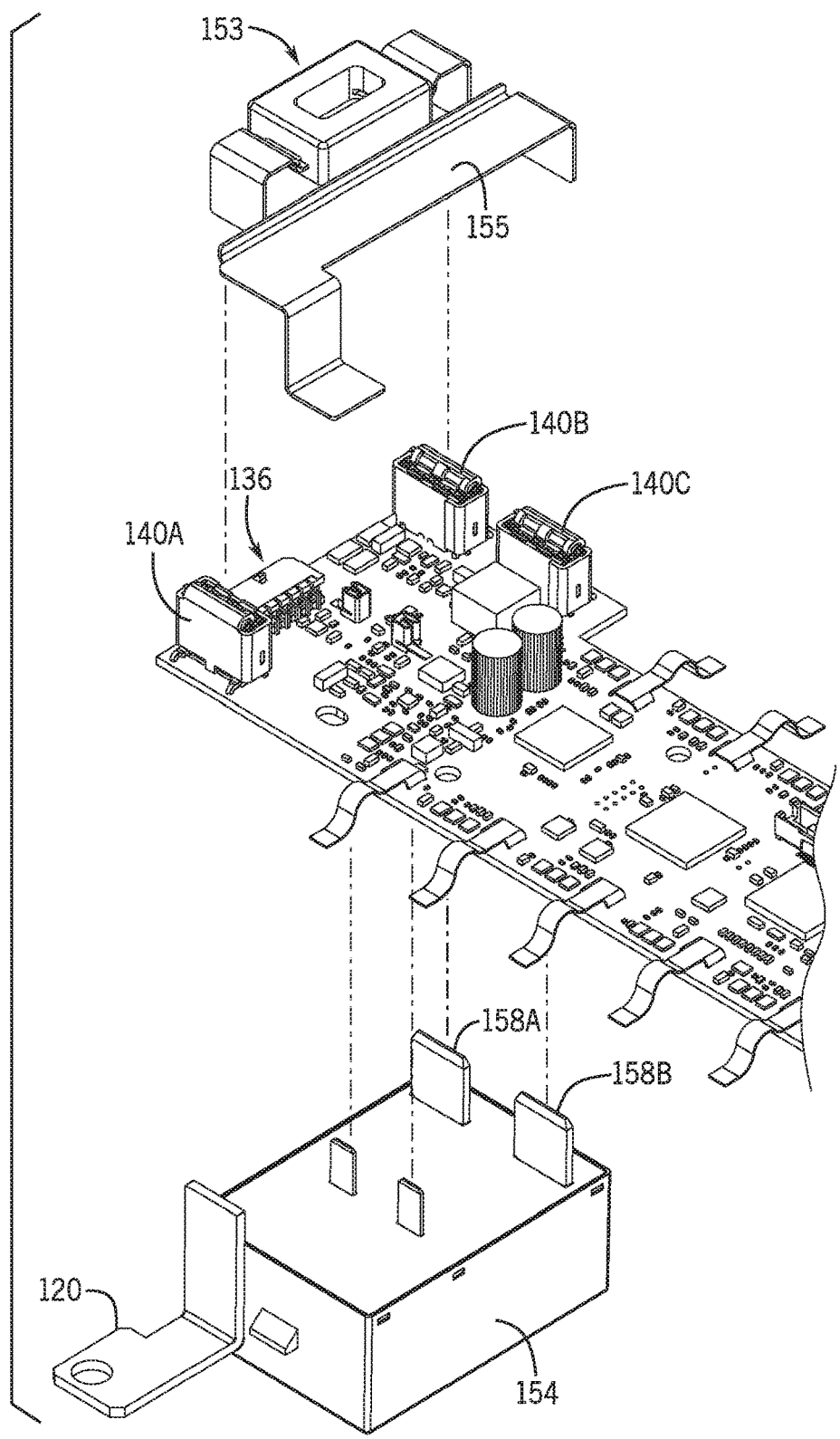
FIG. 21 is an exploded perspective view of the high current components, PCB, and high current interconnects of FIG. 20, in accordance with an embodiment of the present approach.

Multiple high current interconnects 140 may be used within the battery module 22 to electrically couple various high current components with each other and the PCB 136, while minimizing spatial requirements of the PCB assembly 58. FIG. 20 illustrates certain components of the PCB assembly 58, including various high current bladed components that may be coupled to one another and to the PCB 136 via the high current interconnects 140. These high current components include, for example, a fuse assembly 153, a contactor 154, a bus bar 155, and the terminal connector 120. The fuse assembly 153 includes a fuse 156 configured to provide overcurrent protection to the PCB assembly 58. The fuse 156 may be coupled to the terminal connector 120 via a high current interconnect 140A and to the contactor 154 via a high current interconnect 140B. The fuse 156 may be coupled to the high current interconnects 140A and 140B via bladed fuse connectors 157, which are discussed in detail below. The contactor 154 is a device used to switch the high current power circuit on, allowing the battery module 22 to output power, as discussed in detail below. As shown in FIG. 21, the contactor 154 may include a high current blade 158A and a high current blade 158B. The high current blade 158A may be coupled to the fuse 156 via the high current interconnect 140B. The high current blade 158B may be coupled to the bus bar 155, and subsequently the battery cells 54, via the high current interconnect 140C. Traces for a voltage sensing component and a pre-charge circuit, both disposed on the PCB 136, may be in contact with the high current interconnects 140B and 140C, allowing the voltage sensing component and the pre-charge circuit to electrically couple to the contactor 154 in order to detect the voltage across the contactor 154. It should be noted that the illustrated embodiment provides only one example of different combinations of high current components that may be electrically coupled to one another and to the PCB 136 via the high current interconnects 140 mounted on the PCB 136.

The disclosed high current interconnects 140 may enable relatively simple assembly of the battery module. For example, the high current interconnect 140 may include feet 148 that that may be welded to the PCB 136 and/or the traces 152 disposed on the PCB 136 may be welded to the feet 148. These welding processes may form mechanical and electrical couplings between the high current interconnect 140 and the PCB 136. Additionally, in embodiments in which the PCB 136 contains receptacles configured to receive the feet 148, the feet 148 of the high current interconnect 140 may be disposed in the corresponding receptacles of the PCB 136, before any welding processes are performed. After the high current interconnect 140 is mounted to the PCB 136 and secured in this manner, the bladed portions of high current components may be inserted directly into the pockets 142A and 142B of the high current interconnect 140 without the use of additional fasteners. In sum, assembly of the high current interconnect 140 may consist essentially of welding the feet 148 of the high current interconnect 140 to the PCB 136 and the traces 152 disposed on the PCB 136 and inserting the bladed portions of the two high current components into the pockets 142A and 142B.

Figure 22:
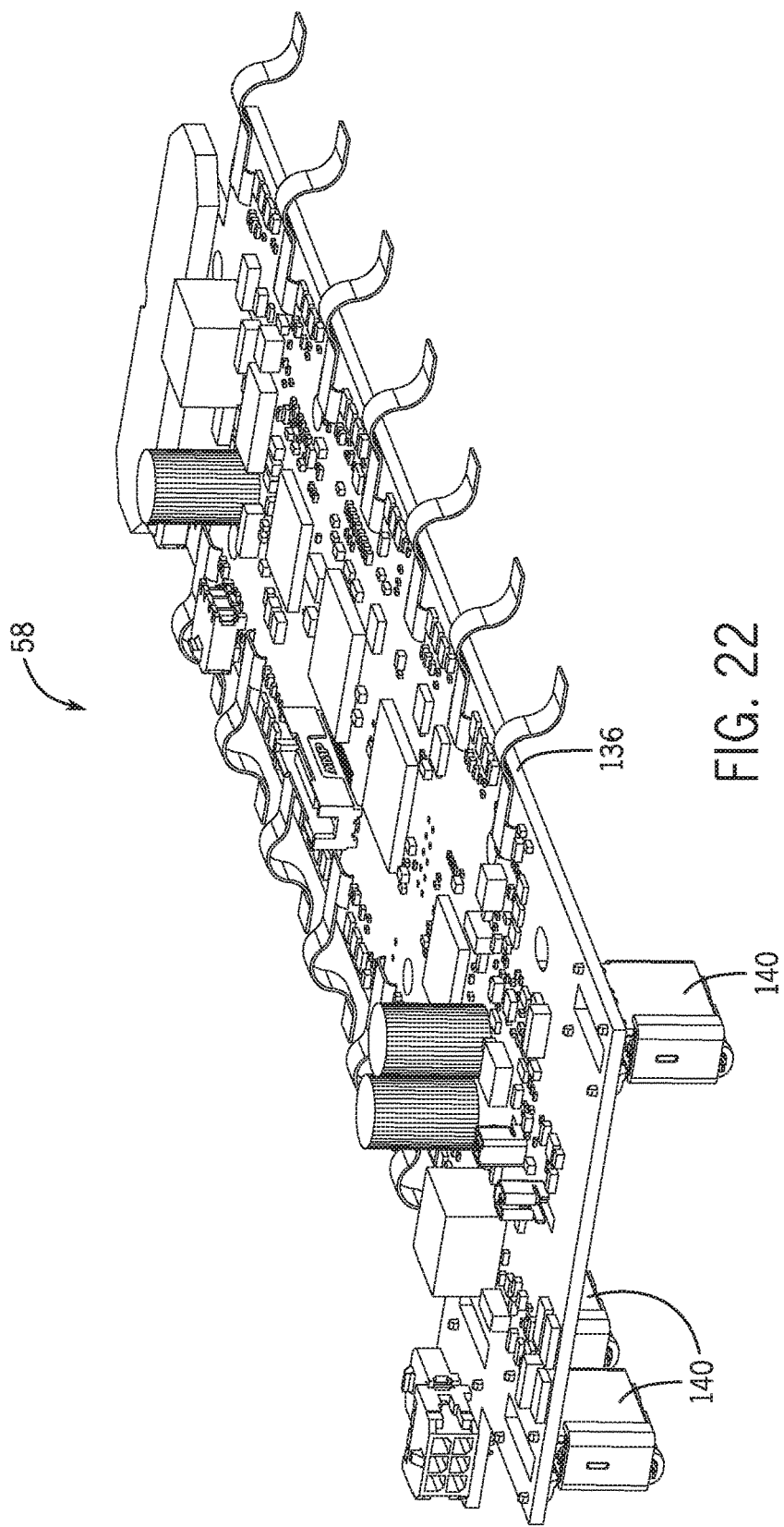
FIG. 22 is a perspective view of the high current interconnect assembly of FIG. 17 mounted on the PCB, in accordance with an embodiment of the present approach.

In some embodiments, the high current interconnects 140 may be mounted on either side of the PCB 136 to more easily facilitate couplings between the high current components of the PCB assembly 58 and the PCB 136. For example, FIGS. 20 and 21 depict the PCB assembly 58 such that if the PCB assembly 58 was disposed above the battery cells 54, then the high current interconnects 140 would extend above the PCB 136 and away from the battery cells 54. In such a configuration, the high current interconnects 140 may each receive a bladed high current component from above and another bladed high current component extending upward from below the PCB 136. In contrast, FIG. 22 depicts the PCB assembly 58 configured such that the high current interconnects 140 extend below the PCB 136 and towards the battery cells 54. In this particular configuration, the high current interconnects 140 may each receive a bladed high current component from below and another bladed high current component extending downward from above the PCB 136. As will be appreciated, in some embodiments, one or more high current interconnects 140 may be mounted to the PCB 136 such that some high current interconnects 140 extend above the PCB 136 and other high current interconnects 140 extend below the PCB 136. Any desirable spatial configuration of the high current interconnects 140 above or below the PCB may be used to reduce the overall packaging size of the battery module 22.

Solid State Pre-charge Control

The pre-charge control circuit 159 on the PCB 136 may be used to pre-charge a DC bus 160 on the output of the battery system 20. As illustrated in FIG. 19, a pre-charge control circuit 159 may be included within the battery module 22. In this position, the pre-charge control circuit 159 may control a charge applied to a DC bus 160 from the battery module 22. The DC bus 160 may couple the battery module 22 to various electric components 161 of the vehicle 10. Prior to applying a full-source voltage of the battery module 22 to the DC bus 160, the DC bus 160 may charge using a lower voltage until a predetermined voltage level is reached. A capacitor or capacitor bank 162 disposed between a high-side and a low-side of the DC bus 160 may allow the DC bus 160 to gradually charge to a predetermined level, as described in detail below. Upon reaching the predetermined level of charge at the DC bus 160, the battery module 22 may apply the full-source voltage to the DC bus 160 to provide a voltage source to the electric components 161 of the vehicle 10.

In traditional battery systems, the pre-charge control circuit 159 is often implemented within the wiring harness of the vehicle 10, and not on the PCB 136 or even within the battery module 22. Providing the pre-charge control circuit 159 on the PCB 136 with solid state components may provide a more integrated and space efficient battery system than implementing the pre-charge circuit within the wiring harness. The solid state components included the pre-charge control circuit 159 may include transistors, microprocessor chips, diodes, or any other components built from solid materials. For example, the presently disclosed pre-charge control circuit 159 may be positioned on the PCB 136 in such a manner as to occupy around 4.5 cubic inches of volume.

With the foregoing in mind, a description of an embodiment of a pre-charge control circuit that may be employed on the PCB 136 is provided. Turning to FIG. 20, a diagrammatical representation of the pre-charge control circuit 159 is illustrated. It should be noted that the pre-charge control circuit 159 is shown as an example and as a single embodiment of the disclosure. As such, it may be appreciated that the pre-charge control circuit 159 may have a variety of circuit configurations not discussed in the present disclosure, but still falling under the true spirit of the disclosure.

The pre-charge control circuit 159 may include a pre-charge input pin 163 and an override input pin 164 as controlling inputs. The pre-charge input pin 163 may provide a signal to an AND gate 165 that may signal to the pre-charge control circuit 159 to run a pre-charge. Since the illustrated pre-charge input pin 163 is coupled to the AND gate 165, a high signal provided at the pre-charge input pin 163 may be a voltage high enough to satisfy a threshold level of the AND gate 165 when the signal is intended to activate a pre-charge mode. Likewise, a low signal may be any voltage low enough to fall under the threshold level of the AND gate 165 when the signal is not intended to activate the pre-charge mode. Additionally, the override input pin 164 may provide the other controlling input into the AND gate 165. This signal may originate from a system designed to disengage all processes that are carried out on the PCB 136 regardless of any other activation input signal of the processes. Generally, the override input pin 164 of the AND gate 165 receives a high signal during ordinary operating conditions. Upon a detected fault within the battery system 20, a low signal may be transmitted at the override input pin 164 to deactivate the pre-charge mode regardless of the signal at the pre-charge input pin 163.

The AND gate 165 may function using standard and gate logic. An integrated circuit power supply 166 may provide power to the AND gate 165 and a ground 167 may ground the AND gate 165. When the signals at the pre-charge input pin 163 and at the override input pin 164 are both high (e.g., above a voltage threshold), the output of the AND gate 165 may also be a high signal. Additionally, when either or both of the signals into the pre-charge input pin 163 and the override input pin 164 are low (e.g., below the voltage threshold), the output of the AND gate 165 may also be a low signal. In this manner, the pre-charge input pin 163 and the override input pin 164 may activate the pre-charge mode upon receiving a high signal into both of the input pins 163 and 164.

A transistor 168 may interact with an output signal of the AND gate 165. Upon receiving a high signal from the AND gate 165 at a base of the transistor 168, the transistor 168 may be activated resulting in a low resistance path between a collector and an emitter of the transistor 168 toward the ground 167. Further, the low resistance path across the transistor 168 may ground a battery pack voltage source 169 (e.g., the battery system 20). Grounding the battery pack voltage source 169 may activate a power metal-oxide-semiconductor field effect transistor (MOSFET) 171, which may result in a flow of current toward a pre-charge output 170.

To activate the power MOSFET 171 and enable the current flow toward the pre-charge output 170, a voltage difference between the battery pack voltage source 169 and a voltage at a node 172 must surpass a voltage threshold of the power MOSFET 171. When the voltage threshold of the power MOSFET 171 is surpassed, the power MOSFET 171 may become a low resistance path for the current flow toward the pre-charge output 170. Additionally, without resistors 173 and 174 dividing the voltage supplied by the battery pack voltage source 169, the voltage at the node 172 may be equal to the voltage supplied by the battery pack voltage source 169. With the resistors 173 and 174 in place, the resistors 173 and 174 may divide the voltage supplied by the battery pack voltage source 169 at node 172 resulting in the voltage difference between a source and a gate of the power MOSFET 171. This voltage difference may be large enough to surpass the voltage threshold of the power MOSFET 171, thus resulting in activation of the power MOSFET 171.

It may be appreciated that the battery pack voltage source 169 may be a 48V battery system. Further, the pre-charge control circuit 159, in some embodiments, may have a configuration that controls the pre-charge for a variety of levels of voltage sources other than a 48V battery system. As such, the power MOSFET 171 may include various MOSFETs with parameters that may vary based on a variety of voltage levels available for the battery pack voltage source 169. Further, the resistors 173 and 174 may have varying resistances based on the threshold voltage of the power MOSFET 171 and the voltage supplied by the battery pack voltage source 169.

After activation of the power MOSFET 171, the voltage from the battery pack voltage source 169 may activate a diode 175 and be supplied at resistors 176. The resistors 176, in combination with resistors 177, may provide another voltage divider of the voltage from the battery pack voltage source 169. Resistances of the resistors 176 and 177 may be chosen such that a current entering the pre-charge output 170 may be sufficiently low for a controlled rise of a voltage level of the capacitor 162 coupled across the DC bus 160 at an output of the battery module 22. For example, the resistors 176 may each have a resistance of around 10 ohms and the resistors 177 may each have a resistance of around 100 kilohms. With a 48V source, the current entering the pre-charge output 170 may be limited to less than 0.25 mA. By charging the capacitor 162 across the DC bus 160 with such a low current prior to applying a full source voltage from the battery pack voltage source 169, an undesirable in-rush current may be avoided when the full source voltage is applied after the pre-charge is complete.

Certain features of the pre-charge control circuit 159 may increase the reliability and lifespan of the pre-charge control circuit 159. As illustrated in FIG. 20, for example, the resistors 176 may be implemented as multiple lower resistance resistors rather than an individual resistor with a resistance equivalent to the sum of the multiple resistances. By employing the multiple resistors 176, the multiple resistors 176 may spread out heat dissipation resulting from a voltage drop across the resistors 176. This may prolong the life of the resistors 176, resulting in enhanced reliability of the pre-charge control circuit 159 for a longer amount of time than if the resistors 176 were consolidated into a single resistor. Additionally, the diode 175 may also enhance the reliability of the pre-charge control circuit 159. The diode 175 may be positioned at any point on a path extending between the power MOSFET 171 and the pre-charge output 170. In FIG. 19, the diode 175 is illustrated coupled between the power MOSFET 171 and the resistors 176, but the diode 175 may also be coupled at any location between the resistors 176 and the pre-charge output 170. Further, the diode 175 may function to protect the pre-charge control circuit 159 from the vehicle 10 potentially back-feeding energy into the pre-charge control circuit 159 and overcharging the battery system 20. The diode 175 is forward biased toward the pre-charge output 170. Therefore, should the vehicle 10 back-feed excess energy toward the battery system 20, the diode 175 may protect the pre-charge control circuit 159.

As mentioned above, the disclosed pre-charge control circuit 159 may be used to pre-charge a DC bus 160 at the output of the battery module 22. To illustrate this function, FIG. 21 is a process flow diagram of a method 178 of pre-charging the DC bus 160 at the output of the battery module 22. Initially, the method 178 may initiate at block 179 with a determination of whether an override is disabled. As discussed above, the override may be disabled when the signal entering the AND gate 165 at the override input pin 164 is a high signal. The high signal entering the AND gate 165 at the override input pin 164 may enable the pre-charge control circuit 159 to execute the pre-charge if an appropriate pre-charge input signal is received at the pre-charge input pin 163. If the override is enabled, then the pre-charge control circuit 159 may not execute the pre-charge, and the determination of whether the override is disabled, at block 179, may repeat until the determination is made that the override is disabled.

Upon determining (block 179) that the override is disabled, the method 178 may include determining at block 180 a presence of a pre-charge activation signal. Specifically, at block 180, the pre-charge control circuit 159 may receive a signal from a processor within the battery system 20 instructing the pre-charge control circuit 159 to pre-charge the DC bus 160. If the pre-charge control circuit 159 does not receive the signal, then a pre-charge may not occur, and the method 178 may restart at the override determination of block 179. However, upon receipt of the pre-charge activation signal, the pre-charge control circuit 159 may begin applying (block 181) the current controlled voltage of the pre-charge control circuit 159 to the DC bus 160 at the output of the battery system 20. After applying the voltage to the DC bus 160 at block 181, a first reading of a voltage at the DC bus 160 may be taken at the start of the voltage application (block 182A), and then a second reading may be taken a short time later at block 182B. By way of example, the second voltage reading of the DC bus 160 may be taken 20-30 milliseconds after the initial reading.

Next, at block 183, the two voltage readings of the DC bus 160 are compared to determine if there is a short-circuit in the DC bus 160 resulting in the capacitor 162 not charging. This may be accomplished by determining if there is any movement of the voltage on the DC bus 160 from the first reading to the second reading. If there is an increase in voltage on the DC bus 160, then the pre-charge of the DC bus 160 may be functioning appropriately. On the other hand, if no movement of voltage between the first and the second reading is observed, the readings may indicate that there is a short-circuit resulting in a malfunction of the pre-charge. Additionally, should the capacitor 162 fail to charge, the pre-charge of the DC bus 160 may not be successful. Because of the unsuccessful pre-charge, applying the full source voltage to the DC bus 160 may result in an undesirable response.

Further, observing and responding to a short-circuit based on the readings, at block 183, may be enabled through the use of semiconductor components to operate the pre-charge control circuit 159. In a traditional, relay-based pre-charge circuit, the contactors are not capable of identifying and responding to a short-circuit with adequate speed. Because it would not take long for the short-circuit to impact the electric components 161 coupled to the DC bus 160, the speed of the semiconductor components of the pre-charge control circuit 159 may provide particular value to the disclosed battery system 20.

When the readings do indicate a short-circuit at block 183, the pre-charge control circuit may automatically shut down the pre-charge and indicate a short-circuit error at block 184. Additionally, the full source voltage may not be applied to the DC bus 160 until the short-circuit error is resolved and the pre-charge is completed. In this manner, the pre-charge control circuit 159 may protect the DC bus 160 and the electric components 161 coupled to the DC bus 160 from excessive inrush currents that would otherwise result upon applying the full source voltage to an uncharged DC bus 160.

Moreover, if the indication at block 183 is that there is no short-circuit, then the pre-charge may continue for a full pre-charge cycle at block 185. In order for the full pre-charge cycle to happen, the current controlled voltage of the pre-charge control circuit 159 may be applied to the DC bus 160 for a period of time sufficient to charge the capacitor 162 across the DC bus 160. Further, the pre-charge control circuit 159 may charge the capacitor 162 to a threshold percentage of the voltage of the battery pack voltage source 169 prior to applying the full source voltage. For example, the threshold percentage of the capacitor 162 may be 90-95% of the voltage provided by the battery pack voltage source 169. Therefore, with a 48V battery module 22, the capacitor 162 may be charged for long enough to reach approximately 45V before applying the full source voltage of the 48V battery module 22 across the DC bus 160. Further, the amount of time that it may take for the capacitor 162 to charge to the threshold percentage may depend upon the current supplied at the DC bus 160. The pre-charge control circuit 159 may control the flow of current toward the DC bus 160. Therefore, the pre-charge may be programmed to run for a slightly longer amount of time than an expected time for the capacitor 162 to reach the threshold percentage based on a typical flow of current out of the pre-charge control circuit 159. For instance, once it is established in block 183 that there is not a short-circuit, the pre-charge may run for an additional 250 milliseconds before the processor disables the pre-charge control circuit 159.

Finally, once the processor shuts off the pre-charge control circuit 159 after block 185, the process may start over at block 179 and wait for the appropriate input signals that may indicate that another pre-charge should occur. Even though the capacitor or capacitor bank 162 across the DC bus 160 may have a very large capacitance and may hold charge for an extended time, the capacitor 162 may be discharged every time that the vehicle 10 stops moving. Therefore, the method 178 of pre-charging the DC bus 160 illustrated by the process flow diagram of FIG. 25 may occur several times on each trip taken by the vehicle 10.

Constant Current Relay Control for Battery Systems

The PCB 136 may include additional hardware for controlling certain aspects within the battery module 22. For example, in some embodiments, the PCB 136 may provide hardware based current control that tightly controls the current in a relay coil of the contactor 154. The contactor 154 may include an electrically controlled switch to electrically couple the battery cells 54 to the battery terminals 24 and 26 when the contactor 154 is in a closed position. The contactor 154 may also include a relay coil that receives a voltage controlled by the hardware based control circuit and generates a magnetic field to actuate the switch of the contactor 154. The hardware based control may reduce an amount of electromagnetic interference and stress on the contactor relay, by lowering the amount of current that is supplied to the contactor 154 throughout the life of the battery module 22. A diagrammatical representation of one example of a relay control circuit 186 that may be used to perform this control is illustrated in FIG. 21. The relay control circuit 186 may remove a delay in responsiveness that a software based relay control may exhibit due to looped timing. As a result, the current through the relay coil of the contactor 154 may remain constant and immune to fluctuations in battery voltage. This may reduce the heat generated in the relay coil and eliminate undesirable effects due to rapid changes in battery voltage.

Again, FIG. 21 illustrates one embodiment of the relay control circuit 186 that may be mounted on the PCB 136. As such, it should be noted that other embodiments of the relay control circuit 186 may have a variety of circuit configurations not discussed in the present disclosure, but still falling under the true spirit of the disclosure. In the illustrated embodiment, the relay control circuit 186 is configured to receive a high-side enable input 187 and a low-side enable input 188. The inputs 187 and 188 may be fed into a high-side AND gate 189 and a low-side AND gate 190, respectively. High signals and low signals may be provided to the inputs 187 and 188, and these signals may originate from a processor 191 implementing instructions stored in a memory device. The processor 191 may provide signals to the relay control circuit 186 that control voltage application to the contactor 154 in a hardware based scheme.

As noted above, the processor 191 may provide signals to the high-side enable input 187 and the low-side enable input 188. For example, a high signal (i.e., an enable signal) entering the high-side enable input 187 may instruct the relay control circuit 186 to enable an application of voltage at a high-side of the contactor 154. Applying voltage at the high-side of the contactor 154 may enable switching of the contactor 154, as discussed in detail below. Further, a high signal at the low-side enable input 188 may instruct the relay control circuit 186 to enable a current to flow from a low-side of the contactor 154 back into the relay control circuit 186. In contrast, a low signal (i.e., a disable signal) at the high-side enable input 187 may prevent the current from flowing through the contactor, and thus from closing the contactor or maintaining the contactor in a closed position, by removing a path to ground for the current to flow toward. Additionally, a low signal at the low-side enable input 188 may increase an amount of time to open the contactor 154 after it is in the closed position, and a low signal is also provided to the high-side enable input 187.

In addition to the inputs 187 and 188, the AND gates 189 and 190 may also have override input pins 164, similar to the override input pin 164 of the pre-charge control circuit 159. As discussed above in the solid state pre-charge control section, the override input pins 164 may receive a signal that originates from a system designed to disengage all processes that may be carried out on the PCB 136 regardless of any other activation instructions received by the various processes. Generally, a high signal may be provided at the override input pin 164 of the AND gates 189 and 190 during ordinary operating conditions. Upon a detected fault within the battery system 20, a low signal may be transmitted to the override input pins 164 to deactivate the relay control circuit 186. Deactivating the relay control circuit 186 may result in the contactor 154 moving to an open position.

Further, the AND gates 189 and 190 may function similarly to the AND gate 165 in that when the AND gates 189 and 190 receive two high signals at their respective inputs 164, 187, and 188, the AND gates 189 and 190 may output a high signal. Additionally, should one or both of the inputs 164, 187 of the AND gate 189 be a low signal, the AND gate 189 may output a low signal. Similarly, if one or both of the inputs 164, 188 of the AND gate 190 be a low signal, the AND gate 190 may output a low signal. The signals produced by the AND gates 189 and 190 may provide a mechanism to control the current flowing through the contactor 154.

When the AND gate 189 outputs a high signal, a transistor 192 may receive the high signal at a base of the transistor 192. Further, the high signal applied at the base of the transistor 192 may activate the transistor 192, completing a path from the battery pack voltage source 169 (e.g., plurality of battery cells 54) to the ground 167 for current to flow. A result of closing the path to the ground 167 may be that resistors 193 and 194 divide a voltage originating from the battery pack voltage source 169. Dividing the voltage may result in a voltage differential between a voltage level at a node 195 applied to a gate of a power metal-oxide-semiconductor field-effect transistor (MOSFET) 196 and the voltage of the battery pack voltage source 169 applied to a source of the power MOSFET 196. It may be noted that while FIG. 21 illustrates the power MOSFET 196, a power transistor other than a power MOSFET may also be applied in the relay control circuit 186 in place of the power MOSFET 196. The voltage differential may activate the power MOSFET 196, closing a switch between the battery pack voltage source 169 and a high-side 197 of the contactor 154.

Additionally, a high-side diagnostic feedback output 198 may provide feedback to the processor 191 indicating functionality of the circuitry coupled to the high-side 197 of the contactor 154. The diagnostic feedback output 198 may include, for example, an indication of whether the power MOSFET 196 and the transistor 192 are switching properly during high-side enable and high-side disable time periods (e.g., diagnosing the functionality of the relay coil of the contactor 154). Further, the diagnostic feedback output 198 may provide an indication to the processor 191 of a short circuit along circuitry coupled to the high-side of the contactor 154.

When the low-side enable input 188 receives a high signal, the relay control circuit 186 may continuously dissipate at least a portion of the energy from the contactor 154. More specifically, circuitry on a low-side 199 of the contactor 154 may function by providing a path toward the ground 167 for the current entering the circuitry from the low-side 199 of the contactor 154 when the low-side enable input 188 and the override input pin 164 both receive high signals. When both inputs 164 and 188 to the AND gate 190 receive high signals, the AND gate 190 may output a high signal. The high signal output by the AND gate 190 may activate a power MOSFET 200 resulting in the path toward the ground 167 for current flowing from the low-side 199 of the contactor 154. Continuously dissipating energy on the low-side 199 of the contactor 154 in this manner may provide for rapid dissipation of energy stored in a coil of the contactor 154 through the load resistance of the circuitry of the low-side 199 of the contactor 154. This may enable a quick release of a switch of the contactor 154. Thus, enabling circuitry on a low-side 199 of the contactor 154 may also assist in switching the contactor 154 back to an open position after the contactor 154 has already been pulled-in. It should be noted that the low-side enable input 188 may receive a high signal at all times during normal operation of the relay control circuit 186. As a result, the relay control circuit 186 may generally be controlled via the high-side enable input 187 as discussed above while the low-side enable input 188 generally receives a constant high signal.

Additionally, the relay control circuit 186 may include a diagnostic feedback output 201 to provide an indication of whether the power MOSFET 200 is switching properly. In some instances, the diagnostic feedback output 201 may provide signals that enable the processor 191 to diagnose any problems that may arise with the relay coil of the contactor 154. For example, a signal at the diagnostic feedback output 201 may provide a signal indicating that the relay coil is even when the high-side enable 187 instructs the relay control circuit 186 to close. In this manner, a signal may provide an indication that the relay control circuit 186 is not functioning desirably.

The relay control circuit 186 may also include an operational amplifier (op-amp) 202 that may receive a voltage signal at a positive terminal of the op-amp 202. In the illustrated embodiment, the op-amp 202 may function as a current measurement device. The current measurement device may indicate a current level flowing from the contactor 154 to provide signals to the processor 191 for current control operation (i.e., activating or deactivating the power MOSFET 196 based on the signals provided to the processor). Further, the voltage signal received by the op-amp 202 may be a voltage level representative of the current flowing from the low-side 199 of the contactor 154 to the relay control circuit 186. The op-amp 202 may amplify the voltage signal received by the op-amp 202 and provide an amplified signal representative of the current level flowing from the contactor 154 to the processor 191. A reference buffer voltage source 203 may provide a signal to the positive terminal of the op-amp 202 to set an input offset current for the op-amp 202. The input offset current may establish a zero point for current entering the positive terminal of the op-amp 202. This may allow the relay control circuit 186 to enable a determination of the exact current supplied from the low-side 199 of the contactor 154. The op-amp 202, in a non-inverting, negative feedback configuration, as illustrated in FIG. 21, may provide amplification of the voltage signal applied at the positive terminal by a value established by resistance values of resistors 204 and 205 at an output of the op-amp 202.

In some embodiments, the input offset current may be established by a voltage divider consisting of resistors 206 and 207. The resistors 206 and 207 may establish the input offset current by dropping a voltage from the reference buffer voltage source 203 across the resistor 206, resulting in a known current value flowing at a known voltage toward the positive terminal of the op-amp 202. The input offset current may establish a known difference in current between the positive terminal and a negative terminal of the op-amp 202. Using the input offset current as a zero point, the current flowing from the low-side 199 of the contactor 154 may be approximated.

Subsequently, the output of the op-amp 202 flows to an analog-to-digital (A/D) converter 208 at an analog input AIN1 of the A/D converter 208. The A/D converter 208 may be powered by a voltage source 209 and grounded at the ground 167. Further, the A/D converter 208 may sample the output of the op-amp 202 to provide a digital representation of the current level flowing from the low-side 199 of the contactor 154 to the processor 191 at a digital output DOUT of the A/D converter 208. That is, the A/D converter 208 may receive an analog signal from the output of the op-amp 202 and convert the analog signal to a digital signal prior to providing the digital signal to the processor 191. The processor 191 may read the digital representation of the current level flowing from the low-side 199 of the contactor 154 at each pulse of the A/D converter 208. After the pulse is read, the value may be compared by the processor 191 to a look-up table stored in a memory to determine an approximated current level, and the processor 191 may determine if the approximated current level falls within an acceptable current level range. The comparison may result in the processor 191 controlling the signal entering the high-side enable input 187 based on where the digital representation may be in relation to stored threshold values (as discussed in detail below). Further, the voltage from the reference buffer voltage source 203 may be applied to a reference (REF) pin of the A/D converter 208 to supply a precision voltage for the output of the op-amp 202 to be compared against for accuracy of the digital representation.

The processor 191 may control the signals entering the inputs 187 and 188 based on the measured current level received from the A/D converter 208 to control the current in a pull-in mode and a hold mode. To illustrate this current control, FIG. 22 is a plot 430 of a current level 432 measured at the low-side 199 of the contactor 154 in the relay control circuit 186 as a function of time. To begin with, the current level 432 may represent the approximate current level measured on a low-side of the contactor 154 in the relay control circuit 186 when the high-side enable input 187 receives a low signal input. The low-signal input may result in disengaging the battery pack voltage source 169 from the contactor 154. Disengaging the battery pack voltage source 169, after an appropriate amount of discharge time, may remove any charge or current from the contactor 154 as measured in the relay control circuit 186. Further, even though the coil in the contactor 154 may be entirely discharged (i.e., the contactor 154 is open and current may not flow through the contactor 154), the current level 432 may be a value greater than zero based on the input offset current established by the reference buffer voltage source 169 and the resistors 206 and 207, as described above.

Upon receiving an indication to pull-in the contactor 154, the processor may instruct the relay control circuit 186 to function in a pull-in mode 434. During the pull-in mode 434, the processor 191 may provide a high signal at the high-side enable input 187, resulting in voltage from the battery pack voltage source 169 being applied to the high-side 197 of the contactor 154. The current across the relay coil of the contactor 154 may increase as a result of applying the voltage from the batter pack voltage source 169. At a current level 436, as illustrated in FIG. 22, the contactor 154 may close, as marked by a peak and a slight drop in current flowing across the contactor 154. During the pull-in mode 434, the current across the contactor 154 may continue to increase until the current reaches a pull-in mode upper threshold current 438. Upon reaching the pull-in mode upper threshold current 438, the processor 191 may provide a low signal to the high-side enable input 187 to disengage the battery pack voltage source 169 from the contactor 154.

After disengaging the battery pack voltage source 169, the measured current may reach a pull-in mode lower threshold current 440. When the pull-in mode lower threshold current 440 is reached, the high-side may again be enabled with a high signal to the high-side enable input 187. As shown in FIG. 22, this process may continue in until a predetermined time limit for the pull-in mode 434 is reached. Thus, the pull-in mode 434 may involve cycling between engaging and disengaging the battery pack voltage source 169 with the contactor 154 to maintain a more tightly controlled current level during the pull-in mode than what a software control scheme achieves. Therefore, the relay control circuit 186 may maintain a substantially constant current (i.e., between the pull-in mode upper threshold current 438 and the pull-in mode lower threshold current 440) for the duration of the pull-in mode 434. Additionally, the predetermined time limit for the pull-in mode 434 may be determined based on an expected time for the contactor 154 to pull-in. Further, the predetermined time limit may be greater than the expected amount of time to transition the contactor switch from the open position to the closed position. For example, in the plot 430, the pull-in mode is set to around 200 ms, which is slightly longer than the amount of time taken for the contactor 154 to transition to the closed position. The pull-in mode may be set longer or shorter based on the expected time for the contactor 154 to pull-in as well as additional time to account for a margin of error.

Once the predetermined time limit for the pull-in mode 434 is reached, the processor may transition to a hold mode 442. The hold mode 442 may maintain the contactor in the closed position (i.e., enabling power transmission from the battery pack voltage source 169 to the electrical components of the vehicle 10) while drawing less power than the pull-in mode 434. During the hold mode, the processor may provide a low signal to the high-side enable input 187 that may result in disengaging the battery pack voltage source 169 from the contactor 154 and lowering the current measured at a low-side of the contactor 154 in the relay control circuit 186. The low signal at the high-side enable input 187 may be continuous during the hold mode 442 until the current measured in the relay control circuit 186 reaches a hold mode lower threshold current 444. Upon the measured current reaching the hold mode lower threshold current 444, the processor 191 may provide a high signal to the high-side enable input 187, thereby engaging the battery pack voltage source 169 with the contactor 154 and increasing the current measured by the relay control circuit 186. The high signal may continue at the high-side enable input 187 until the current reaches a hold mode upper threshold current 446.

In a similar manner to the pull-in mode 434, the processor 191 may repeatedly cycle between engaging and disengaging the battery pack voltage source 169 until the processor 191 receives a signal instructing the processor 191 to open the contactor 154. The result may be a tightly controlled current level that is lower than the current level during the pull-in mode 434. Therefore, the relay control circuit 186 may maintain a substantially constant current (i.e., between the hold mode upper threshold current 446 and the hold mode lower threshold current 444) for the duration of the hold mode 442. This is possible because the amount of current needed to maintain the contactor 154 in a closed position is less than the current needed to move the contactor 154 from an open position to the closed position. Further, the speed of solid state control components of the relay control circuit 186 may enable a faster response time to voltage lags from the battery pack voltage source 169, as opposed to traditional software-based control schemes. Because the battery pack voltage source 169 may output a variable voltage level (e.g., voltage lags from the plurality of battery cells 54), the faster response time to voltage variations may enable the relay control circuit 186 to control the hold mode 442 at a lower current level than the traditional software control schemes. As such, the lower level of current during the hold mode 442 may allow the contactor 154 to consume less energy than if the contactor 154 were to maintain the current level of the pull-in mode 434.

Once the processor receives a signal that instructs the processor to open the contactor 154, the processor may transition into a discharge mode 448. In the discharge mode 448, the processor may provide a low signal to the high-side enable input 187. As discussed previously, the low signal applied to the high-side enable input 187 may result in the battery pack voltage source 169 disengaging from the contactor 154 and the current through the contactor 154 decreasing. During the discharge mode 448, the current may be reduced to the base current level 432. Further, discharging the coil of the contactor 154 may result in the contactor 154 switching back to an open state. The contactor 154 may remain in the discharge mode 448 until the processor 191 receives a signal to restart the pull-in mode 434.

Figure 23:
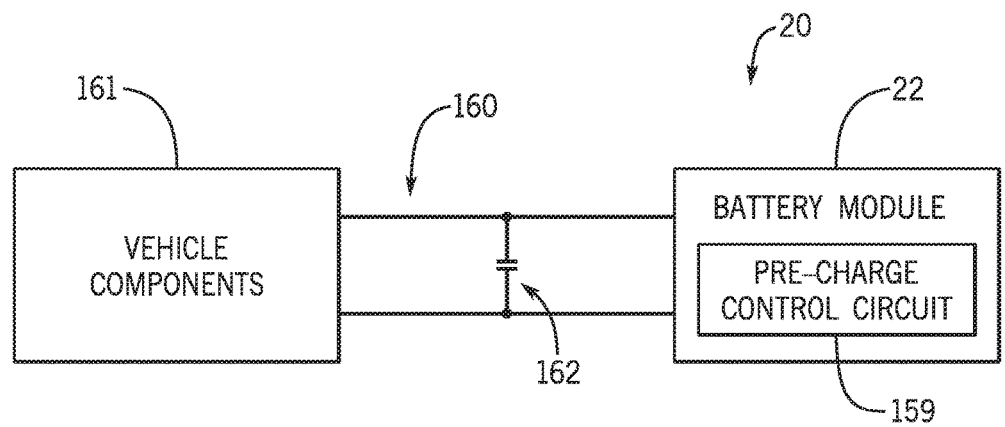
FIG. 23 is a diagrammatical representation of the battery system of FIG. 1 coupled to electronic vehicle components via a direct current (DC) bus, in accordance with an embodiment of the present approach.
Figure 24:
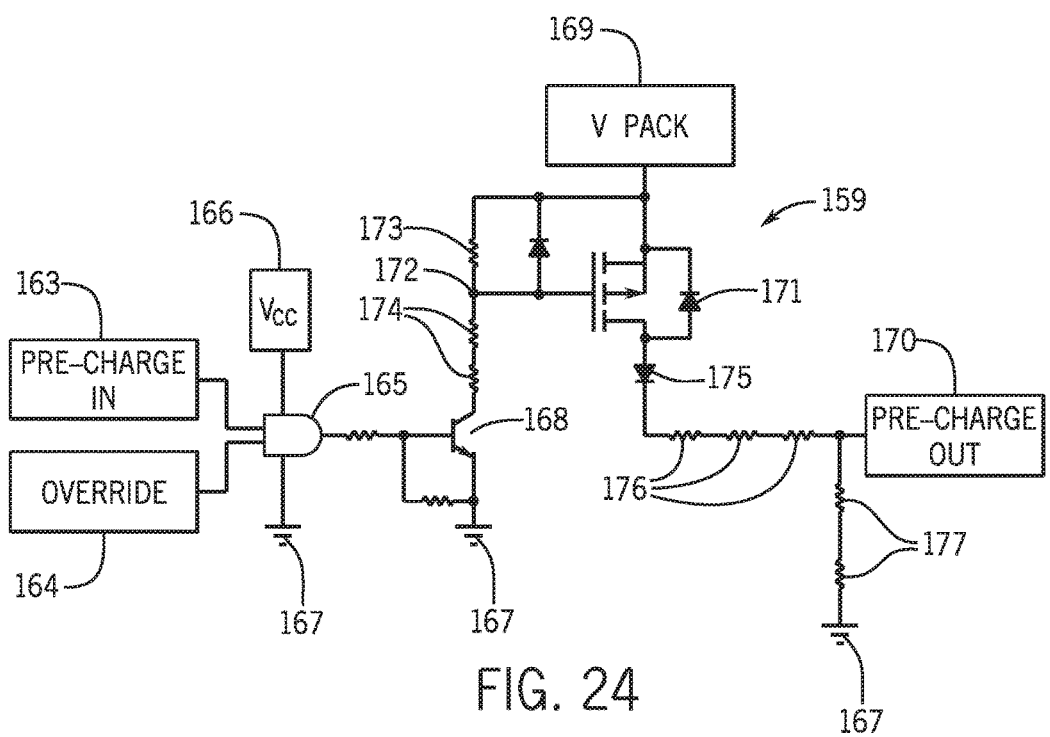
FIG. 24 is a diagrammatical representation of a pre-charge circuit that may be implemented via hardware on the PCB of FIG. 12, in accordance with an embodiment of the present approach.

Along with the relay control circuit 186 described above, FIG. 23 is a process flow diagram of a method 450 of controlling a contactor relay via the relay control circuit 186. Initially, at block 452, the processor may select the pull-in mode 434. The pull-in mode 434, as discussed above, may function to switch the contactor 154 into a closed position. Further, the pull-in mode 434 may enable the current flowing from the contactor 154 to reach a higher level than in the hold mode 442. As illustrated in the plot 430 of FIG. 22, a higher current may be needed to pull-in the contactor 154 than to hold the contactor 154 in the closed position.

Once the pull-in mode 434 is selected, the relay control circuit 186 may apply the voltage from the battery pack voltage source 169 to the contactor 154 at block 454. As described above with reference to FIG. 21, this may involve activating the transistor 192 and the power MOSFET 196. The voltage output to the contactor 154 may increase the current flowing through the contactor 154 until the current reaches the upper threshold value 438 of the pull-in mode 434. As such, a determination may be made at each digital sample of the current flowing from the low-side 199 of the contactor 154 as to whether the current is above the pull-in mode upper threshold 438 at block 456. If the digital sample indicates that the current is not above the pull-in mode upper threshold 438, the application of the voltage to the contactor 154 at block 454 may continue and the determination at block 456 may be made again for a subsequent digital sample.

If the digital sample indicates, at block 456, that the current has exceeded the pull-in mode upper threshold 438, then the relay control circuit 186 may disconnect the voltage from the battery pack voltage source 169 to the contactor 154 at block 458. Disconnecting the voltage at block 458 may result in a reduction of the current flowing from the low-side 199 of the contactor 154. Subsequently, at block 460, a determination may be made as to whether the current has dropped below the pull-in mode lower threshold 440. If the current has not yet reached the pull-in mode lower threshold 440, then the voltage may remain disconnected at block 458, and another determination at block 460 may be made for a subsequent digital sample received by the processor.

On the other hand, if the determination at block 460 is that the current has fallen below the pull-in mode lower threshold 440, then a determination may be made at block 462 as to whether a pre-set time limit of the pull-in mode 434 has been reached. The time limit of the pull-in mode 434, as illustrated in the plot 430 of FIG. 22, may be approximately 200 ms in some embodiments. It should be noted that, the time limit of the pull-in mode 434 may be set for any adequate time to switch the contactor 154 to the closed position. If the determination at block 462 is that the time limit of the pull-in mode 434 has not been reached, then the voltage may be reapplied at block 454. Further, once the voltage is reapplied at block 454, a pull-in mode 434 portion of the method 450, as described above, may be repeated until the time limit of the pull-in mode 434 has been reached at block 462.

Upon a determination, at block 462, that the time limit of the pull-in mode 434 has been reached, the processor may change instructions to the relay control circuit 186 from the pull-in mode 434 to the hold mode 442. As discussed above, the hold mode 442 may maintain the contactor 154 in the closed position, but it does not draw as much energy as the pull-in mode 434. A higher current may be beneficial to accomplish switching during the pull-in mode 434 of the method 450, but maintaining closure of the contactor 154 may be accomplished reliably at a considerably lower current during the hold mode 442. For example, as illustrated in FIG. 22, the pull-in mode 434 may maintain a current through the contactor 154 of approximately 400 mA, while the hold mode 442 may maintain a current through the contactor 154 of approximately 200 mA. This may not be possible with a software based controller, as used traditionally for contactor control, where the voltage is typically applied to the contactor 154 similarly in both the pull-in mode 434 and the hold mode 442. That is, a software based controller may apply a voltage to the high-side 197 of the contactor 154 to maintain a constant current of 400 mA, rather than reducing the current to a hold mode level after a time limit for a pull-in mode is reached. The software based controller may maintain the relatively high current through the contactor 154 due to slow response times of the software based controller due to looped timing. Because of the slow response time, the current may need to be maintained at a relatively high level to provide a buffer for the software to re-regulate the current during a voltage dip from a voltage source. The presently disclosed hardware based relay control circuit 186, however, may respond quickly to any changes in the voltage supplied by a voltage source. As such, a substantially lower current level may be maintained with the hold mode 442 in the hardware based relay control circuit 186 because not as much time is necessary to re-regulate the current during a voltage dip from the battery pack voltage source 169.

Once the transition to the hold mode 442 is completed at block 464, the voltage may remain disconnected until a determination is made at block 466 as to whether the current has fallen below the hold mode lower threshold 444. If the current has yet to reach the hold mode lower threshold 444, the determination at block 466 may be repeated for each digital sample of the current flowing from the low-side 199 of the contactor 154. When the current reaches the hold mode lower threshold 444, the voltage may be reapplied to the contactor 154 at block 468 to drive the measured current from the low-side 199 of the contactor 154 toward the hold mode upper threshold 446.

Subsequently, at block 470, a determination may be made as to whether the current has surpassed the hold mode upper threshold 446. If the current has not reached the hold mode upper threshold 446, then the voltage may remain applied to the contactor 154 at block 468 and the determination at block 470 may be made again for the next digital sample of the current flowing from the low-side 199 of the contactor 154. Further, upon the determination at block 470 that the current is above the hold mode upper threshold 446, the voltage may be disconnected from the contactor 154 at block 472. Disconnecting the battery pack voltage source 169 may result in the current flowing from the low-side 199 of the contactor 154 decreasing toward the hold mode lower threshold 444. Once the voltage is disconnected, a determination may be made at block 474 as to whether a signal has been received at the processor 191 to end the cycle. The signal may be an instruction to switch the contactor 154 back to an open position. If the signal has not been received at the processor 191, the hold mode 442 portion of the method 450 may be repeated starting back at block 466 until the determination is made at block 474 that the signal to end the cycle has been received at the processor. At this point, the cycle may end at block 476, and, because the voltage is not reapplied to the contactor 154, the current measured at the low-side 199 of the contactor 154 may continue to decrease until it reaches the current level 432 indicating that the contactor 154 is discharged.

Bladed Fuse Connectors

Figure 29:
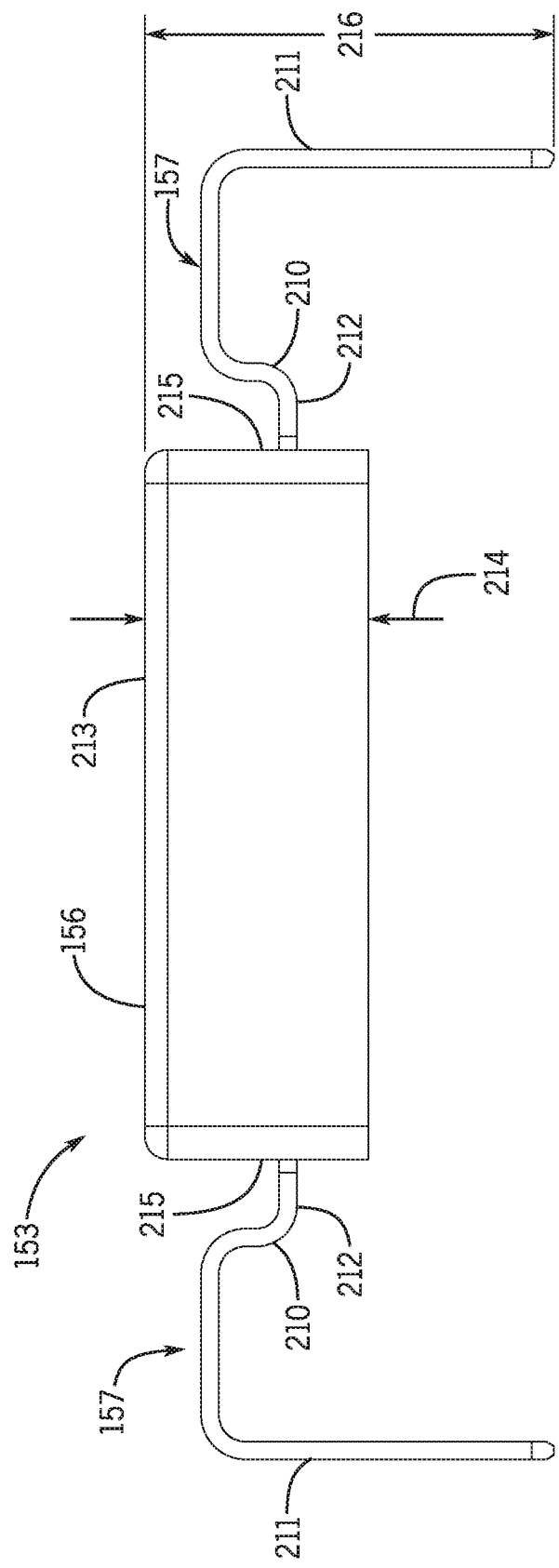
FIG. 29 is a side view of the bladed fuse assembly of FIG. 20, in accordance with an embodiment of the present approach.
Figure 30:
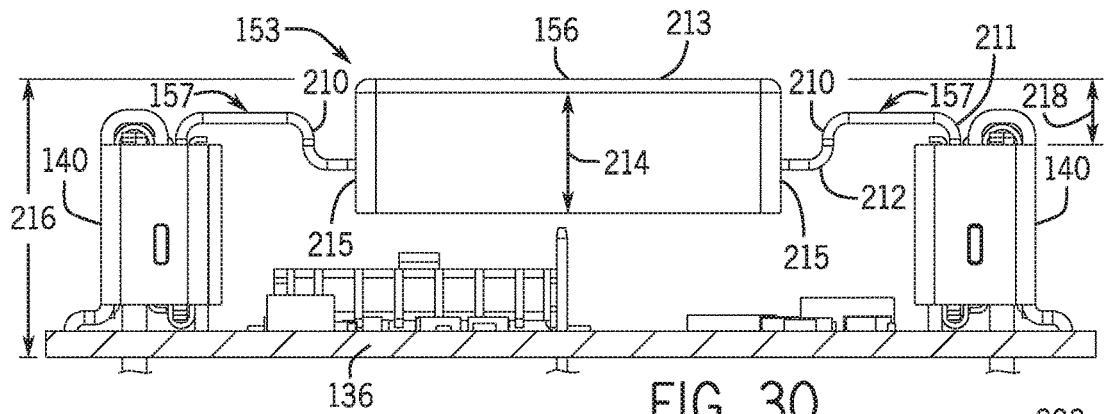
FIG. 30 is a side view of the bladed fuse assembly of FIG. 20 coupled to the PCB, in accordance with an embodiment of the present approach.

As discussed briefly above, the fuse assembly 153 includes the fuse 156 and two bladed fuse connectors 157 extending therefrom. The bladed fuse connectors 157 may each include an S-shaped bend 210, as illustrated in FIG. 29. The S-shaped bend 210 of each bladed fuse connectors 157 is disposed between a first end 211 and a second end 212 of the bladed fuse connector 157, as shown in the illustrated embodiment. As explained below, the first ends 211 may be inserted into the high current interconnects 140 mounted on the PCB 136. When the fuse assembly 153 is installed in the battery module 22, the S-shaped bends 210 are configured to reduce the height of a top 213 of the fuse 156 relative to the high current interconnects 140. In other words, the S-shaped bends 210 enable the top 213 of the fuse 156 to be located closer to the PCB 136 than a substantially flat or straight bladed fuse connector 157 would. As shown in FIG. 30, the bladed fuse connectors 157 are coupled to a lower portion of the fuse 156 relative to a fuse height 214 at connecting points 215. As explained in detail below, the lower coupling location of the bladed fuse connectors 157 may reduce the overall height of the fuse assembly 153 relative to the PCB 136.

The bladed fuse connectors 157 may be received into respective high current interconnects 140 that are mounted on the PCB 136, as illustrated in FIG. 30. The fuse assembly 153 may be specifically dimensioned to facilitate relatively compact packaging of the PCB assembly 58 and, thus, the overall battery module 22. For example, the fuse assembly 153 may be specifically constructed to have an overall height dimension 216 that minimizes the height of the fuse assembly 153 with respect to the PCB 136.

The bladed fuse connectors 157 may also be specifically dimensioned and shaped to reduce the overall height of the fuse assembly 153 with respect to the PCB 136 when the bladed fuse connectors 157 are coupled with the high current interconnects 140. In the illustrated embodiment, as described above, the bladed fuse connectors 157 extend outward from the fuse 156 along a lower portion of the fuse 156 relative to the fuse height 214. As shown in FIG. 29, the bladed fuse connectors 157 extend outward in a substantially horizontal orientation (e.g., plus or minus ten degrees) at the second end 212. However, in other embodiments the bladed fuse connectors 157 may have an angled or substantially vertical connection with the fuse 156. S-shaped bends 210 within each of the bladed fuse connectors 157 then raise the height of respective portions of the bladed fuse connectors 157, relative to the connection between the bladed fuse connectors 157 and the fuse 156, so that the bladed fuse connectors 157 can reach the openings 145 in the high current interconnects 140 without requiring the point at which the bladed fuse connectors 157 couple with the fuse 156 to also extend above the high current interconnects 140. In other words, the connecting point 215 of the bladed fuse connectors 157 may be lower (e.g., closer to the PCB 136) than the openings 145 in the high current interconnects 140. By including the S-shaped bends 210 in the bladed fuse connectors 157, the distance 218 between the top 213 of the fuse 156 and the openings 145 in the high current interconnects 140 may be reduced. For example, without the S-shaped bends 210, the distance 218 would be greater, and as a result the overall height 216 of the fuse assembly 153 relative to the PCB 136 would be increased. The bladed fuse connectors 157 enter the openings 145 in a substantially vertical orientation (e.g., plus or minus ten degrees) at the first end 211. However, as mentioned above, other embodiments may have angled connections with the openings 145. The S-shaped bends 210, in addition to reducing the height of the fuse assembly 153, may act as shock absorbers, enabling the fuse assembly 153 to withstand vibrations of the vehicle 10 during operation, for example.

In the illustrated embodiment, the fuse 156 is elevated above the PCB 136 by the bladed fuse connectors 157. However, in alternative embodiments, the high current interconnects 140 may be disposed on the PCB 136 such that the fuse 156 sits on the PCB 136 or below the PCB 136. As mentioned above, the bladed fuse connectors 157 may be dimensioned to reduce the overall height of the fuse assembly 153. For example, the S-shaped bends 210 may be shaped so that a lower surface of the fuse 156 and/or a connection point between the fuse 156 and the bladed fuse connectors 157 is below an upper surface of the high current interconnect 140. In this manner, a relatively compact fuse assembly 153 may be included in the battery module 22.

Battery Cell Interconnections

As mentioned above, the battery module 22 may include several battery cells 54 for storing and outputting the desired voltage from the battery module 22. More specifically, the battery cells 54 may be electrically connected or coupled to each other in series, parallel, or a combination thereof to produce the desired output voltage (e.g., 48V). The battery cells 54 may include prismatic battery cells 54 with positive and negative terminals extending therefrom, and bus bar cell interconnect mechanisms may be used to couple the positive terminal of one battery cell to the negative terminal of an adjacent battery cell. In some instances, the term "adjacent" may be used to indicate that battery cells 54 or other battery module components are deposited beside one another. For example, terminals of two battery cells 54 deposited side by side may be referred to as adjacent terminals. Additionally, the term "adjacent" may be used to indicate that battery cells 54 or other components are in contact with one another. Furthermore, the term "adjacent" may include directly adjacent and immediately adjacent.

Figure 31:
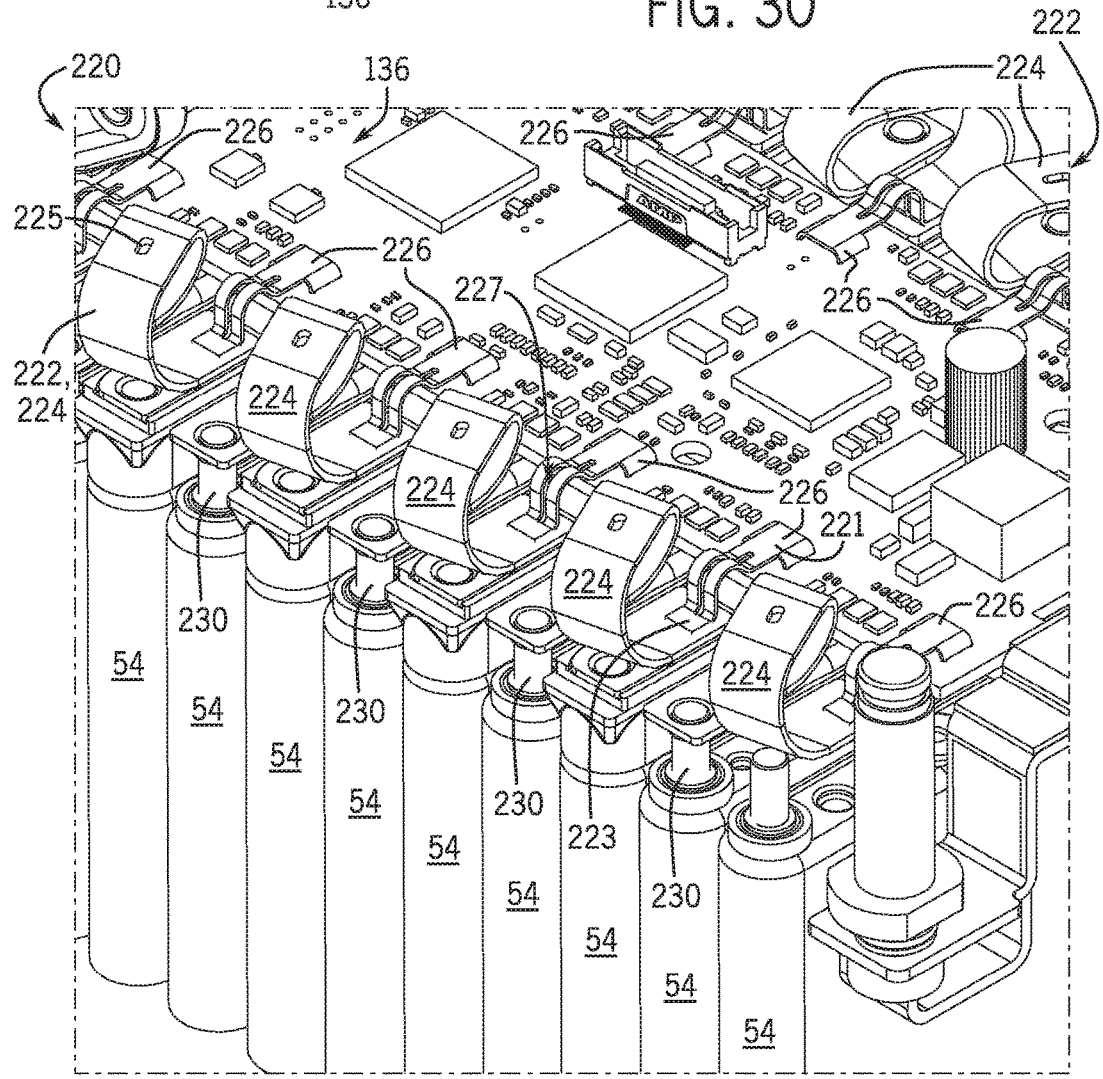
FIG. 31 is a perspective view of components of the battery module of FIG. 12 illustrating bus bar cell interconnect assemblies within the battery module, in accordance with an embodiment of the present approach.

FIG. 31 illustrates an interconnect assembly 220 that may be present within the battery module 22 to facilitate connections between the battery cells 54 themselves as well as connections between the battery cells 54 and the PCB 136. As described in detail below, the interconnect assembly 220 may include bus bar cell interconnects 222 and adapters 234. The interconnect assembly 220 may include bus bar cell interconnects 222 including loops 224 that are generally serpentine with a body that would be generated by a loop orbiting about a line while undergoing translation along the line. The bus bar cell interconnects 222 may also include flat end portions on each end of the loop 224. These loops 224, in some embodiments, may all be made from the same material (e.g., copper). Specifically, the loops 224 may be copper bus bars that are bent into a serpentine curled shape. That is, the loop 224 and the flat end portions may all be made from the same material. A hole may be formed in one flat end portion of each bus bar cell interconnect 222 for coupling with one of two adjacent battery cells 54. The hole may be adapted to receive a terminal 230. In the illustrated embodiment, and as discussed in detail below with reference to FIG. 35, the bus bar cell interconnects 222 may include the loop 224 between a first end 240 (e.g., plate contact end) and a second end 242 (e.g., terminal mating end). For example, the first and second ends may be generally horizontal or flat compared to the loop 224. In addition, an upper portion of the loop 224 approximately halfway between the first and second ends may be a generally horizontal or flat portion. Still further, the loops 224 may include an engagement feature 225 for coupling to a complementary engagement feature (or mounting feature) of the lid assembly 56. In the illustrated embodiment, the engagement feature 225 is a hole formed in the generally flat portion of the loop 224 between the first and second ends. This generally flat portion of the loop 224 may enable relatively easy machining of the engagement feature 225 into the loop 224, as opposed to machining the engagement feature 225 into an arced portion of the loop 224. In addition, the generally flat portion may be a relatively easy portion of the loop 224 for pick and place machinery to grip the loop 224 and to place the loop 224 onto the complementary engagement feature of the lid. In some embodiments, the engagement feature 225 may receive or be mounted on a pin coupled to the lid assembly 56. However, in other embodiments, the cover 52 may include the complementary engagement or mounting feature.

During assembly of the battery module 22, the loops 224 may be positioned on the battery cells 54, and the PCB assembly 58 may be lowered onto the interconnected battery cells 54. As shown in the illustrated embodiment, the PCB assembly 58 may be equipped with voltage sense connection tabs 226 disposed along the edges of and coupled to the PCB 136. That is, one end of the voltage sense connect tab 226 is mounted on a plane of the PCB 136, while an opposite end extends away from the PCB 136. These voltage sense connection tabs 226 may be positioned on the PCB 136 such that, when the PCB assembly 58 is lowered onto the interconnected battery cells 54, the voltage sense connection tabs 226 land on an end of the loops 224, or other type of bus bar cell interconnect 222. More specifically, with respect to the embodiment illustrated in FIG. 31, the voltage sense connection tabs 226 may be coupled to the PCB 136 at positions that will be aligned with flattened portions of the bus bar cell interconnects 222 when the PCB assembly 58 is disposed over the battery cells 54.

As shown in FIG. 31, the voltage sense connection tabs 226 may include an arced portion between the PCB 136 and the bus bar cell interconnects 222. In the illustrated embodiment, the arced portion extends in an upward direction between two substantially flat ends 221 and 223. The flat ends 221 and 223 may be substantially parallel to one another. For example, in the illustrated embodiment the flat end 223 is mounted on and substantially horizontal with respect to the plane of the PCB 136. The flat ends 221 and 223 enable a greater contact surface for coupling the voltage sense connection tabs 226 to the PCB 136 and bus bar cell interconnects 222. As shown in the illustrated embodiment, the arched portion biases the flat ends 221 and 223 in a downward direction. For example, when the flat end 221 is mounted on the PCB 136, the arced portion biases the flat end 223 toward the bus bar cell interconnect 222. Moreover, in the illustrated embodiment, the flat end 223 and the arced portion extend laterally off of the PCB 136. That is, the arced portion and flat end 223 extend away from the PCB 136 off of the side of the PCB 136. In other words, the arced portion and flat end 223 are essentially cantilevered from the PCB 136 via a connection established by coupling features extending from the flat end 221 and engaging the PCB 136.

The voltage sense connection tabs 226 may also include a slit 227 formed along the arced portion between the connection to the PCB 136 and the bus bar cell interconnects 222. The slit 227 essentially splits at least the arced portion of the voltage sense connection tab 226 into two portions. The slit 227 may reduce the overall weight of the voltage sense connection tabs 226 by removing material while maintaining both an electrical and mechanical connection to the PCB 136 and bus bar cell interconnects 222. Additionally, the slit 227 may provide greater flexibility to the arced portion of the voltage sense connection tabs 226. As a result, the voltage sense connection tabs 226 may adjust to and absorb shocks caused by vibrations and movements within the vehicle 10.

The voltage sense connection tabs 226 may be welded to the bus bar cell interconnects 222 to complete the connection. For example, in the illustrated embodiment, the end 223 of the voltage sense connection tab 226 is welded to the plate contact end of the bus bar cell interconnect 222. When coupled to the bus bar cell interconnects 222, the voltage sense connection tabs 226 function as a voltage sense lead for voltage sensors on the PCB 136. The voltage sense connection tabs 226 may be soldered into electrical communication with the voltage sensors on the PCB 136 prior to the PCB assembly 58 being positioned on the battery cells 54. By using voltage sense connection tabs 226 integrated onto the PCB 136 in conjunction with the cell interconnect loops 224, the illustrated embodiment eliminates the need for a separate bus for making the voltage sense connections. This may facilitate a relatively simple and inexpensive assembly of the battery module 22, in addition to reducing the space requirement for voltage sensing components within the battery module 22. It is appreciated that, while the voltage sense connection tabs 226 have been discussed in reference to bus bar cell interconnects 222 including loops 224, that the voltage sense connection tabs 226 may be utilized with other types of bus bar cell interconnects 222. For example, the voltage sense connection tabs 226 may couple to bus bar links 260 (described in detail below) to relay a voltage from the battery cells 54.

Figure 32:
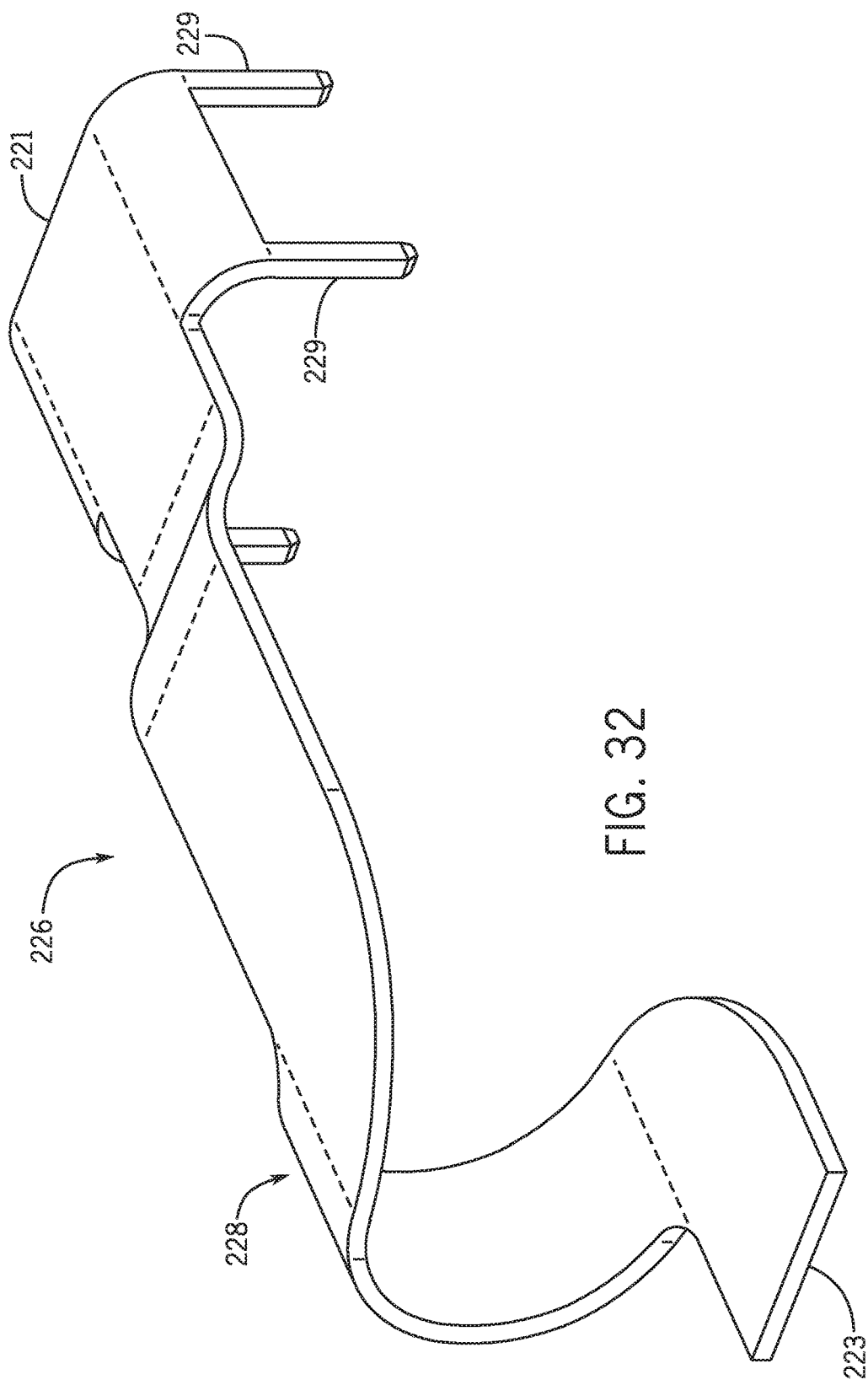
FIG. 32 is a perspective view of a voltage sense connection tab, in accordance with an embodiment of the present approach.

In another embodiment, the voltage sense connection tabs 226 each may include a twisted section 228 that extends from a plateaued portion of the arced portion, as shown in FIG. 32. The twisted section 228 may include a C-shaped or serpentine curvature that inverts a surface of the voltage sense connection tab 226 from an upward facing orientation at the connection to the PCB 136 to a downward facing orientation at the connection to the bus bar cell interconnect 222. Additionally, the twisted section 228 is oriented substantially perpendicular to the end 223 of the voltage sense connection tab 226. In either of the embodiments illustrated in FIGS. 31 and 32, the voltage sense connection tabs 226 may include coupling features 229, such as legs, to facilitate connection of the voltage sense connection tab 226 to the PCB 136. In some embodiments, the coupling features 229 may couple to the voltage sense components on the PCB 136. In other embodiments, the coupling features 229 may mount the voltage sense connection tab 226 to the PCB 136 so that a flattened portion of the voltage sense connection tab 226 is held in contact with a voltage sensing lead disposed on an outer surface of the PCB 136. While not shown in the illustrated embodiment of FIG. 32, any of various portions of the voltage sense connection tab 226, including the twisted section 228, may incorporate a slit, such as the slit 227, to improve flexibility, conserve material, and so forth.

Figure 33:
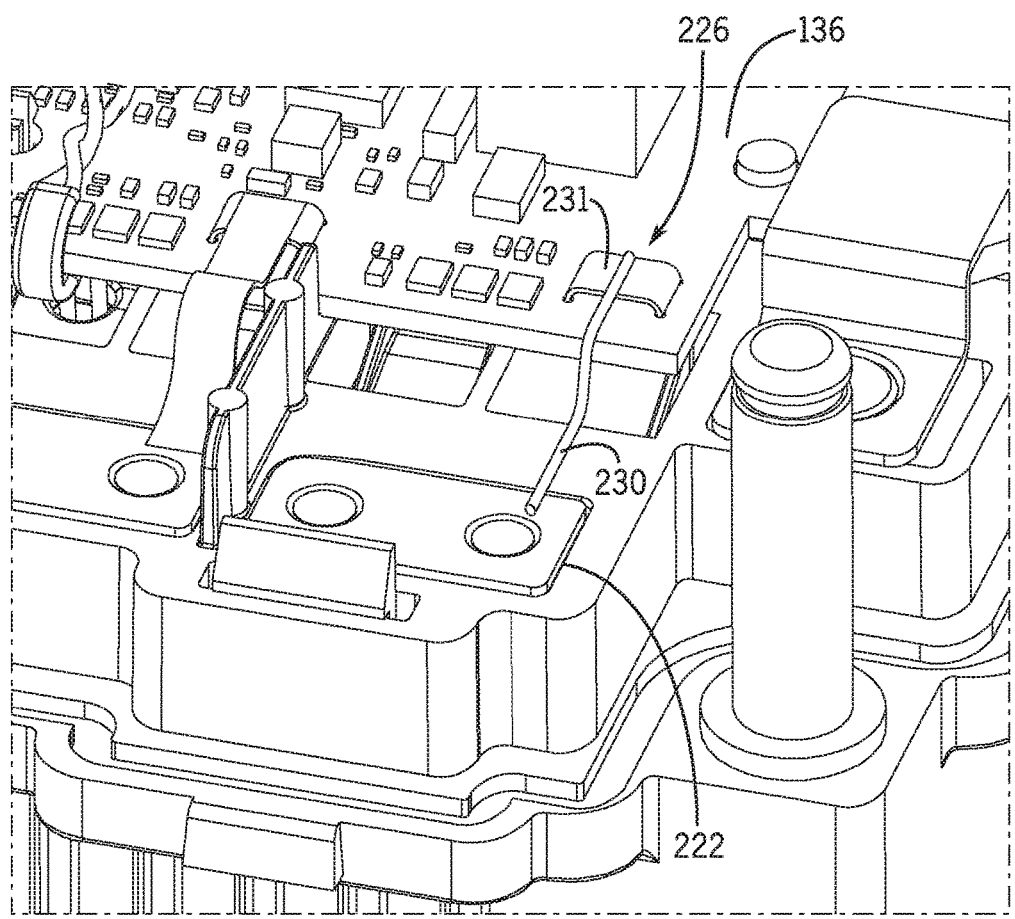
FIG. 33 is a perspective view of a voltage sense connection tab, in accordance with an embodiment of the present approach.

As described above, the battery module 22 may include voltage sensing components to couple the bus bar cell interconnects 222 to the PCB 136 in order to relay a voltage from the battery cells 54. In another embodiment, the voltage sense connection tab 226 may include a wire bonded connection 233, as shown in FIG. 33. The wire bonded connection 233 may include a wire, a ribbon of metal, electric trace, or other conductive material coupled between the PCB 136 and bus bar cell interconnects 222. For example, the wire bonded connection 233 may be made of metals such as copper, aluminum, tin, or the like. In some embodiments, the wire bonded connection 233 may be welded between the bus bar cell interconnect 222 and a PCB mounted body portion 231 of the voltage sense connection tab 226. The wire bonded connection 233 may be curved or arced to follow the profile of the PCB 136 and the bus bar cell interconnects 222. For example, the wire bonded connection 233 may be angled in a downward direction in embodiments where the PCB 136 is mounted above the bus bar cell interconnects 222. The wire bonded connection 233 enables a streamlined and robust electrical connection between the bus bar cell interconnects 222 and the PCB 136. Additionally, as with previously disclosed embodiments, the wire bonded connection 233 may be vibration tolerant and capable of absorbing shocks and the like while maintaining the electrical connection between the bus bar cell interconnects 222 and the PCB 136. Furthermore, the wire bonded connection 233 is relatively space efficient within the battery module 22.

As mentioned above, the wire bonded connection 233 may be made of a variety of conductive materials. In some embodiments, the wire bonded connection 233 is aluminum. However, the bus bar cell interconnect 222 may be copper. To facilitate the connection between dissimilar metals, the bus bar cell interconnect 222 may have a piece of the dissimilar metal attached to it (e.g., via soldering). Therefore, in some embodiments, a copper bus bar cell interconnect 222 has a piece of aluminum attached to the bus bar cell interconnect 222 (e.g., during preassembly) to facilitate the connection of the wire bonded connection 233. In other words, additional conductive materials (e.g., metals) may be added to the bus bar cell interconnects 222 to account for the material used for the wire bonded connections 233.

The wire bonded connection 233 of the voltage sense connection tab 226 may facilitate a relatively simple and inexpensive assembly of the battery module 22. For example, the body portion 231 of the voltage sense connection tab 226 may be mounted to the PCB 136 using the coupling features 229 as described above with reference to FIG. 32. Then, a first end of the wire that forms the wire bonded connection 233 may be welded to the bus bar cell interconnect 222. The first end of the wire bonded connection 233 may be part of a continuous spool of conductive wire. After the first end of the wire bonded connection 233 is welded to the bus bar cell interconnect 222, a length of wire may be unspooled, or otherwise disposed between the welded first end of the wire bonded connection 233 and the body portion 231 of the voltage sense connection tab 226. A second end of the wire bonded connection 233 may be welded to the body portion of the voltage sense connection tab 226 to complete the electrical connection between the bus bar cell interconnect 222 and the PCB 136. The wire may be cut after welding the second end to the body portion of the voltage sense connection tab 226. In this manner, connections between each of the plurality of bus bar cell interconnects 222 and the PCB 136 may be made efficiently and using relatively few materials. However, in other embodiments, the wire bonded connection 233 may be connected between the voltage sense connection tab 226 and the bus bar cell interconnect 222 in the reverse order or different order entirely. For example, the first end of the wire that forms the wire bonded connection 233 may be welded to the voltage sense connection tab 226 before the second end of the wire is welded to the bus bar cell interconnect 222. Moreover, as mentioned above, the wire bonded connection 233 may be utilized with other styles of bus bar cell interconnects 222, such as bus bar links 260 (described below).

As discussed above, FIG. 31 illustrates an interconnect assembly 220 that may be present within the battery module 22 to facilitate connections between the battery cells 54 themselves as well as connections between the battery cells 54 and the PCB 136. As described in detail below, the interconnect assembly 220 may include bus bar cell interconnects 222 and adapters 234. The interconnect assembly 220 may include bus bar cell interconnects 222 including loops 224 that are generally serpentine with a body that would be generated by a loop orbiting about a line while undergoing translation along the line. The bus bar cell interconnects 222 may also include flat end portions on each end of the loop 224. These loops 224, in some embodiments, may all be made from the same material (e.g., copper). Specifically, the loops 224 may be copper bus bars that are bent into a serpentine curled shape. That is, the loop 224 and the flat end portions may all be made from the same material. A hole may be formed in one flat end portion of each bus bar cell interconnect 222 for coupling with one of two adjacent battery cells 54. The hole may be adapted to receive a terminal 230. In the illustrated embodiment, and as discussed in detail below with reference to FIG. 34, the bus bar cell interconnects 222 may include the loop 224 between a first end 240 (e.g., plate contact end) and a second end 242 (e.g., terminal mating end). For example, the first and second ends may be generally horizontal or flat compared to the loop 224. In addition, an upper portion of the loop 224 approximately halfway between the first and second ends may be a generally horizontal or flat portion. Still further, the loops 224 may include an engagement feature 225 for coupling to a complementary engagement feature (or mounting feature) of the lid assembly 56. In the illustrated embodiment, the engagement feature 225 is a hole formed in the generally flat portion of the loop 224 between the first and second ends. This generally flat portion of the loop 224 may enable relatively easy machining of the engagement feature 225 into the loop 224, as opposed to machining the engagement feature 225 into an arced portion of the loop 224. In addition, the generally flat portion may be a relatively easy portion of the loop 224 for pick and place machinery to grip the loop 224 and to place the loop 224 onto the complementary engagement feature of the lid. In some embodiments, the engagement feature 225 may receive or be mounted on a pin coupled to the lid assembly 56. However, in other embodiments, the cover 52 may include the complementary engagement or mounting feature.

During assembly of the battery module 22, the loops 224 may be positioned on the battery cells 54, and the PCB assembly 58 may be lowered onto the interconnected battery cells 54. As shown in FIG. 31, the PCB assembly 58 may be equipped with voltage sense connection tabs 226 disposed along the edges of and coupled to the PCB 136. These voltage sense connection tabs 226 may be positioned on the PCB 136 such that, when the PCB assembly 58 is lowered onto the interconnected battery cells 54, the voltage sense connection tabs 226 land on the first end 240 of the bus bar cell interconnects 222 described above. The voltage sense connection tabs 226 may then be welded to the bus bar cell interconnects 222 to complete the connection. The voltage sense connection tabs 226 function as a voltage sense lead for voltage sensors on the PCB 136, and the voltage sense connection tabs 226 are soldered into electrical communication with the voltage sensors on the PCB 136 prior to the PCB assembly 58 being positioned on the battery cells 54. By using voltage sense connection tabs 226 integrated onto the PCB 136 in conjunction with bus bar cell interconnects 222, the illustrated embodiments eliminate the need for a separate bus for making the voltage sense connections. This may facilitate a relatively simple and inexpensive assembly of the battery module 22, in addition to reducing the space requirement within the battery module 22.

FIG. 34 is an exploded view of four battery cells 54 being electrically coupled together via the interconnect assembly 220 of FIG. 31. As described above, the interconnect assembly 220 may include the bus bar cell interconnect 222 and the adapter 234. In the illustrated embodiment, each of the battery cells 54 includes two oppositely charged terminals 230 and 232. One of these terminals functions as the anode of the particular battery cell 54, while the other functions as the cathode. As noted above, the battery cells 54 may be arranged so that they are electrically coupled in series. For example, the anode of one battery cell 54 is disposed immediately adjacent the cathode of a neighboring battery cell 54 with respect to the aligned series of battery cells 54 and they are communicatively coupled. As discussed above, "immediately adjacent" may refer to the terminals 230 and 232 being side by side within the context of the arrangement of the plurality of the terminals 230 and 232.

In some embodiments, the oppositely charged terminals 230 and 232 of the battery cells 54 may be made from different materials (e.g., copper and aluminum). In such instances, the interconnect assembly 220 may include adapters 234 for transitioning between these two materials. In the illustrated embodiment, for example, the adapters 234 are configured to form a link between the aluminum posts (e.g., terminals 232) of the battery cells 54 and the copper bus bar cell interconnects 222. Each adapter 234 may include a contact surface that transitions from aluminum at one end 236 to copper at the opposite end 238. For example, the one end 236 may include an aperture that receives the aluminum post 232. Additionally, the opposite end 238 may be electrically coupled to the one end 236. Thus, the bus bar cell interconnects 222 may couple to a copper connection at the opposite end 238 and forgo a dissimilar metal connection. The aluminum end 236 of the adapter 234 is configured to be positioned over the terminals 232, as shown, and the copper end 238 of the adapter 234 is designed to receive the first end 240 of the interconnect 222. For example, in the illustrated embodiment, the first end 240 of the interconnect 222 is aligned with and disposed over the copper end 238 to communicatively couple the bus bar cell interconnect 222 to the battery cell 54. However, the second end 242 of the interconnect 222 receives the terminal 230 of the adjacent battery cell 54 to complete the connection. As described above, the adapter 234 may facilitate a single metal connection between the battery cells 54. It should be noted that embodiments in accordance with the present disclosure also include reverse configurations, wherein copper and aluminum are switched with respect to the ends 236 and 238.

The illustrated bus bar cell interconnect 222, as described above, includes the plate contact end 240 that may be welded onto the copper end 238 of the corresponding adapter 234. At an opposite end of the loop 224 from the plate contact end 240, the bus bar cell interconnect 222 includes the terminal mating end 242 designed to fit over the copper terminal 230 and to establish an electrical engagement between the cell interconnect 222 and the copper terminal 230. The terminal mating end 242 may include a collar on the bottom surface. In alternative embodiments, the collar may be on the top surface of the terminal mating end 242 or on both surfaces. The collar may, for example, provide extra surface area for deposition of weld metal. As illustrated, the loop 224 is shaped in a specific serpentine or curled geometric form. Any stress, vibrations, motion, or other disturbances encountered by the battery module 22 may be distributed or dampened over this serpentine or curled geometric form, without weakening any welds. In this way, the loops 224 may enable a longer lifetime of the cell interconnect assembly 220 than would be possible with, for example, rigid bus bars welded between the terminals 230 and 232.

Figure 35:
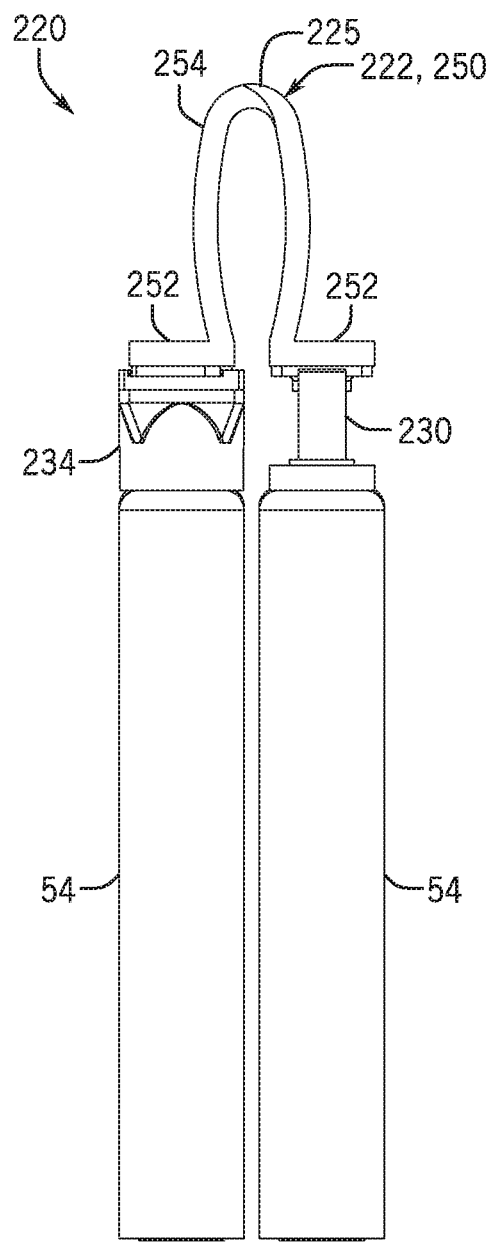
FIG. 35 is a front view of a hair-pin shaped bus bar for use in the bus bar cell interconnect assembly of FIG. 31, in accordance with an embodiment of the present approach.

The bus bar cell interconnects 222 may take on other shapes that promote distribution of forces and motion due to vibrations and other disturbances. FIG. 35 shows one such embodiment, where the bus bar interconnect 222 includes a "hair-pin" shaped bus bar 250. The term "hair-pin" may refer to any shape that includes two flat contact surfaces 252 and a raised, curved portion 254 (e.g., a raised arch) leading from one contact surface 252 to the other. Similar to the loop 224 described above, one of the contact surface 252 of the hair-pin bus bar 250 may be welded to the copper end 238 of the adapter 234 located on the aluminum post, while the opposite contact surface 252 is welded to the terminal 230. Other relatively curved or bent shapes of the bus bar interconnects 222 may be used in other embodiments.

Figure 36:
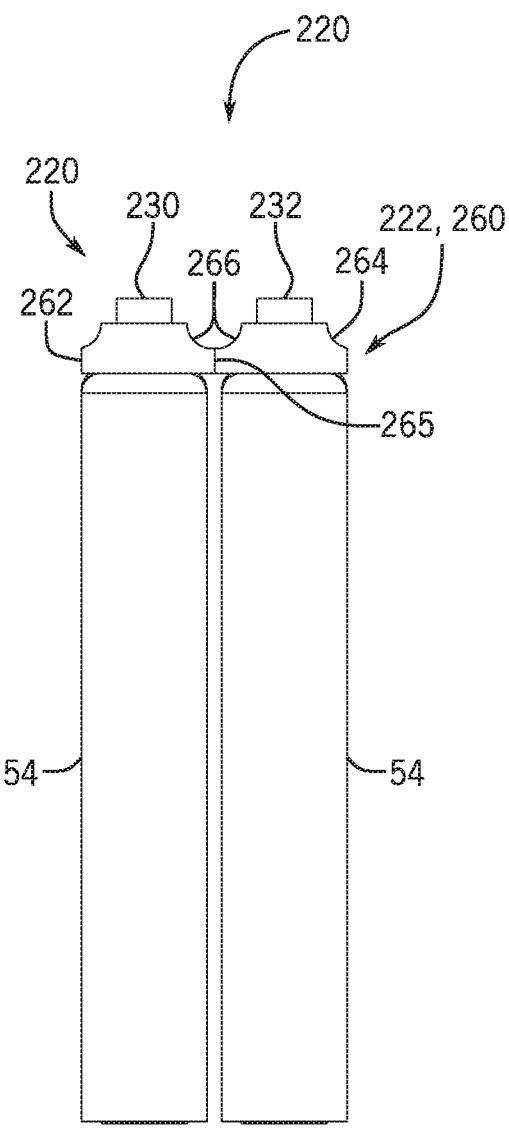
FIG. 36 is a front view of a link bus bar for use in the battery cell interconnect assembly of FIG. 31, in accordance with an embodiment of the present approach.

In some embodiments, the bus bar cell interconnect 222 may be configured to transition between the two materials (e.g., aluminum and copper) without the use of an additional adapter (e.g., adapter 234) or fastener. FIG. 36 illustrates a bus bar link 260 (e.g., bus bar, bus bar cell interconnect, link) that may perform this function. The link 260 is a single piece component made from two different materials. In the illustrated embodiment, for example, the link 260 includes a copper portion 262 for interfacing with the copper terminal 230 and an aluminum portion 264 for interfacing with the aluminum terminal 232. The initial construction of the link 260 may involve finger jointing, as shown by a joint 265, and rolling the copper portion 262 and the aluminum portion 264 together to form the single piece link made from the two separate materials. The link 260 includes two curved portions 266, one configured to slope toward each of the battery terminals 230 and 232. The curved portions 266 provide additional surface area for welding the terminals 230 and 232 to the link 260, as compared to a thinner link that extends straight across both terminals 230 and 232. In certain embodiments, the curved portions 266 may be formed into the link 260 through a flanged stamping process, although other techniques may be used to achieve a similar shape. Overall, the link 260 may provide a more structural connection between the battery terminals 230 and 232 than would be available through the more flexible loop or hair-pin embodiments, without the added height or the additional adapter 234.

Figure 37:
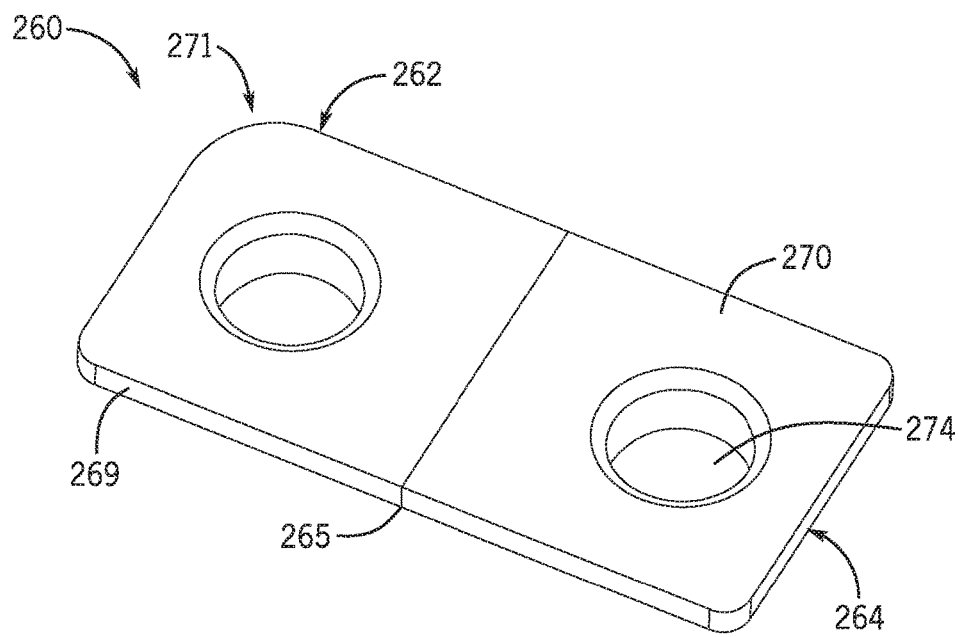
FIG. 37 is a perspective view of an upper portion of a bus bar for use in the battery cell interconnect assembly of FIG. 31, in accordance with an embodiment of the present approach.
Figure 38:
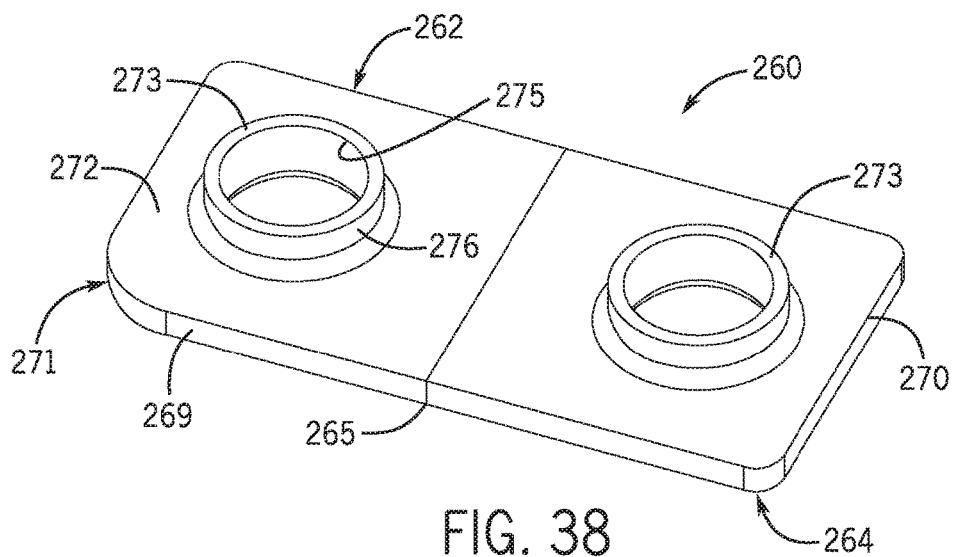
FIG. 38 is a perspective view of a lower portion of a bus bar for use in the battery cell interconnect assembly of FIG. 31, in accordance with an embodiment of the present approach.

In other embodiments, the link 260 may include a different shape or orientation relative to the battery terminals 230 and 232. For example, as shown in FIGS. 37 and 38, the link 260 may include a body portion 270 that is generally rectangular with rounded corners and a constant thickness 269. However, in other embodiments, the body portion 270 may be an oval, a parallelogram, a triangle or the like depending on the configuration of the battery cells 54. In addition, the body portion 270 of the link 260 shown in the illustrated embodiment is asymmetrical. That is, one rounded corner 271 of the rectangular body portion 270 has a greater radius than the remaining rounded corners. The rounded corner 271 serves as an indication of the orientation of the bus bar link 260. For example, this indication may be present on the copper portion 262 and not on the aluminum portion 264, or vice versa. It should be noted that, in other embodiments, other indications such as cut outs, raised portions, keying features, and the like may be utilized. As a result, the copper portion 262 and the aluminum portion 264 may be readily identified during installation. Therefore, during installation the likelihood of installing the bus bar cell interconnects 222 on the incorrect terminals (e.g., the copper portion 262 on the aluminum terminal 232 and the aluminum portion 264 on the copper terminal 230) may be reduced because the correct alignment is readily identifiable.

A lower surface 272 of the link 260, as illustrated in FIG. 38, may include collars 273 (e.g., similar to the curved portions 266 of FIG. 36) surrounding apertures 274 in the body portion 270. The collars 273 extend in a direction substantially perpendicular to a plane of the lower surface 272. In other words, the collars 273 are raised or elongated relative to the lower surface 272. This shape enables the collars 273 to receive and surround the terminals 230 and 232 when installed on the battery cells 54. In some embodiments, the collars 273 are thicker than the body portion 270. As shown, an inner circumference 275 and an outer circumference 276 of the collars 273 are substantially constant along the extended length of the collars 273. In other words, in the illustrated embodiment, the collars 273 are generally cylindrical and not tapered. However, in other embodiments, the collars 273 may be tapered in order to apply a compressive force to the battery terminals 230 and 232 when disposed over the terminals. The collars 273 may be stamped or pressed into the body portion 270 to form the integral link 260. However, in other embodiments, the collars 273 may be press fit into the apertures 274, welded, machined, or otherwise formed along the body portion 270 of the link 260.

As mentioned above, the body portion 270 of the link 260 may include two different materials (e.g., aluminum and copper). The copper portion 262 and the aluminum portion 264 may meet at the joint 265. The joint 265 mechanically and electrically couples the copper portion 262 and the aluminum portion 264. In some embodiments, the body portion 270 may be finger jointed and rolled to establish a mechanical and electrical connection between the copper portion 262 and the aluminum portion 264. More specifically, a plurality of layers of copper and aluminum may be stacked in an alternating sequence at the joint 265. Then, compressive pressure may be applied to the joint 265 to provide a gas tight seal between the alternating layers. In other words, the pressure of the rolling process substantially joins the copper portion 262 to the aluminum portion 264 without the use of an alternative mechanical joining process, such as welding. Moreover, the gas tight seal generated by the rolling process may reduce or eliminate the need for an insulator around the joint 265 to impede galvanic corrosion of the joint 265.

Figure 39:
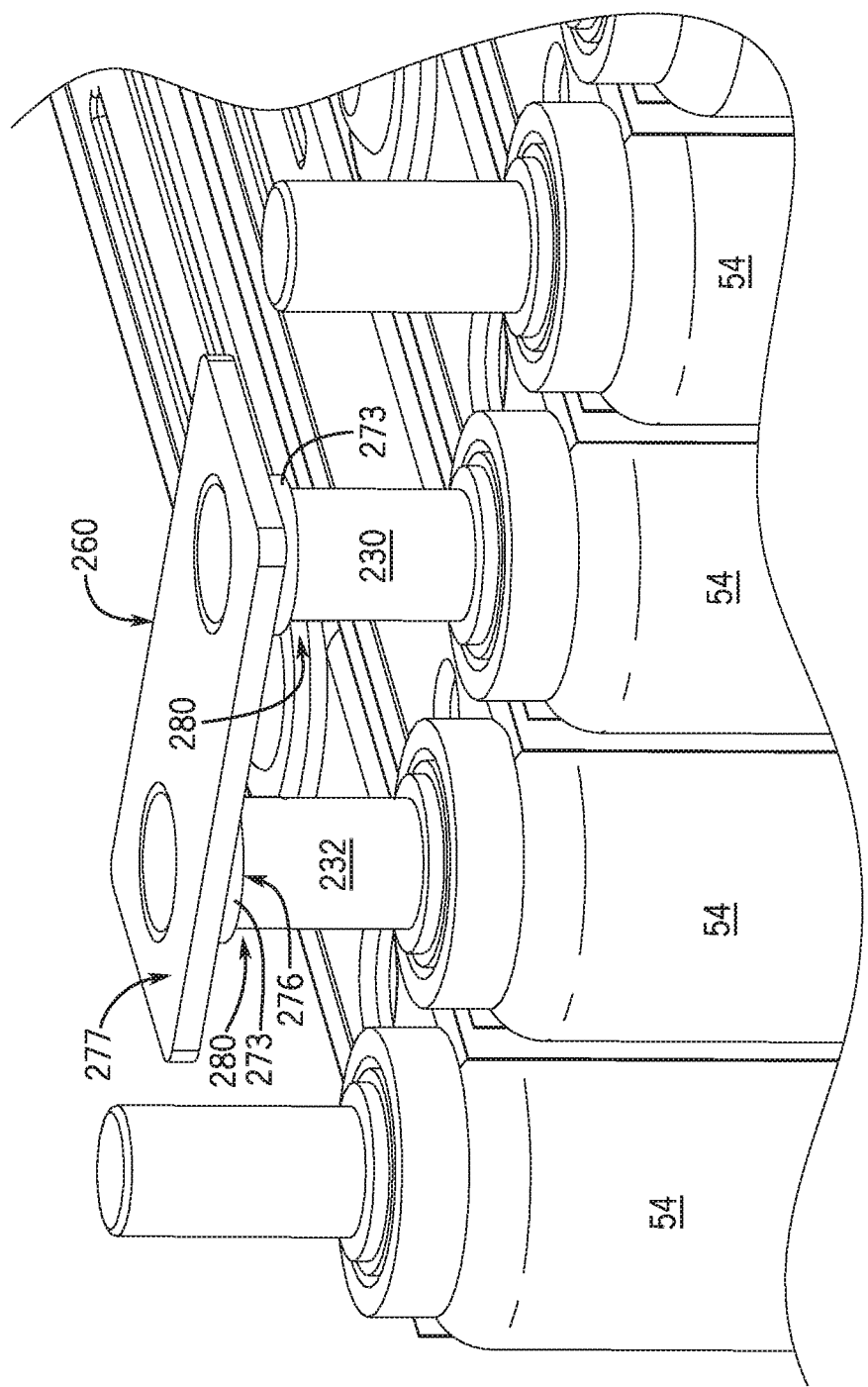
FIG. 39 is a perspective view of the bus bar of FIGS. 37 and 38 electrically coupling battery cells, in accordance with an embodiment of the present approach.

As discussed above, the link 260 may be coupled to adjacent battery cells 54 to electrically couple the battery cells 54. Again, the aluminum portion 264 may be coupled to the aluminum terminal 232 of one cell and the copper portion 262 may be coupled to the aluminum terminal 230 of an adjacent cell. In some embodiments, a weld may form the connection between the link 260 and the terminals 230 and 232. As illustrated in FIG. 39, the weld may be made from a top surface 277 of the body portion 270. Moreover, the welds may be aligned with the collars 273 such that they do not extend beyond the collars 273. That is, the weld area may be contained within the outer circumference 276 of the collar 273 and the weld may be the same width as the outer circumference 276 of the collar 273. Because the collars 273 are thicker than the body portion 270, the weld may penetrate a distance approximately equal to the full thickness 269 of the body portion 270 without burning through the collar 273. In other words, the collars 273 extend away from the body portion 270 in the direction of the weld (i.e., toward the terminals 230 and 232). As a result, a strong weld may be achieved due to the increased weld area between the collars 273 and the terminals 230 and 232. Moreover, the link 260 may reduce lateral forces on the terminals 230 and 232 resulting from swelling or vibration of the battery cells 54. In other embodiments, the weld may only partially penetrate the thickness 269 of the body portion 270 or may be formed entirely on the top surface 277.

A perspective view of the link 260 coupled to the battery terminals 230 and 232 is shown in FIG. 39. As shown, the link 260 is coupled to an upper portion of the terminals 230 and 232. However, as described in detail below, the link 260 (or other type of bus bar interconnect 222) may be supported on the lid assembly 56, which is not shown in FIG. 39. The terminals 230 and 232 may extend through the lid 290 to be coupled with the bus bar interconnects 222 disposed on a lid of the lid assembly 56. As mentioned below, the lid may feature an asymmetrical indentation to support the asymmetrical shape of the bus bar interconnects 222.

Lid Assembly and Method of Manufacture

Figure 40:
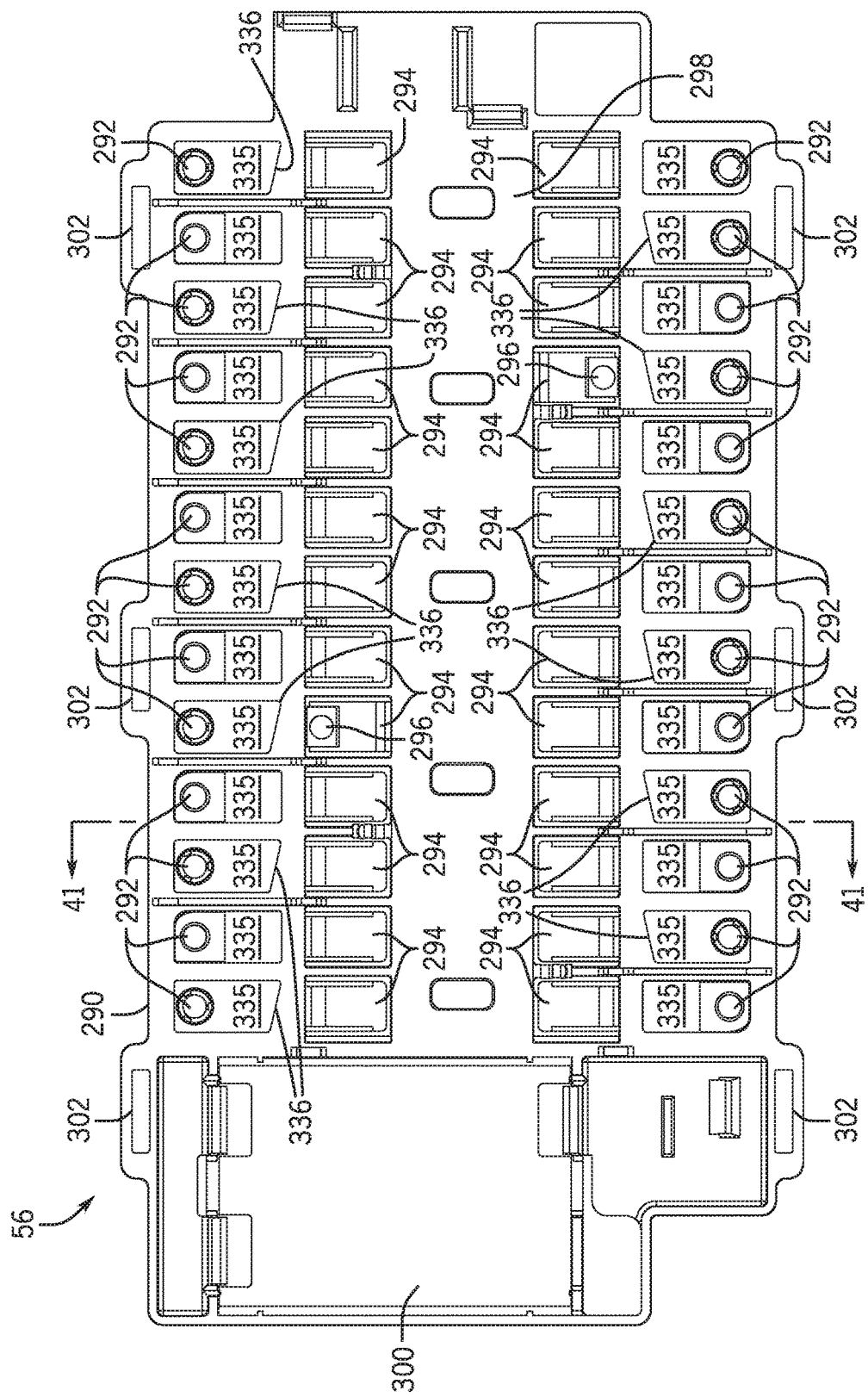
FIG. 40 is a top view of a lid for holding a PCB and temperature sensors of the battery module of FIG. 6, in accordance with an embodiment of the present approach.

The bus bar cell interconnects 222 described at length above may form a portion of the lid assembly 56 introduced above with reference to FIG. 6. In addition to these components, the lid assembly 56 may include any number of desirable components that are mounted to or integral with a lid 290. A top view of one embodiment of the lid 290 is provided in FIG. 40. As illustrated, the lid 290 may be configured to interface with the battery cells 54. For example, the lid 290 may include apertures 292 through which the battery terminals 230 and 232 of the battery cells 54 extend. In addition, the lid 290 may include fingers 294 (e.g., flexible fingers) aligned with the battery cells 54 and used to hold down the battery cells 54, as described in detail below. In the illustrated embodiment, some fingers 294 of the lid 290 are equipped with mounted temperature sensors 296. The lid 290 may also include a built-in vent chamber 298 used to channel vented gases out of the battery module 22, these gases being vented from one or more battery cells 54. The lid 290 may be molded or cutout from plastic, glass-filled polymer, or any other appropriate material.

As mentioned above, the lid 290 may be used for mounting sensors, such as temperature sensors 296 near the battery cells 54. Such temperature sensors 296 may be coupled to the PCB 136 in order to provide relatively accurate temperature monitoring of the battery cells 54. The measurements collected via the temperature sensors 296 may be used in controlling operation of the battery module 22. For example, the battery module 22 may include an active cooling system that may be activated or adjusted in response to a high sensed temperature of the battery cells 54. In other embodiments, the PCB assembly 58 may output an alert to a control system of the vehicle 10 when the battery cells 54 reach an undesirable high temperature. The lid 290 may allow for these temperature sensors 296 (and other sensors) to be disposed in close proximity to the battery cells 54 while still being coupled to the PCB 136. In the illustrated embodiment, the temperature sensors 296 are disposed on two fingers 294 of the lid 290, and these two fingers 294 correspond to different battery cells 54 of the battery module 22. In other embodiments, however, there may be any desirable number of temperature sensors 296 mounted to any number of fingers 294 on the lid 290. It may be desirable, in some embodiments, to mount the temperature sensors 296 on fingers 294 of the lid 290 disposed adjacent particular battery cells 54 that are expected to heat up the most during operation of the battery module 22. However, other arrangements and numbers of temperature sensors 296 (or other sensors) may be possible as well.

It should be noted that in addition to interfacing with the battery cells 54, the lid 290 is also configured to receive and hold components of the PCB assembly 58 thereon. For example, in the illustrated embodiment, the lid 290 includes a cavity 300 for supporting the contactor 154. Other features of the lid 290 may mate with and carry various components of the PCB assembly 58, as discussed at length below. Further, the lid 290 may be equipped with slots 302 for interfacing with the corresponding clips 114 of the lower housing 50.

Figure 41:
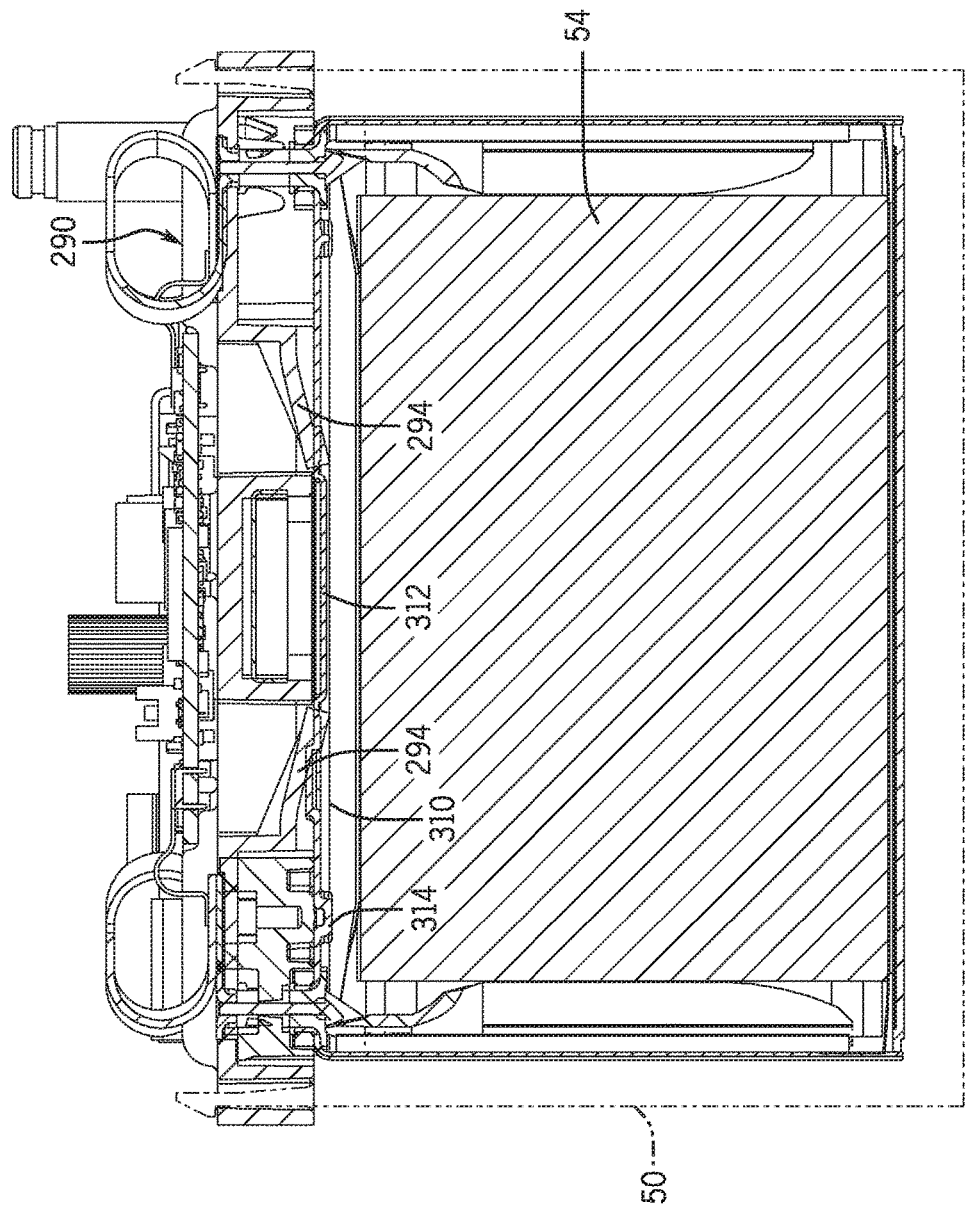
FIG. 41 is a side cutaway view of the lid of FIG. 40 taken along line 41-41 holding down battery cells of the battery module, in accordance with an embodiment of the present approach.

As noted above, the fingers 294 of the lid 290 may be used to hold down the battery cells 54 over which the lid 290 is layered. An example of the fingers 294 performing this function is illustrated in FIG. 41. The battery cells 54, which are stacked relative to each other, may not all be constructed to exactly the same dimensions. For example, in some embodiments, the battery cells 54 may vary slightly in height, such that the lid 290, if it were particularly rigid, would sit upon the battery cells 54 just enough to rest atop the tallest battery cell 54. This could potentially waste space within the battery module 22 and lead to weaker connections between the lid 290 and the battery cells 54. The illustrated lid 290, however, includes the fingers 294, and these fingers 294 extend downward at an angle toward the battery cells 54 (e.g., relative to a top surface of the lid 290). It should be noted that one of ordinary skill in the art would recognize that the top surface (e.g., as described above relative to the angles at which the fingers 294 extend downwardly from the lid 290) may refer to a generally planar reference surface extending over a top of the lid 290 generally level with, e.g., the apertures 292 (e.g., disposed in rows) illustrated in FIGS. 40-43.

Figure 42:
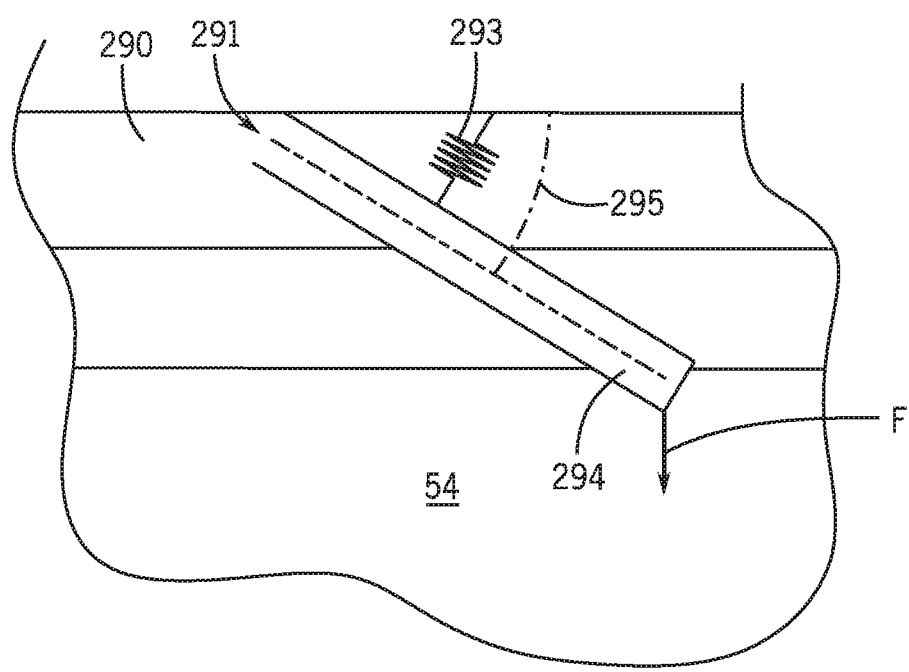
FIG. 42 is a side cutaway view of a portion of the lid in FIG. 41 holding down a battery cell of the battery module, in accordance with an embodiment of the present approach.
Figure 43:
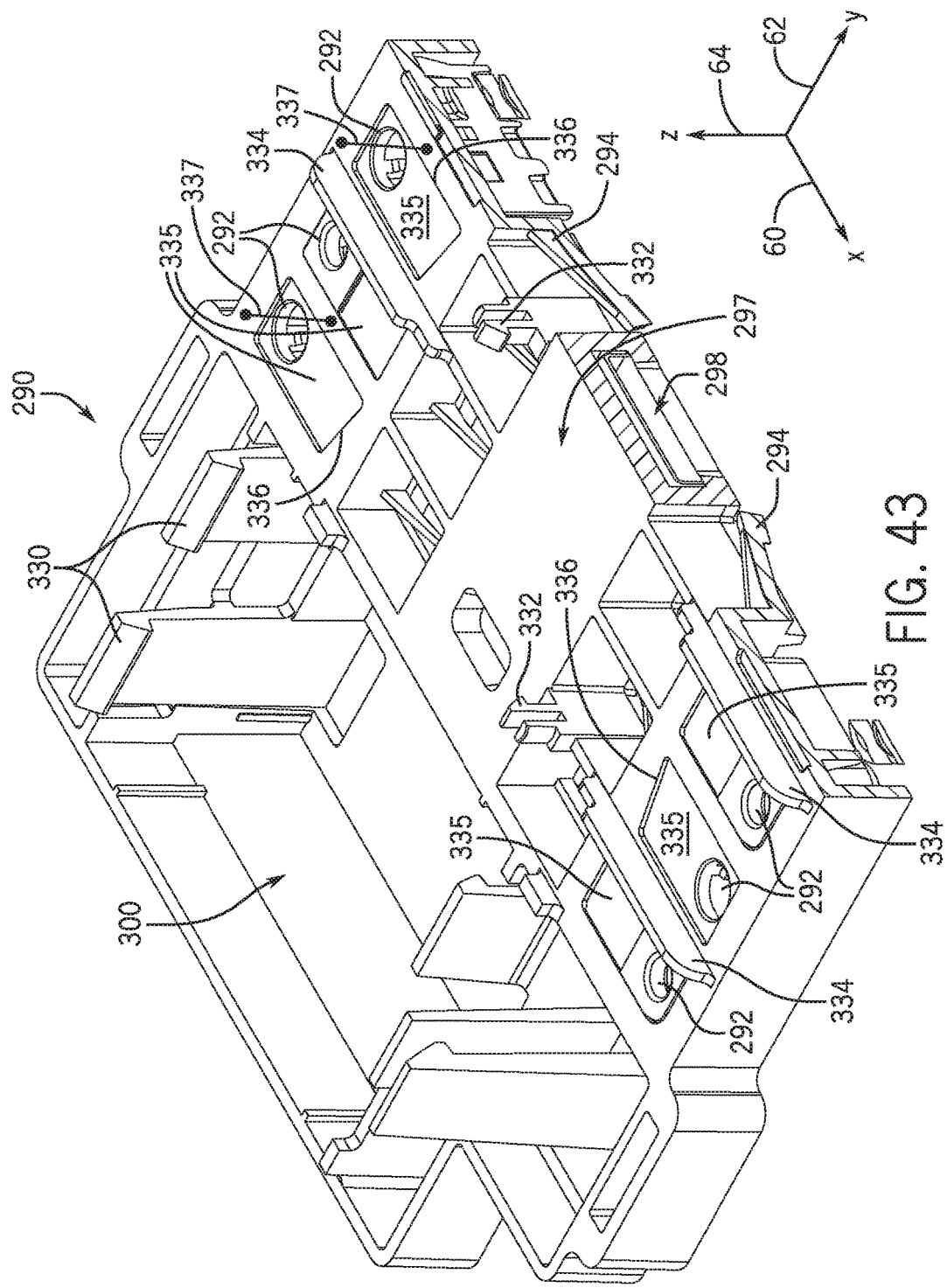
FIG. 43 is a perspective cutaway view of the lid of FIG. 40 taken along line 41-41 with a vent chamber, in accordance with an embodiment of the present approach.

The fingers 294, as shown in FIGS. 41-43, may be portions of the lid 290 that are cut out and/or allowed to flex relative to the rest of the lid structure via a hinge 291 (e.g., living hinge). In other words, each of the fingers 294 may be cantilevered from a connection point within an opening in the lid 290, where said connection point, in some embodiments, may include the hinge 291. The fingers 294 may be angled downward initially and, once placed in contact with the battery cells 54, may exert a slight force (e.g., downward force F) to hold down the battery cells 54 within the lower housing 50. In some embodiments, each finger 294 may be disposed on a respective hinge 291 (e.g., as described above) that includes a respective spring 293, where the respective spring 293 is configured to transfer a spring force through the finger 294 and as a downward force F onto the battery cell 54 corresponding to the finger 294. Specifically, the spring 293 disposed around the hinge 291 may bias the flexible finger 294 at the downward angle in order to apply a compressive force (e.g., downward force F) to the corresponding battery cell 54 when the finger 294 is brought into contact with the battery cell 54. In other embodiments, the hinge 291 itself may transfer a force through the finger 294 onto the corresponding battery cell 54. The fingers 294 may accommodate variances in height of the assembled battery cells 54, such that all of the battery cells 54 may be held in place between the lid 290 and the lower housing 50, regardless of the heights of the battery cells 54.

Additionally, the height of each battery cell 54 may determine the angle its respective finger 294 extends downwardly when the lid 290 is disposed over the battery cells 54. For example, downward angles 295 of the fingers 294 extending from the upper surface of the lid 290 may decrease as the lid 290 is lowered onto the battery cells 54 to hold the battery cells 54 in place. Specifically, the fingers 294 elastically deform by bending along the hinge 291, as discussed above, thereby decreasing the angle 295. The downward angle 295 of one of the fingers 294 may decrease more when placed against a taller battery cell 54 than it would when placed over a shorter battery cell 54. Accordingly, the angles 295 of some of the fingers 294 may decrease by a different amount than some of the other fingers 294, in order to accommodate the height of the battery cells 54.

In addition, the height of each battery cell 54 may determine the downward force its respective finger 294 exerts on the battery cell 54. For example, each of the fingers 294 exert some amount of downward force F onto the battery cells 54 to hold the battery cells 54 in place. Specifically, the hinge 291, or a spring 293 associated with the hinge 291, may transfer a force from the finger 294 to its corresponding battery cell 54. The downward force F may be greater when applied to a taller battery cell 54 as opposed to a shorter battery cell 54, since a taller battery cell 54 bends the finger 294 and/or compresses the spring 293 by a greater amount. Accordingly, the downward force F may be different for different fingers 294 of the lid 290, in order to accommodate the height of the battery cells 54.

There may be several different possible arrangements of the fingers 294 on different embodiments of the lid 290. In the illustrated embodiment, the fingers 294 are placed symmetrically on either side of the corresponding battery cells 54. The pads of the fingers 294 may rest on positions of an upper surface 310 of the battery cell 54 located between the respective battery terminals 230 and 232 and a centrally located vent 312 of the battery cell 54. More specifically, in the illustrated embodiment, the fingers 294 are configured to contact the upper surface 310 of the battery cell 54 between a fill hole 314 of the battery cell 54 and the vent 312. It should be noted that, in other embodiments, the fingers 294 may be disposed in different positions and orientations relative to the upper surface 310 of the battery cells 54.

Besides interacting with the battery cells 54, the lid 290 may be configured to receive and hold other components (e.g., PCB components) throughout operation of the battery module 22. In some embodiments, the lid 290 may be pre-loaded with these components prior to a final layering of the different assemblies of the battery module 22. FIG. 30 shows certain parts of the lid 290 that may facilitate such pre-loading and other connections to the PCB assembly 58. As mentioned above, the lid 290 may include the cavity 300 for receiving and holding the contactor 154. In addition to the cavity 300, the lid 290 may include clips 330 for securing a top end of the contactor 154 placed within the cavity 300. In addition, the illustrated lid 290 includes extensions 332 designed to fit through corresponding openings within the PCB 136 for mating the PCB 136 with the lid 290.

The lid 290 may further include features for interacting with the bus bar interconnects 222. For example, in the illustrated embodiment, the lid 290 includes walls 334 built between every other pair of apertures 292 formed in the lid 290. In other words, a pattern may be achieved of two apertures 292, one wall 334, two apertures 292, one wall 334, etc. These walls 334 may thus be positioned, when the lid assembly 56 is fully assembled, between subsequent bus bar interconnects 222 connecting the battery cells 54. Thus, the walls 334 may prevent or reduce a likelihood of internal shorts between the bus bar interconnects 222 within the battery module 22. For example, the walls 334 may prevent loose material from causing a short during assembly.

Figure 25:
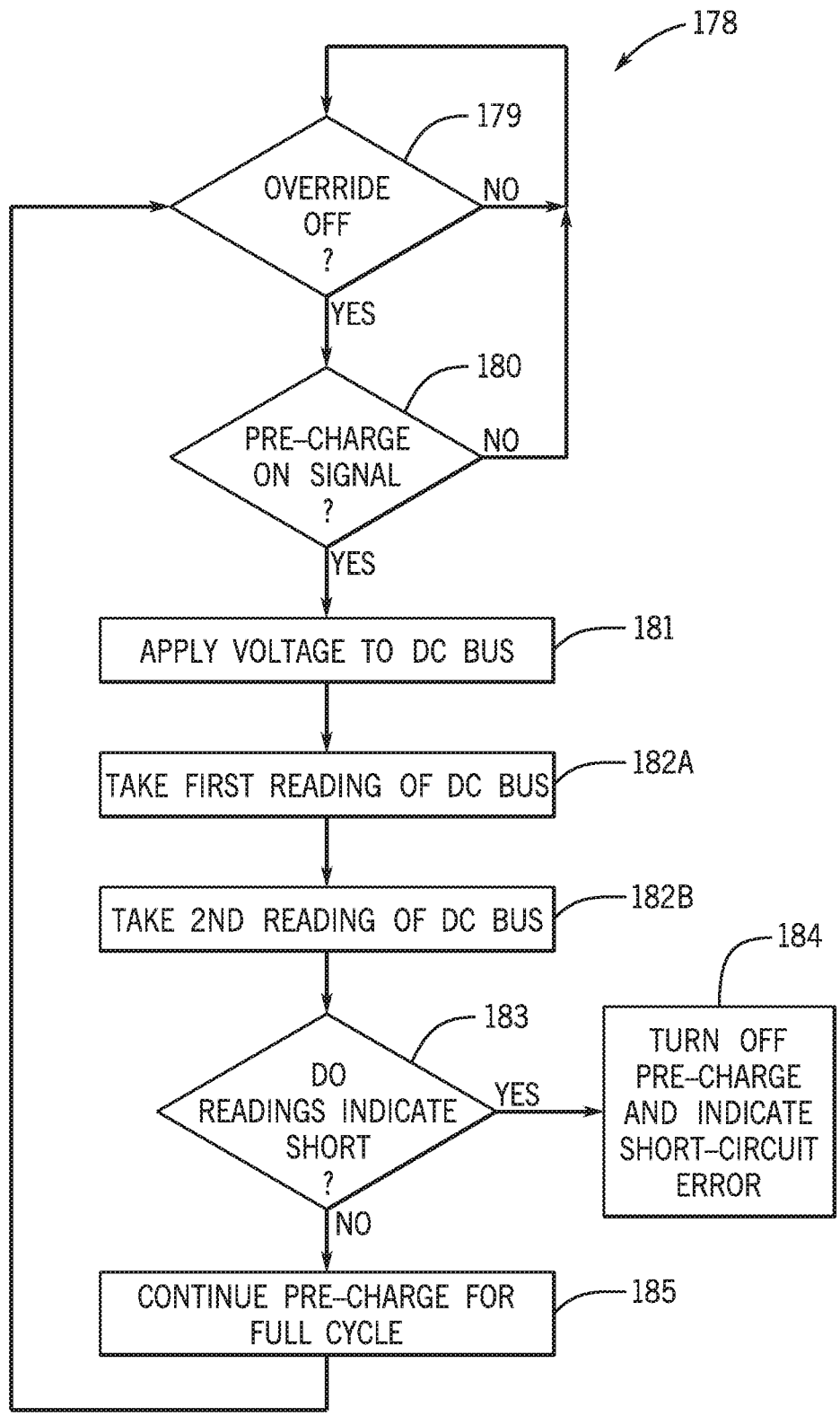
FIG. 25 is a process flow diagram of the method of pre-charging the bus bars of FIG. 20, in accordance with an embodiment of the present approach.
Figure 26:
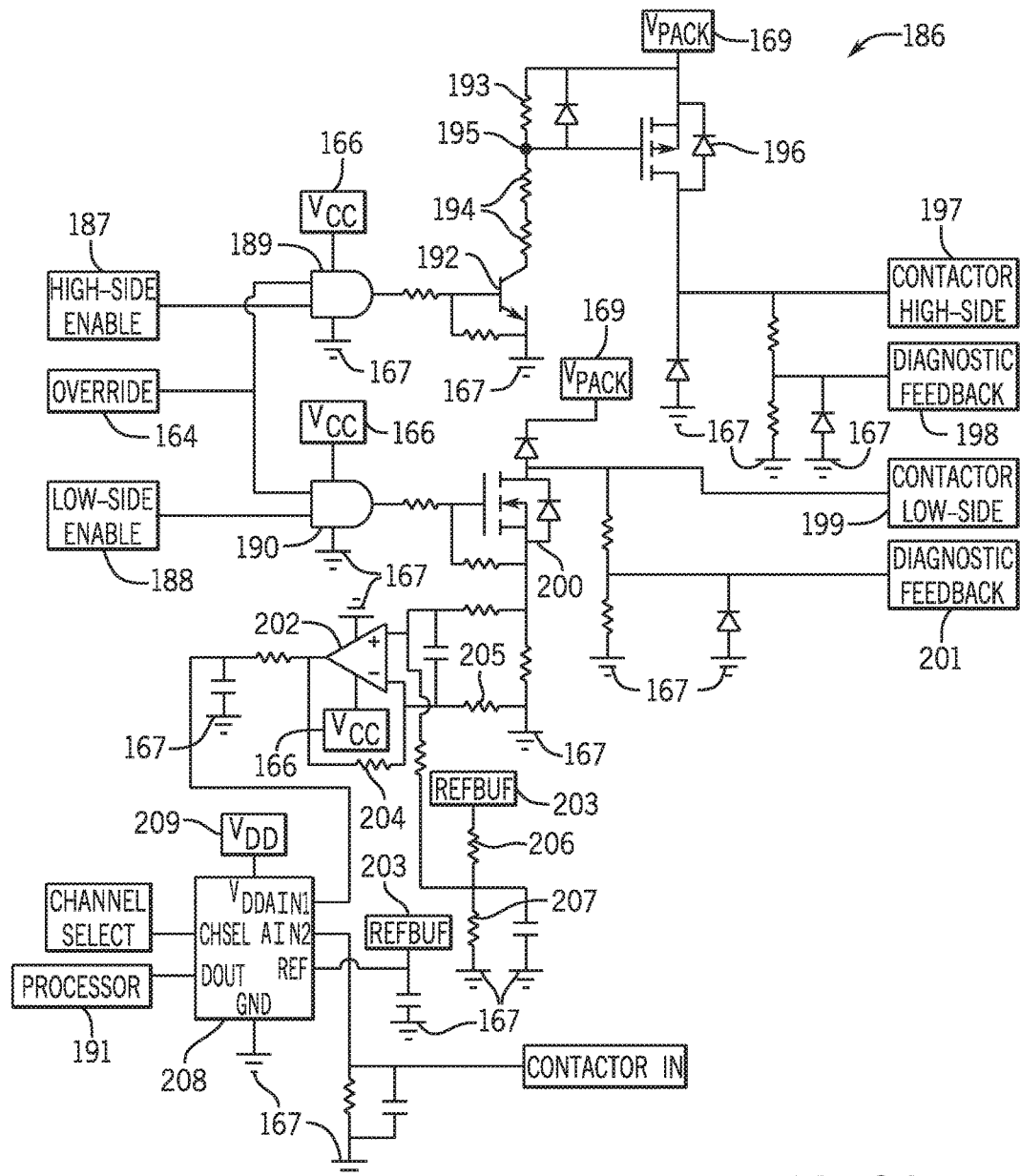
FIG. 26 is a diagrammatical representation of a contactor relay control circuit that may be implemented via hardware on the PCB of FIG. 12, in accordance with an embodiment of the present approach.
Figure 27:
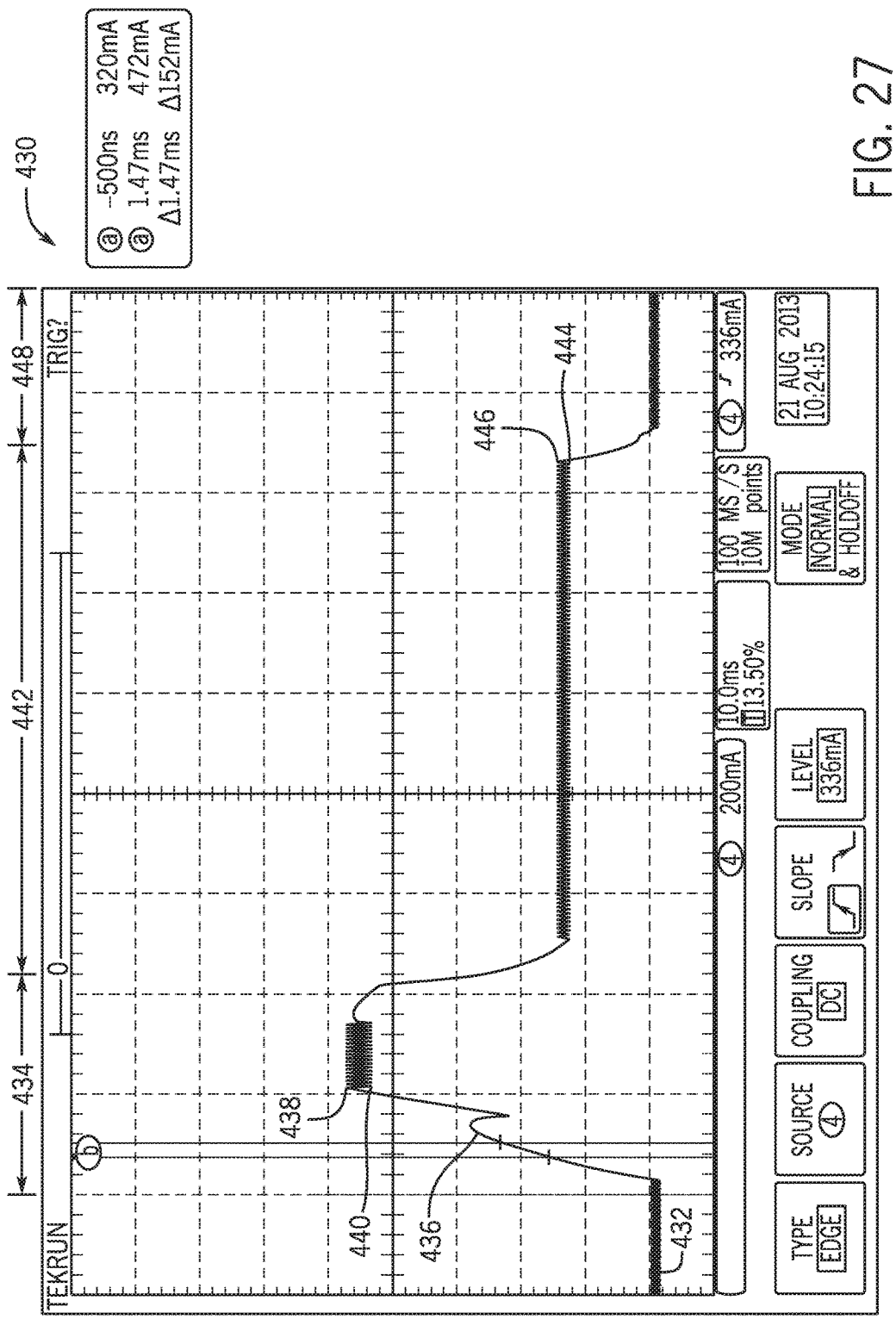
FIG. 27 is a plot illustrating a current level measured as a function of time in the contactor relay control circuit of FIG. 26, in accordance with an embodiment of the present approach.
Figure 28:
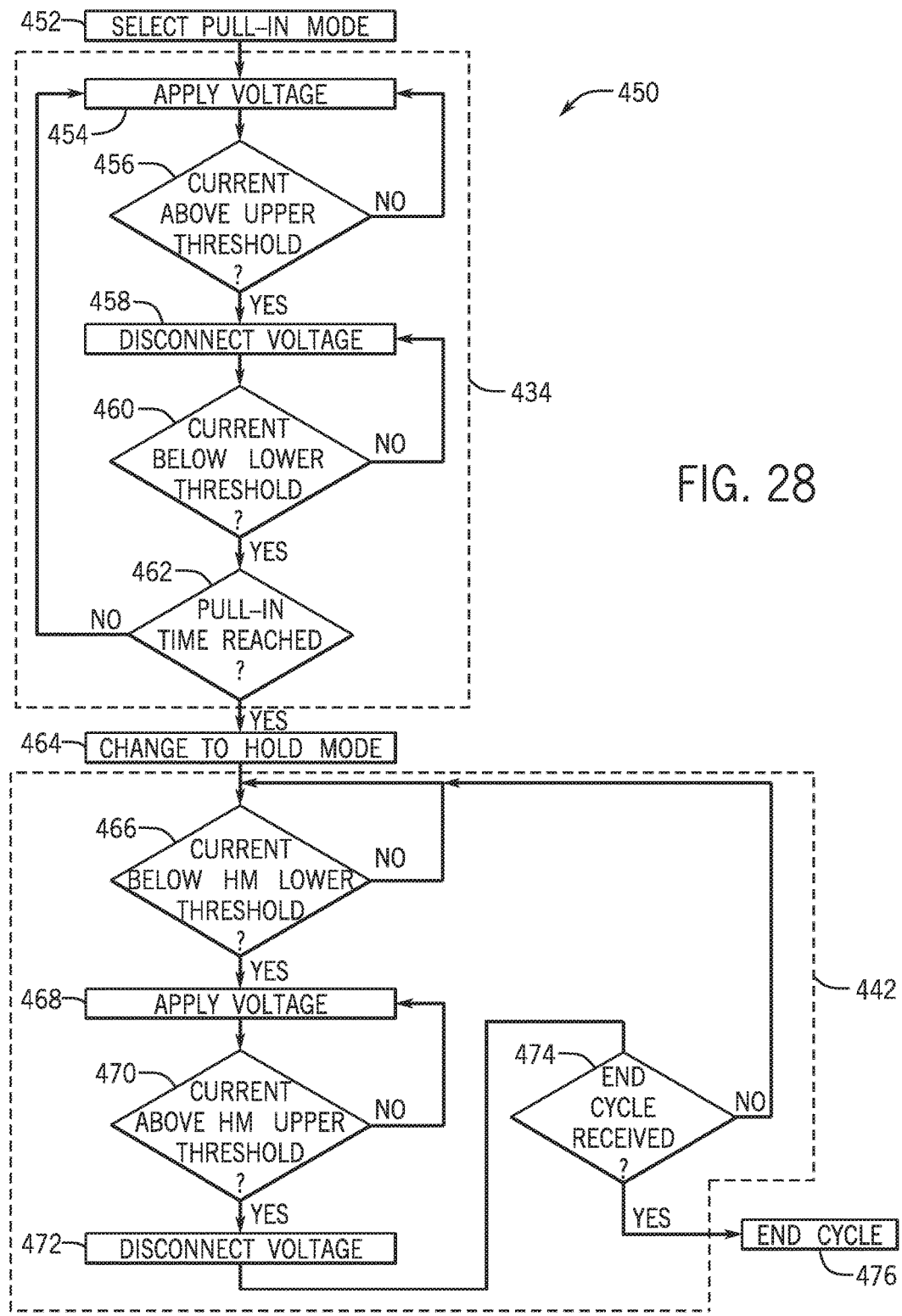
FIG. 28 is a process flow diagram of a method of controlling a contactor relay, in accordance with an embodiment of the present approach.

Further, as illustrated in FIGS. 28 and 30, each aperture 292 may be surrounded by an indentation 335. The indentations 335 may be included to accommodate the bus bar interconnects 222 and facilitate efficient and accurate assembly and inspection of the lid 290. For example, the loops 224 (e.g., as shown in FIG. 25) may include the plate contact end 240 and the terminal mating end 242. The ends 240, 242 of the loops 224 may each fit into one of the indentations 335 surrounding the apertures 292. Further, in the embodiment shown in FIG. 28, every other indentation 335 includes an angled edge 336. The indentation 335 with the angled edge 336 may be configured to receive the terminal mating end 242 of the loop 224, and the indentation 335 without the angled edge 336 may be configured to receive the plate contact end 240 of the loop 224. In this way, embodiments where some (e.g., half) of the terminals 232 are aluminum or some other non-copper metal, the aluminum terminals 232 may extend through the apertures 292 with surrounding indentations 335 that do not have the angled edge 336, and corresponding adapters 234 may be placed over each aluminum terminal 232 extending through the aperture 292 without the angled edge 336 indentation 335. The plate contact end 240 of the loop 224 may contact the copper end 238 of the adapter 234. This may assist in ensuring that adapters 234 are placed over the proper terminals 232. In other words, the indentations 335 may serve to accommodate the bus bar interconnects 222, to accommodate the adapters 234, and to offer a visual cue for assembly and inspection of the lid 290. In other embodiments (e.g., embodiments including a straight bus bar interconnect 222), one indentation 335 may span over two apertures 292 (e.g., two apertures 292 between a pair of two walls 334), and the straight bus bar interconnect 222 may fit into the single indentation 335. In other words, the indentations 335 may be oriented perpendicular to the orientation shown in FIG. 28, or in some other orientation, such that the indentations 335 accommodate the specific geometry and/or orientation of the bus bar interconnects 222 associated with the embodiment.

In other embodiments (e.g., as illustrated in FIG. 30), the lid 290 may also be equipped with posts or walls (e.g., mounting features 337) upon which the bus bar interconnects 222 (e.g., loops 224) may be pre-loaded during assembly. These features 337 could extend outward from positions between the illustrated walls 334 or apertures 292. For example, the lid 290 may include the walls 334 for preventing internal shorts disposed adjacent to and between posts (e.g., mounting features 337) configured to hold the bus bar interconnects 222 (e.g., loops 224) in a particular position relative to the lid 290. This may result, for example, in a pattern of one aperture 292, one mounting feature 337, one aperture 292, one wall 334, one aperture 292, one mounting feature 337, one aperture 292, one wall 334, and so on and so forth. The loops 224 may include openings (e.g., engagement feature 225) disposed at an upper portion for being coupled to a post (e.g., mounting feature 337) extending from the lid 290, as discussed above with reference to FIG. 25.

In other embodiments, the bus bar interconnects 222 may include the hair-pin design 250, and the lid 290 may be equipped with walls extending upward for the hair-pins 250 to be draped over. In some embodiments, any such features of the lid 290 may facilitate mounting of the desired bus bar interconnects 222 in a specific orientation relative to their position within the battery module 22. For example, the features may be oriented in a first direction on one side of the battery module 22 and oriented in a second direction on the opposite side of the battery module 22. Other arrangements and features may be included in the lid 290 in addition to or in lieu of those described above. Additionally, the walls 334 and/or the extensions 332 may be integral (e.g., integrated) with the lid 290. Further, the lid 290, the walls 334, the extensions 332, the fingers 294, the hinges/springs associated with each finger 294, or any of the features of the lid 290 referenced above, or any combination thereof, may be injection molded as a single structure. In another embodiment, some components of the lid 290 (e.g., the bus bar interconnects 222) may be welded to the lid 290 (e.g., via laser welding).

System and Method for Venting Pressurized Gas from a Battery Module

Figure 44:
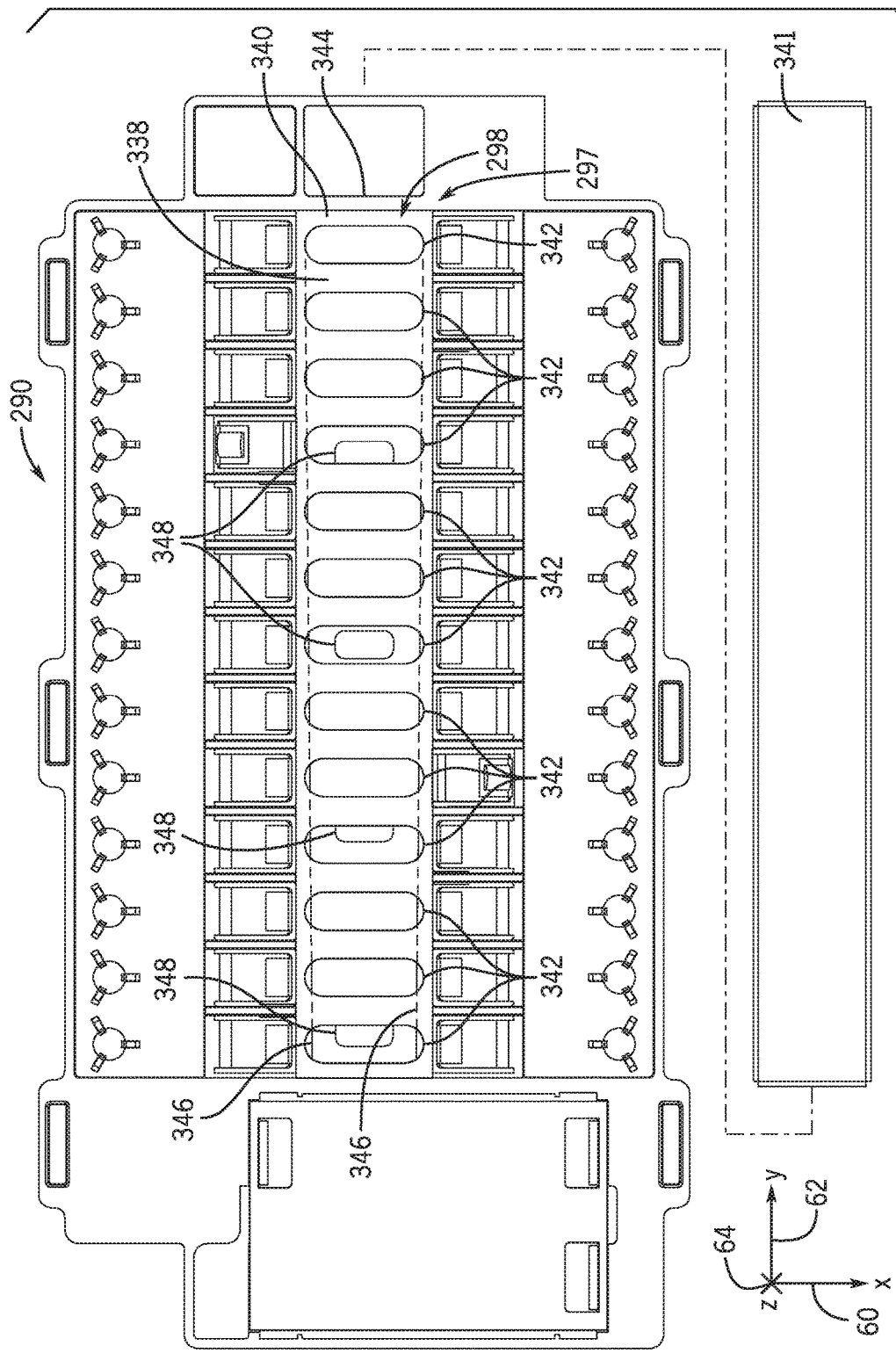
FIG. 44 is a bottom view of the lid of FIG. 40 with a vent chamber, in accordance with an embodiment of the present approach.

As shown in FIG. 43, the lid 290 may include a venting assembly 297. In some embodiments, the venting assembly 297 includes a vent chamber 298 built into the lid 290. For example, the vent chamber 298 may be a hollowed out portion of the lid 290. FIG. 44 illustrates an embodiment of the vent chamber 298 that is located along a backbone section 340 of the lid 290. The lid 290 may include a vent chamber cover 338. To that end, the vent chamber cover 338 may be disposed on the bottom of the lid 290. The vent chamber cover 338 may include slots 342 configured to direct the gases vented from the battery cells 54 into the vent chamber 298. Moreover, in some embodiments, the slots 342 are aligned with vents in the battery cells 54. The vent chamber 298 acts as a conduit or manifold for carrying vented gases from the battery cells 54 out of the battery module 22. Since the vent chamber 298 is part of the lid 290, the vent chamber 298 may permit the placement of the PCB assembly 58 just over the battery cells 54 and the lid 290. Thus, the vent chamber 298 may be disposed between the battery cells 54 and the PCB assembly 58. If one of the battery cells 54 encounters issues (e.g., overheating) that lead to a pressure build-up within the battery cell 54, the battery cell 54 may release the high pressure gases from a housing of the battery cell 54 through the vent 312. The gases released from the battery cell 54 may be vented out of the battery module 22 via the vent chamber 298, without flowing into and disrupting operation of the temperature-sensitive equipment on the PCB 136 located just above the lid 290.

Figure 45:
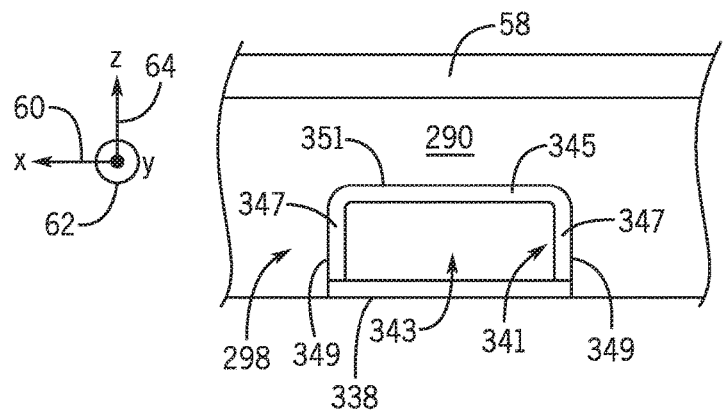
FIG. 45 is a side cutaway view of the lid of FIG. 40 with a vent chamber, in accordance with an embodiment of the present approach.

As shown in the illustrated embodiment, the vent chamber 298 may be configured to hold a vent guide 341 made from a relatively stronger material (e.g., steel) than the lid 290. FIG. 45 is a cutaway view of the vent guide 341 disposed in the vent chamber 298. As illustrated, the vent guide 341 may be open along a bottom portion 343 to receive the vented gases from the battery cells 54 and closed along a top portion 345 to keep the gases from entering the PCB assembly 58 where they could potentially disrupt operation of the sensitive equipment thereon. To that end, the vent guide 341 may be substantially U-shaped (e.g., having a substantially U-shaped cross section formed by the top portion 345 and two sidewalls 347 extending therefrom) in order to cover sidewalls 349 and a top portion 351 of the vent chamber 298. In some embodiments, the sidewalls 347 of the vent guide 341 may extend past the sidewalls 349 of the vent chamber 298. Moreover, in some embodiments, the vent guide 341 may not cover the entire vent chamber 298.

Because the vent guide 341 is disposed between the battery cells 54 and the lid 290, the vent guide 341 may shield the vent chamber 298 from direct contact with the vented gases. Moreover, in embodiments where the vent guide 341 is made of metal, the vent guide 341 may absorb the heat of the vented gases to inhibit heating of the PCB assembly 58 disposed over the lid 290. For example, the vent guide 341 may include a U-shaped steel plate, in some embodiments. As illustrated in FIG. 44, the vent guide 341 may be a separate insert configured to slide into the vent chamber 298 of the lid 290. However, in other embodiments, the vent guide 341 may be integral with the lid 290. For example, in some embodiments, the vent guide 341 may be overmolded into the lid 290. As a result, the vent guide 341 may be permanently disposed within the vent chamber 298.

In the illustrated embodiment, vent chamber cover 338 of the lid 290 includes thirteen slots 342, one slot 342 corresponding to the vents 312 on each of the battery cells. The slots 342 may facilitate a flow of heated and pressurized gases from the vented battery cells 54 into the vent guide 341 within the vent chamber 298. The slots 342 may allow for vented gases to enter the vent guide 341 while functioning as a structural support of the lid 290, thus enabling the lid 290 to support the weight of itself and other components (e.g., PCB assembly 58) of the battery module 22. It should be noted that the vent chamber 298 may function as a stiffener for the lid 290, enabling the lid 290 to more effectively hold down the battery cells 54 located below the lid 290. The vent chamber 298 may help to maintain structural integrity of the lid 290, even against pressures exerted from the battery cells 54 during a burst event. The vent guide 341 may provide further support when installed.

In certain embodiments, the bottom surface of the vent chamber 298 may be entirely open. For example, in embodiments where the stronger vent guide 341 is integral with the lid 290 (e.g., overmolded into the lid 290), the slots 342 may be enlarged or eliminated altogether and the open surface of the vent guide 341 used to capture the gases venting from the battery cells 54. For example, the vent chamber 298 may be a hollowed out portion of the lid 290. Moreover, the hollowed out portion may include a single opening (e.g., a single opening in the center, an opening extending the length of the vent chamber 298, etc.) configured to receive vented gases from all of the plurality of battery cells. The slots 342 may be any desirable shape and size that facilitates adequate venting of the battery cells 54 through the vent chamber 298 while providing a desired amount of structural support for the lid 290.

As illustrated, the vent chamber 298 may be generally tapered or wedge shaped. More specifically, one end of the vent chamber 298 may include an opening 344 through which the vented gases may exit the vent chamber 298 and/or the battery module 22. The vent chamber 298 may have its largest cross sectional area at this end and gradually taper down to a smaller cross sectional area at the opposite end of the vent chamber 298. More specifically, the vent chamber 298 may comprise a first end disposed above one of the prismatic battery cells 54 proximate an opening or portal 344 (FIG. 46) and a second end disposed above another of the prismatic battery cells 54 that is farthest from the opening 344. The vent chamber 298 may be tapered such that a width of the vent chamber 298 is larger at the first end than a width of the vent chamber 298 at the second end. The walls of the vent chamber 298 may taper along one or both of directions aligned with the X axis 60 and the Z axis 64. The vent guide 341 may be similarly tapered. Tapered inner walls 346 of the vent chamber 298 are visible in the illustrated embodiment. The tapered inner walls 346 may facilitate the access and removal of an installation tool used to insert the vent guide 341 into the vent chamber 298. In addition, holes 348 intermittently located along the top of the lid 290 may help the installation tool to remain aligned throughout the installation process. In other embodiments, the vent chamber 298 may have a uniform cross section along its length or any other desirable shape for facilitating installation of the vent guide 341.

Figure 46:
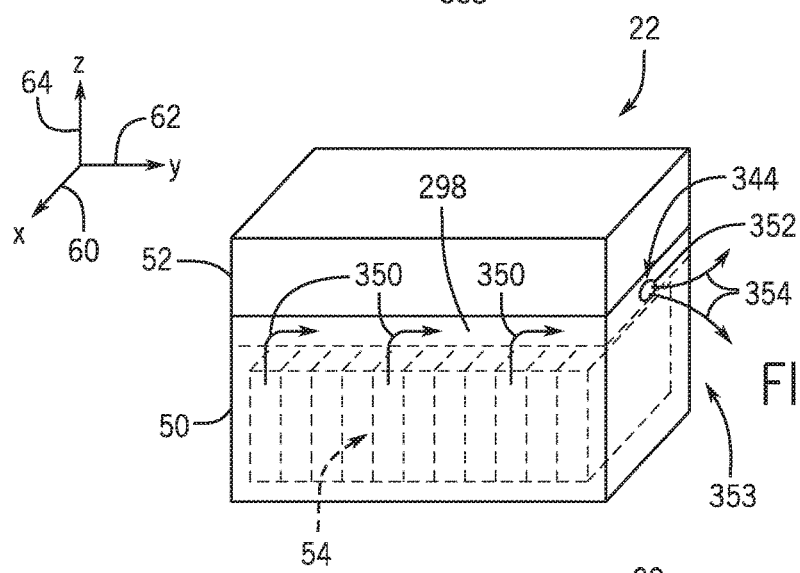
FIG. 46 is a schematic perspective view of the battery module of FIG. 5 having a vent discharge aperture in a side wall of the battery module, in accordance with an embodiment of the present approach.
Figure 47:
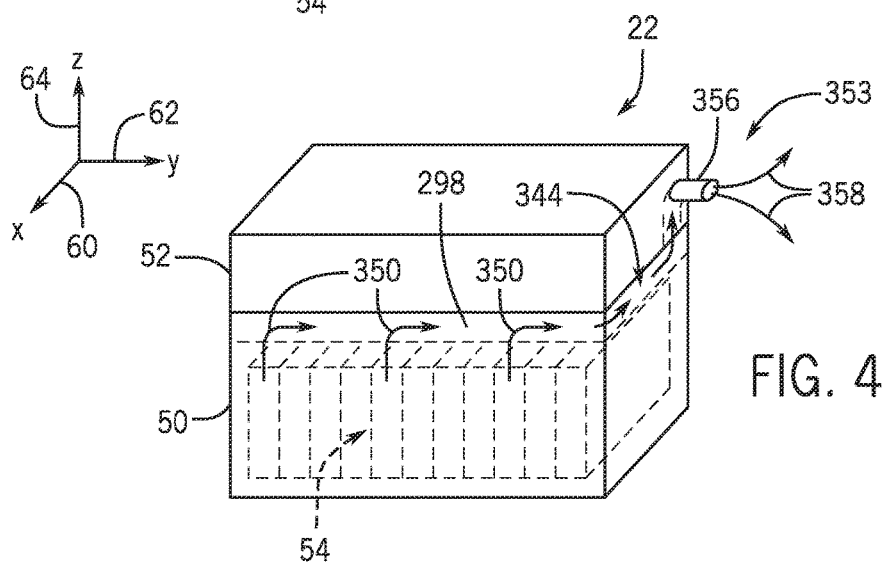
FIG. 47 is a schematic perspective view of the battery module of FIG. 5 having a vent discharge chimney extending out of the battery module, in accordance with an embodiment of the present approach.

Once the gases released from the vent 312 of the battery cells 54 are pushed into the vent chamber 298, the vent chamber 298 and/or the vent guide 341 may act as a conduit to guide the pressurized gases away from sensitive components of the battery module 22 and out of the battery module 22. FIGS. 46 and 47 diagrammatically represent two possible embodiments of the battery module 22 that utilize the vent chamber 298 to direct such gases out of the battery module 22. Specifically, pressurized gases may exit one or more battery cells 54 via the vents 312 located at the top of the battery cells 54 and into the vent chamber 298. The gases may flow through the vent chamber 298 (or the vent guide 341 held within the vent chamber 298) toward the opening 344 of the vent chamber 298. This flow of gas is illustrated in both embodiments via arrows 350.

In FIG. 46, the opening 344 of the vent chamber 298 opens into a flow path leading to an aperture 352 formed within the outside enclosure of the battery module 22. In the illustrated embodiment, the aperture 352 is formed within the lower housing 50 of the battery module 22 and is in substantially the same plane as the vent chamber 298. However, in other embodiments, the aperture 352 may be disposed in the cover 52 of the battery module 22. The vented gases may exit the battery module 22 through the aperture 352 via a venting system 353, as illustrated by arrows 354. The venting system 353 may include the vent chamber 298, the vent guide 341, and the aperture 352. In some embodiments, the enclosure may include numerous such apertures 352 (or other types of openings within the lower housing 50 and/or the cover 52) for removing the pressurized gases to the atmosphere. Moreover, the aperture 352 may include a fitting and/or connector (e.g., threaded, barbed, etc.) to couple the aperture 352 to a conduit for directing the vented gases to another location. For example, the aperture 352 may have female threads that mate with male threads of a hose.

FIG. 47 illustrates an embodiment of the battery module 22 having a chimney 356 built into the outer enclosure for releasing gas from the vent chamber 298 into the atmosphere. Upon exiting the opening 344 at the end of the vent chamber 298, the vented gases may be routed toward the chimney 356 and may exit through the chimney 356, via the venting system 353, as shown by arrows 358. In some embodiments, the venting system 353 may also include the chimney 356. In the illustrated embodiment, the chimney 356 is built into the cover 52 of the battery module 22, however, in other embodiments, the chimney 356 may form part of the lower housing 50. In still other embodiments, the battery module 22 may include multiple such chimneys 356 formed within the lower housing 50 and/or the cover 52 for releasing the vented gases from the battery module 22. Additionally, as mentioned above, the chimney 356 may also include fittings and/or connectors to mate with additional components of the vehicle.

It should be noted that any desirable combination of apertures 352 and chimneys 356 may be used in combination to vent the gases from the vent chamber 298 to an outside atmosphere. However, other types of openings or fixtures may be built into the lower housing 50 or the cover 52 to release the gases. In addition, the aperture 352 and/or the chimney 356 of the above mentioned embodiments may be designed to mate with a hose or other component of the vehicle. Such a hose may further direct the vented gases away from sensitive components located within the vehicle.

Figure 48:
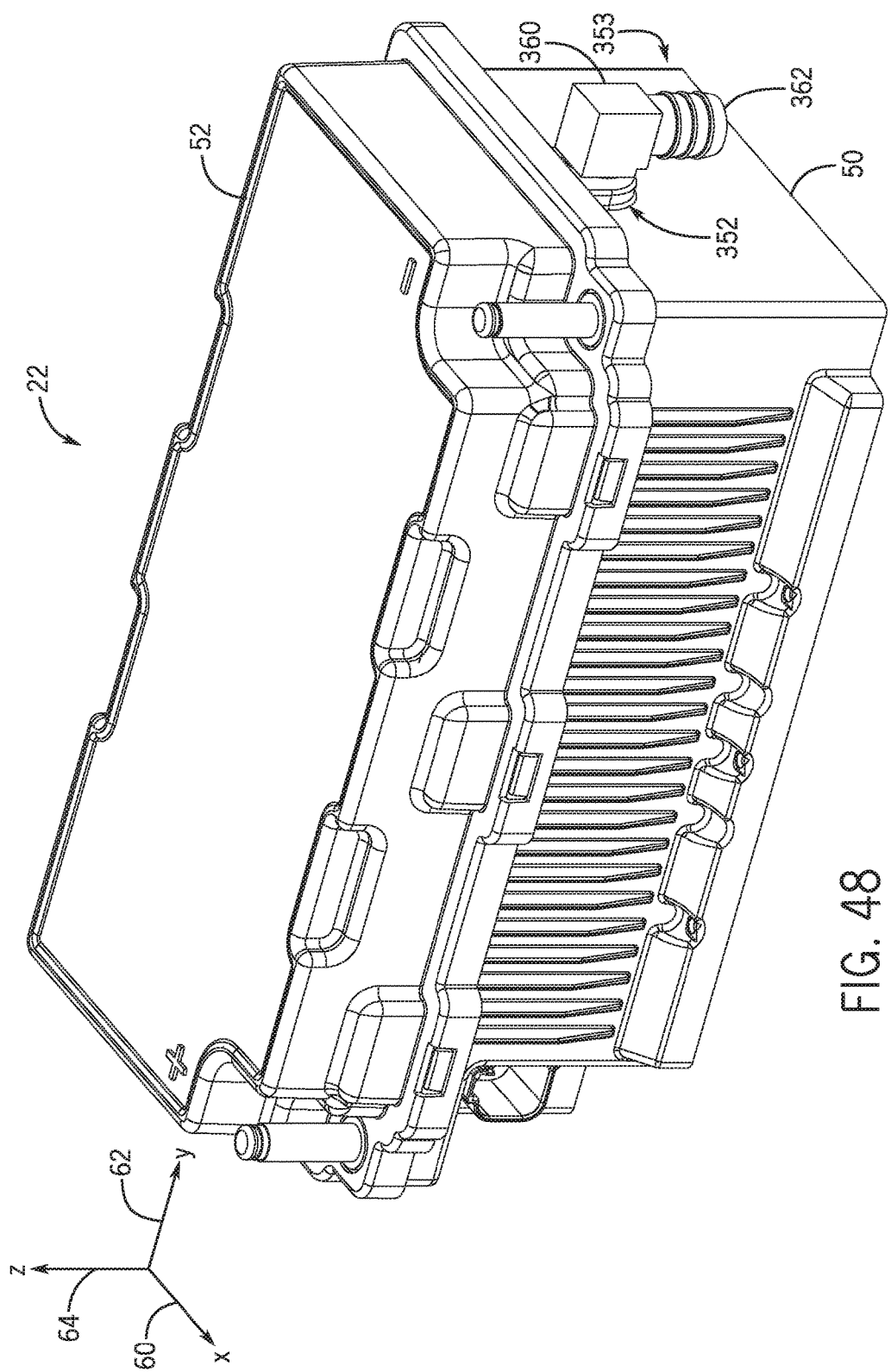
FIG. 48 is a perspective view of the battery module of FIG. 5 having a fitting extending out of the battery module, in accordance with an embodiment of the present approach.

As described above, the apertures 352 and/or the chimney 356 may mate with additional hoses or components of the vehicle. FIG. 48 represents an embodiment of a fitting 360 coupled to the aperture 352 of the venting system 353. The fitting 360 may be screwed into the aperture 352 in the lower housing 50. However, in other embodiments, the fitting 360 may be connected in other ways. For example, the fitting 360 and aperture 352 may have quick connect fittings or the fitting 360 may be bolted to the lower housing 50. In still other embodiments, the fitting 360 may be coupled to the cover 52 instead of the lower housing 50, depending on the location of the aperture 352 or chimney 356. The fitting 360 may have an outlet 362 that mates with a hose or other vehicle component. As mentioned above, the outlet 362 may be threaded, barbed, or may include any other type of fitting or connector that allows components to couple to one another. The fitting 360 may allow for relatively simple removal of the battery module 22 from the vehicle components (e.g., hoses), or vice versa. Moreover, the fitting 360 may be oriented in a variety of directions (e.g., pointing downward, pointing upward, pointing to the side, etc.) to enable several options when routing the vented gases away from the battery module 22 via a hose.

Layered Battery Module System and Method of Manufacture

To reduce the complexity of assembling the battery module 22, the components of the battery module 22, described in detail above, may be arranged such that the battery module 22 is layered. As illustrated in the exploded view of FIG. 49, the components of the battery module 22 may be layered on top of one another to assemble the battery module 22. In addition to easing the assembly of the battery module 22, layering the components of the battery module 22 in the illustrated manner may result in a more space-efficient design of the battery module 22 than would be available through conventional battery module arrangements.

Figure 49:
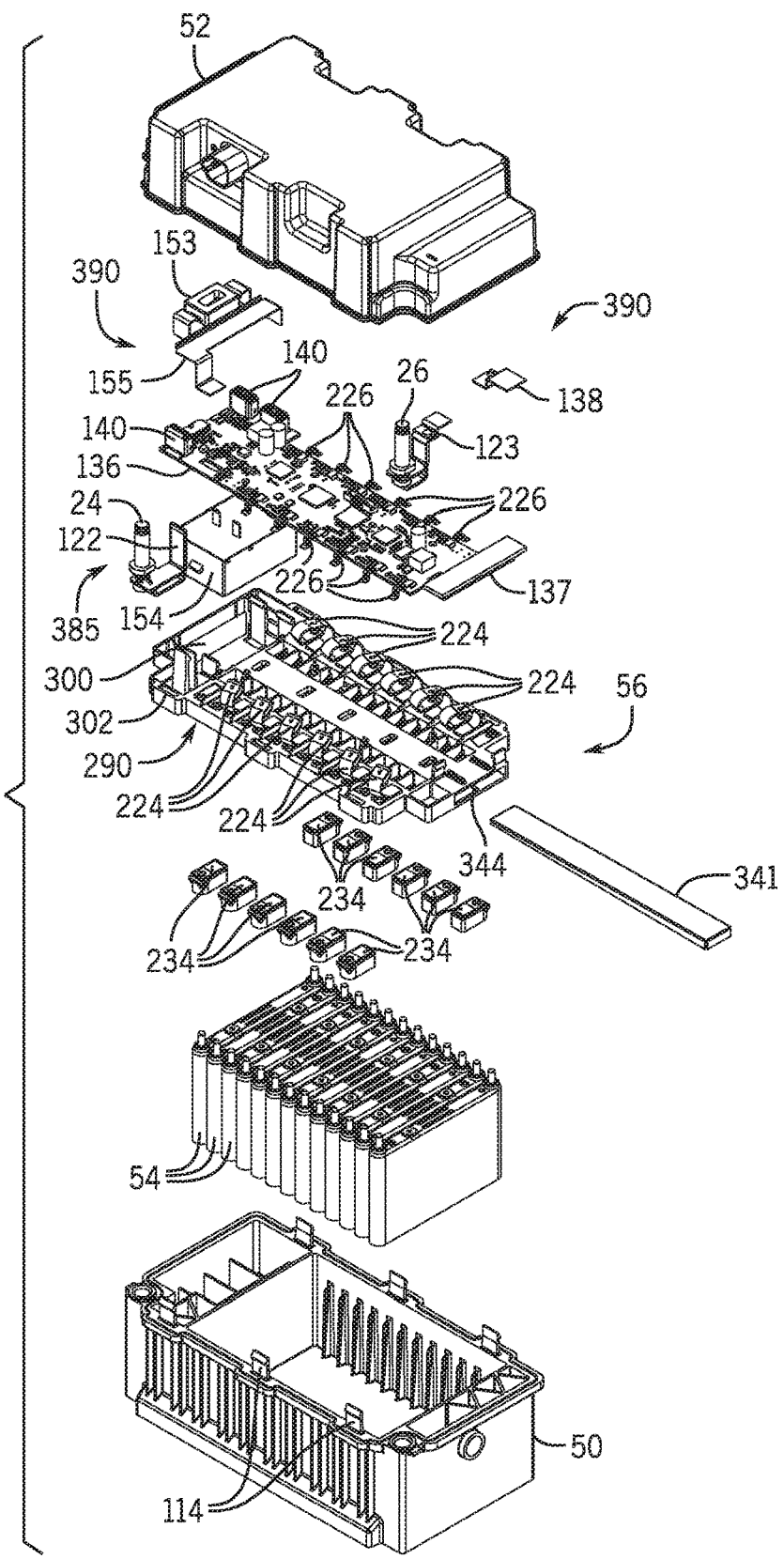
FIG. 49 is an exploded perspective view of the battery module of FIG. 5, in accordance with an embodiment of the present approach.
Figure 50:
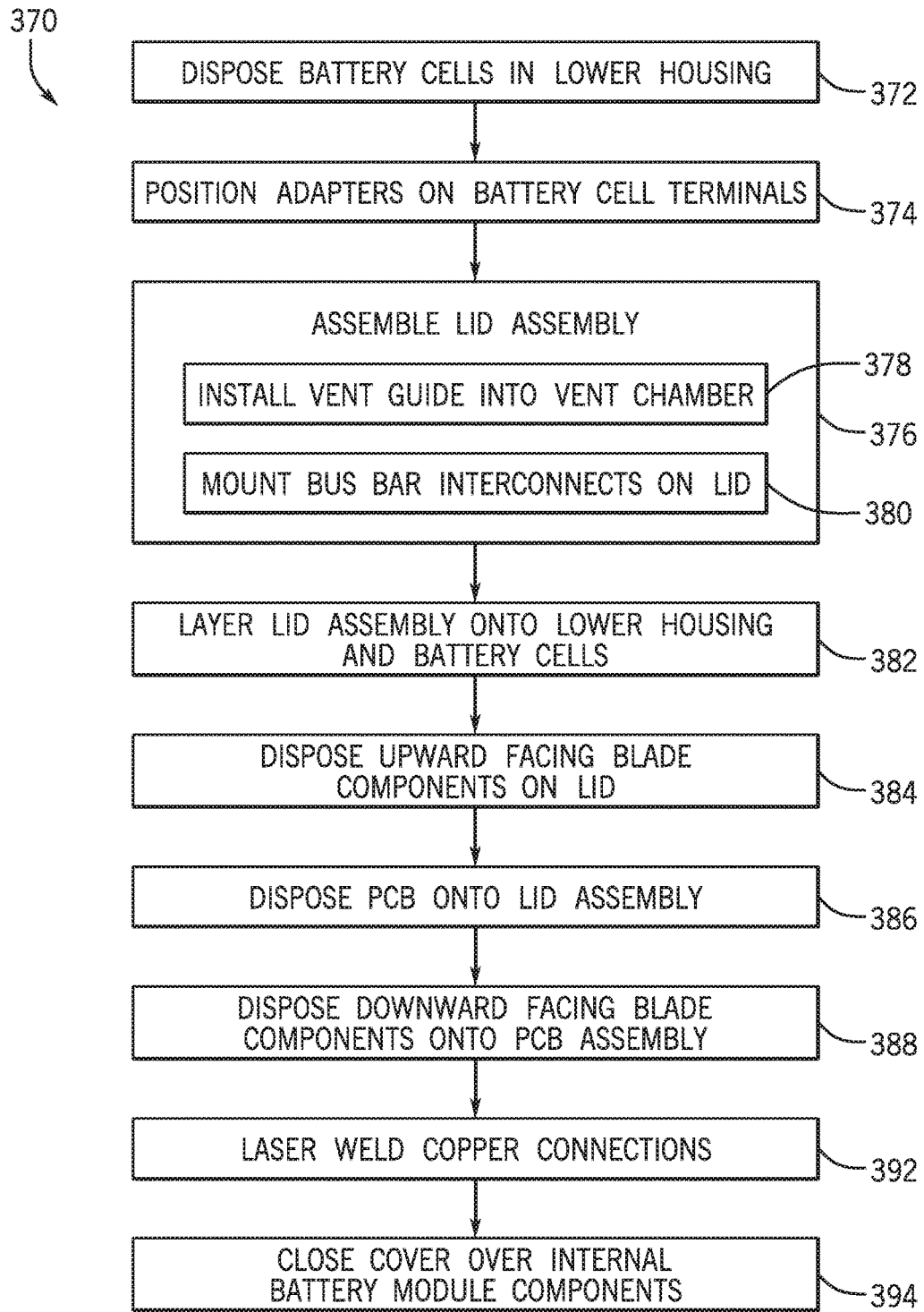
FIG. 50 is a process flow diagram of a method of assembling the battery module of FIG. 49, in accordance with an embodiment of the present approach.

FIG. 50 depicts a possible method 370 for assembling the battery module 22 of FIG. 49. As will be appreciated, some of the blocks representing steps of the method 370 may be eliminated in certain embodiments, and other orders of the illustrated blocks may be employed in accordance with present embodiments. The method 370 may include disposing the individual battery cells 54 into the slots 70 of the lower housing 50 at block 372. The battery cells 54 may be placed in the slots 70 individually or simultaneously. In some embodiments, the placement may be performed manually, while in other embodiments the placement may be performed using pick-and-place machinery. The adapters 234 may then be positioned on the aluminum post terminals of the battery cells 54 at block 374. As mentioned above, the adapters 234 may be used in embodiments in which the post terminals of the battery cells 54 are made of differing metals and the bus bar cell interconnects 222 are made from only one of the metals used for the post terminals. The adapters 234 may facilitate a transition between the pair of metals (e.g., copper to aluminum, or some other combination) used for the post terminals. In other embodiments, as mentioned above, the bus bar cell interconnects 222 may be links 260 that are made of both the metals used for the post terminals. In such embodiments, the links 260 facilitate transitions between the pair of metals. As such the adapters 234 may not be utilized, thereby reducing the number of components to be assembled within the battery module 22.

Next, the lid assembly 56 may be assembled at block 376. Block 376 may include, for example, installing the vent guide 341 into the vent chamber 298 of the lid 290 through the opening 344 at block 378. As mentioned above, the vent guide 341 is configured to direct gases vented from the battery cells 54 away from the PCB assembly 58. This insertion may be performed manually or via an installation instrument used to slide and secure the vent guide 341 within the vent chamber 298. In certain embodiments, the vent guide 341 may be integral with the lid 290 and block 378 may not be performed, which may reduce the complexity of assembling the lid assembly 56. Assembling the lid assembly 56 at block 376 may also include mounting the bus bar cell interconnects 222 (e.g., loops 224) onto the lid 290 at block 380. As noted above, the lid 290 may include a number of posts, walls, engagement features, indentations, or other features that facilitate such placement and alignment of the bus bar cell interconnects 222 onto the lid 290. In addition, the bus bar cell interconnects 222 and/or the mounting features on the lid 290 may be configured such that the bus bar cell interconnects 222 will be received in a mounted orientation only when they are aligned properly. This "proper" alignment may be an alignment of individual bus bar cell interconnects 222 relative to the lid 290 so that the bus bar cell interconnects 222 are oriented to electrically couple the battery cells 54 in a desired manner.

The fully assembled lid assembly 56 may then be layered (i.e. disposed) onto the lower housing 50 and the battery cells 54 (with their corresponding adapters 234) at block 382. As discussed above, the lower housing 50 may include attachment features that interface with corresponding attachment features on the lid 290 to secure the lid 290 with respect to the lower housing 50. For example, the lower housing 50 may include clips 114 that interface with corresponding slots 302 of the lid 290. As will be appreciated, this mating arrangement may be reversed in other embodiments. Next, components 385 with upward facing blade connectors may be disposed onto the lid 290 at block 384. This may include any components 385 of the battery module 22 that are configured to be coupled to the PCB 136 from below, as well as components 385 that are configured to extend through the PCB 136 from a position beneath the PCB 136. In the illustrated embodiment of FIG. 49, for example, these components 385 may include the contactor 154 and the battery terminal 24 coupled to its corresponding bladed portion 122 of connector 120. The lid 290 may include indentations or recessed features for receiving these components 385, such as the cavity 300 for receiving and supporting the contactor 154. In other embodiments, the method 370 may include disposing one or more of these components 385 in the lower housing 50 at a position beneath the lid 290. In such embodiments, the lid 290 may include openings through which the bladed components 385 may extend upward for coupling to other components of the battery module 22.

After the components 385 with upward facing blade connectors are disposed onto the lid 290 (and/or beneath the lid 290), the PCB 136 may be disposed onto the lid assembly 56 at block 386. At this point, the PCB 136 may be equipped with the high current interconnects 140, the voltage sense connection tabs 226, and the shunt 137 disposed thereon to form the PCB assembly 58. The voltage sense connection tabs 226 may be disposed on the PCB 136 such that each of the overhanging tabs 226 is aligned with a contact surface of a corresponding loop 224 (or other bus bar cell interconnect 222). Once properly aligned, the voltage sense connection tabs 226 may be coupled to the loops 224 via laser welding, as discussed in further detail below. As noted above, the shunt 137 may be disposed on and integral with the PCB 136, thereby reducing the complexity of assembling the PCB assembly 58. The high current interconnects 140 may be mounted to the PCB 136 such that they receive the upward facing blade connectors within the downward facing openings 145B of the high current interconnects 140, as described above. In addition, the high current interconnects 140 may be mounted on the PCB 136 and soldered into contact with various traces disposed on or within the PCB 136, as described above.

Components 390 with downward facing blade connectors may be disposed onto the components of the PCB assembly 58 at block 388. These components 390 may include any components that are configured to be coupled to the PCB 136 and/or to extend through the PCB 136 from a position above the PCB 136. In the illustrated embodiment, these components 390 include the fuse assembly 153, the bus bars 155 and 138, and the battery terminal 26 coupled to its corresponding connector 121. The components 390 may each be aligned to interface with certain components of the lower layers of the battery module 22. In particular, the components 390 with downward facing blade connectors may be inserted into the upward facing openings 145A of the high current interconnects 140, as described above. For instance, the bus bar 155 may be positioned such that one end is disposed in the upward facing opening 145A of one of the high current interconnects 140 and the opposite end is layered on top of one of the bus bar cell interconnects 222. The fuse assembly 153 may be aligned such that each of the bladed fuse connectors 157 extending downward from the fuse 156 are disposed in upward facing openings 145A of two high current interconnects 140 disposed on the PCB 136. The bus bar 138 may be positioned such that one end is in contact with the shunt 137 and an opposite end is disposed over an end of one of the bus bar cell interconnects 222. Further, the battery terminal 26 and corresponding connector 121 may be placed such that the bladed portion 123 of the connector 121 rests atop the shunt 137.

In addition, certain connections between components within the battery module 22 may be formed by laser welding at block 392. As described in detail below, all of the components may be visible for welding from above. In embodiments employing the adapters 234, the welded connections may be made between copper components. However, in other embodiments employing the links 260, the welded connections may be made between aluminum components. Finally, the cover 52 may be disposed over all of the internal components (e.g., PCB assembly 58, lid assembly 56, and battery cells 54) of the battery module 22 at block 394. Specifically, the cover 52 may interface with the lower housing 50 to provide a hermetic seal of the battery module 22. As noted above, the lower housing 50 and the cover 52 may be equipped with mating features (e.g., groove 116 and extension 117) to provide the desired seal. The cover 52 and the lower housing 50 together may form a relatively robust container and seal of the internal components of the battery module 22.

It should be noted that the above-described method 370 may enable relatively efficient and simple assembly of the battery module 22. In addition, the layering of the battery module components may result in a more space efficient design than would be possible with other arrangements. For example, the vent chamber 298 built into the lid 290 enables the PCB 136 to be disposed directly above the battery cells 54, without concern of overheating of the board components in the event of a burst event in one of the battery cells 54. In another example, electrically coupling high current components to one another and to the PCB 136 via the high current interconnects 140 may be done without cabling, fasteners, and other means traditionally used to make electrical and mechanical connections between high current components and a PCB. Furthermore, it should be noted that each of the various subassemblies (e.g., lower housing 50, battery cells 54, lid assembly 56, PCB assembly 58) may be fully assembled and then simply layered one on top of the other before any additional electrical connections (e.g., welding) are made.

Layered Printed Circuit Board for Improved Signal Protection

In addition to the large scale layering of subassemblies to form the battery module 22, smaller scale layering may be used to form the PCB 136 in a way that allows the PCB 136 to be layered within the battery module 22 as described above. In conventional multi-layered PCBs, the individual layers of the PCB are arranged such that the circuitry is exposed on the outer layers of the PCB. In vehicle battery contexts, this can expose the circuitry to exposed to electromagnetic interference when placed in close proximity to other electrical components. In particular, insulating layers within multi-layered PCBs may form the internal layers, while some or all of the circuitry, trace, and electronic components may be disposed on the external layers of the multi-layered PCB. As a result, such multi-layered PCBs will often be disposed in an electromagnetic compatibility (EMC) shield, such as a metal housing or cage. However, such shielding options increase the space requirements for any battery module or system that contains a conventional multi-layered PCB.

Figure 51:
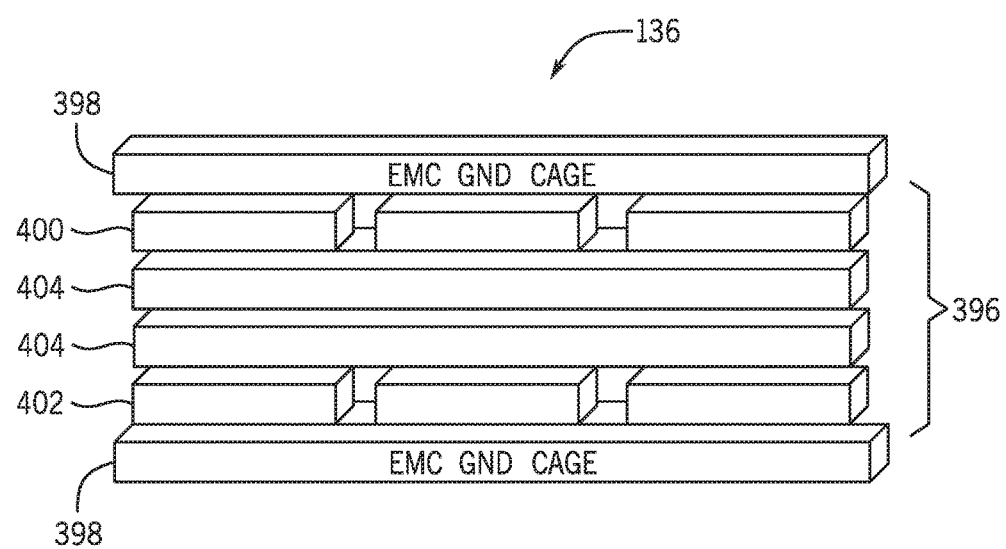
FIG. 51 is a perspective schematic view of layers of the PCB of FIG. 49, in accordance with an embodiment of the present approach.

To reduce the risk of electromagnetic interference without necessitating an external shield, the layers of the presently disclosed PCB 136 may be arranged as depicted in FIG. 51. As will be discussed further below, the layers of the PCB 136 may be arranged such that the layers containing circuitry, traces, and electronic components are the internal layers, such that the external layers shield the circuitry, traces, and electronic components. As such, the PCB 136 may still be manufactured using conventional PCB manufacturing techniques. Further, by foregoing the external shields, the PCB 136 may have a more space-efficient design than conventional PCBs, which may prove particularly advantageous for the layered battery module 22 described above.

As depicted in FIG. 51, the PCB 136 may include several signal layers 396 and two external ground cage layers 398. All of the signal layers 396 may be disposed between the ground cage layers 398. The signal layers 396 may include a distributed power layer 400, a distributed ground layer 402, and inner signal layers 404. All circuit signals may be routed on the inner signal layers 404 of the PCB 136. The power components and ground components of the circuitry present in the PCB 136 may be distributed across the outer surfaces of the inner signal layers 404 and electrically coupled to the distributed power layer 400 and the distributed ground layer 402 as necessary. Further, circuit ground loops may be constrained within the circuit in relatively small areas (e.g., electrically coupled to the distributed ground layer 402) along the inner signal layers 404.

The ground cage layers 398 may be made of a conductive material, and may form complete ground shields on both the top and bottom surfaces of the PCB 136. In certain embodiments, the ground cage layers 398 may include a thin layer of insulative material disposed on top of the conductive material. As such, the ground cage layers 398 may shield the internal circuitry of the PCB 136 from battery and vehicle noise. More specifically, the ground cage layers 398 may provide EMI protection of the battery electronics, which may need to measure very small signals with a high degree of accuracy. As mentioned above, instead of being disposed on the external layers of the PCB 136, all of the signal traces may be embedded within the PCB 136 on the inner signal layers 404. The external ground cage layers 398 may provide protection for the internal circuitry of the PCB 136 from high currents present in the bus bar cell interconnects 22 and the battery cells 54 located directly beneath the PCB 136. The ground cage layers 398 may also provide protection for the internal circuitry of the PCB 136 from electrical noise coming from the vehicle 10 outside of the battery module 22. In this way, the ground cage layers 398 may provide a level of protection that would not be available to a traditional PCB having electronic components and signal traces disposed on one or both external layers.

Because the ground cage layers 398 form a ground shield on both the top and bottom of the PCB 136, the PCB 136 does not have to employ EMI shielding options such as metal housings or cages. Indeed, the illustrated arrangement may allow the PCB 136 to be functional within the intended electromagnetic environment of the battery module 22 without experiencing undesirable functional issues or degradation due to omitting an external shield. For example, this particular arrangement of the PCB 136 may allow for the PCB to be placed in close proximity to the bus bars 155 and the battery cells 54 without being encased in a separate housing, thereby reducing the space requirements for the battery module 22. The robust layered design of the PCB 136 may work in conjunction with the other layered elements of the battery module 22 to reduce the overall size of the battery module 22.

As will be appreciated, a similar PCB layout may be used within a separate battery management system (BMS) to perform control and monitoring operations of the battery system 20. Such embodiments may include simply the illustrated PCB 136 enclosed in a simple plastic housing, as opposed to a larger metallic container.

Method for Establishing Connections Between Internal Battery Components

Figure 52:
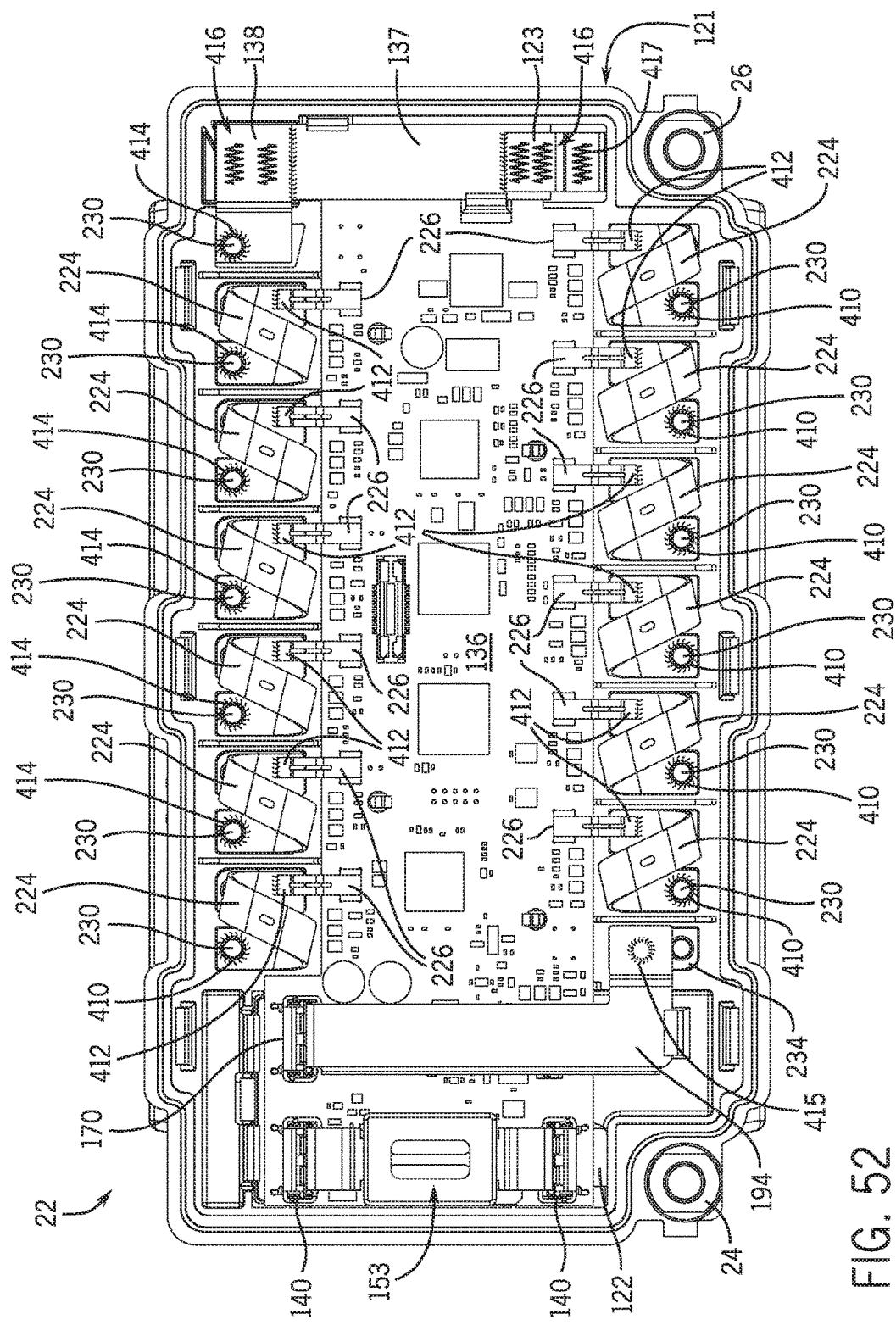
FIG. 52 is a top view of components of the battery module of FIG. 5 illustrating positions where welds can be made during assembly of the battery module, in accordance with an embodiment of the present approach.

As mentioned above with respect to the method 370, several components within the battery module 22 may be connected through laser welds. FIG. 52 is a top view of the battery module 22 without the cover 52, illustrating each of a set of welded connections (e.g., at welding points) that may be made during the assembly process. It should be noted that some of the welded connections and components discussed below (e.g., the adapters 234) may not be visible from the top view illustrated in FIG. 52, but these components are discussed with reference to FIG. 34.

The set of welded connections that may be made during assembly of the battery module 22 includes a number of different welding points. For example, all of the welding points relating to the bus bar cell interconnects 222 may be accessible from above the interconnect assembly 220. More specifically, the welding points for all of the welds between the copper terminals 230 of the battery cells 54 and the corresponding bus bar cell interconnects 222 may be accessible from above the battery cells 54 (e.g., welds 410). This may be the case in embodiments were each battery cell 54 has one copper terminal 230 and one aluminum terminal 232, as illustrated, as well as in embodiments where both terminals of each battery cell 54 are copper. In battery modules 22 that utilize the adapter 234 to transition between materials, all of the welding points for the welds between copper portions (e.g., ends 238) of the adapters 234 and the corresponding bus bar cell interconnects 222 may be accessible from above the battery cells 54. Further, all of the welding points for all of the welds between the voltage sense connection tabs 226 of the PCB 136 and the corresponding bus bar cell interconnects 222 may be accessible from above the battery cells 54 (e.g., welds 412). In some embodiments, the bus bar cell interconnects 22 may be specifically shaped (e.g., as loops 224) to make all of these welding points accessible from above.

Copper-to-copper welds made from above the battery cells 54 may also be used to join various other sets of welded components within the battery module 22. For example, all of the welding points for all of the welds between the shunt 137 of the PCB 136 and a first bus bar (e.g., the bus bar 138), between the shunt 137 and the bladed connector 121 (e.g., the bladed portion 123 of the bladed connector 121) of the battery module 22, or both, may be accessible from above the battery cells 54 (e.g., welds 416). Further, the welding point for the weld between the first bus bar 138 and either a corresponding copper terminal 230 of one of the battery cells 54 or a copper portion (e.g., the end 238) of a corresponding adapter 234 may be accessible from above the battery cells 54 (e.g., weld 414). Further, the welding point for the weld between a second bus bar (e.g., the second bus bar 155 coupled to the high current interconnect 140) of the battery module 22 and either the corresponding copper terminal 230 of one of the battery cells 54 or a copper portion (e.g., the end 238) of a corresponding adapter 234 may be accessible from above the battery cells 54 (e.g., weld 415). As discussed above, in some embodiments, the bladed terminal connector 121 may include the bladed portion 123, where the bladed portion 123 is integral (e.g., a part of a single structure) with the connector 121. However, in other embodiments, the bladed portion 123 may be a separate component from the connector 121. As such, the bladed portion 123 may be welded at a welding point to the connector 121, where the welding point is accessible from above the battery cells 54 (e.g., weld 417), and the bladed portion 123 may be welded to the shunt 137, as described above. Accordingly, the bladed portion 123 is welded to both the shunt 137 and the connector 121, such that the bladed portion 123 and the connector 121 together provide electrical communication between the shunt 137 and the terminal 26.

The illustrated components or sets of components may each be properly placed and aligned relative to each other, as discussed above. When the various connections between these components are made, the associated welding may be performed directly from above, as each welded connection is in full view from this perspective. Each of the components may be laser welded, and, in some embodiments, all of the welds may be between copper components or at least between components of the same material. This may streamline the manufacturing process, as the welds may each be formed via the same laser welding machine operating within a single setting.

In the illustrated embodiment, the bus bar interconnects 222 (e.g., loops 224) may be welded to the copper terminals 230 of the battery cells 54 via the welds 410 at one end (e.g., terminal mating end 242) of the bus bar interconnects 222. In addition, the voltage sense connection tabs 226, the bus bar interconnects 222, and the copper portion of the adapters 234 (e.g., as shown in FIG. 34) may be welded together via the welds 412 at the opposite end (e.g., plate contact end 240 (e.g., as shown in FIG. 34)) of the bus bar interconnects 222. As discussed above, these voltage sense connection tabs 226 may be initially coupled to the PCB 136 prior to placement of the PCB 136 onto the lid assembly 56. In addition to the above mentioned welded connections, the bus bars 138 and 155 may each be welded to a copper portion of an adjacent copper battery cell terminal 230 or a copper portion of the adapter 234 disposed on an adjacent aluminum battery cell terminal 232. Such welds 414 between these components may establish the connections between the battery cells 54 and the various high current components within the battery module 22. Further, the bus bar 138 and the bladed portion 123 may each be coupled to the shunt 137 via welds 416, in order to facilitate providing the power output from the battery cells 54 through the shunt 137 and into the bladed portion 123 of the battery terminal 26. At the other end of the battery module 22, the power output from the battery cells 54 may reach the opposing battery terminal 24 through the connected bus bar 155, the contactor 154, the fuse assembly 153, and the bladed portion 122.

In the illustrated embodiment, all of the high current connections made within the battery module 22 are either established via laser welding the components together (e.g., between the various bus bars, interconnects, voltage sense components, battery terminals, and terminal posts) or via the high current interconnects 140 (e.g., between the contactor, fuse assembly, bus bars, terminal posts, and on-board components of the PCB). This may facilitate a relatively efficient assembly method, especially when applied with the layering technique described above with reference to FIGS. 49 and 50. As noted above, the assembly may be configured such that all of the welds (e.g., the welds 410, 412, 414, 415, 416, and 417) are copper-to-copper welds. Additionally, the assembly may be configured such that welding points of all of the welds (e.g., points where the welds 410, 412, 414, 415, 416 and 417 are to be made) may be aligned such that a welding tool can access all of the welding points from above the battery cells 54. Further, all, most, or some of the welding points may be aligned on a substantially even level above the battery cells 54 such that the welding tool can access all of the welding points in a substantially level plane. However, it should be noted that other methods may exist for assembling the various embodiments of the battery module 22 disclosed herein.

While only certain features and embodiments of the disclosure have been illustrated and described, many modifications and changes may occur to those skilled in the art (e.g., variations in sizes, dimensions, structures, shapes and proportions of the various elements, values of parameters (e.g., temperatures, pressures, etc.), mounting arrangements, use of materials, colors, orientations, etc.) without materially departing from the novel teachings and advantages of the subject matter recited in the claims. The order or sequence of any process or method steps may be varied or re-sequenced according to alternative embodiments. It is, therefore, to be understood that the appended claims are intended to cover all such modifications and changes as fall within the true spirit of the disclosed embodiments. Furthermore, in an effort to provide a concise description of the exemplary embodiments, all features of an actual implementation may not have been described. It should be appreciated that in the development of any such actual implementation, as in any engineering or design project, numerous implementation specific decisions may be made. Such a development effort might be complex and time consuming, but would nevertheless be a routine undertaking of design, fabrication, and manufacture for those of ordinary skill having the benefit of this disclosure, without undue experimentation.

The invention claimed is:

1. A battery module, comprising:
   a housing;
   a plurality of battery cells disposed in the housing; and
   a printed circuit board (PCB) assembly disposed in the housing, wherein the PCB assembly comprises a PCB having an upper PCB surface through which an electrical connector of the PCB is exposed, and wherein the PCB assembly comprises a shunt having a bottom shunt surface in direct contact with the upper PCB surface and with the electrical connector exposed through the upper PCB surface, such that the shunt is in electrical communication with the electrical connector of the PCB.

2. The battery module of claim 1, comprising a processor or measurement device, wherein the electrical connector is electrically coupled between the shunt and the processor or measurement device.

3. The battery module of claim 2, wherein an additional electrical connector is exposed through the upper PCB surface of the PCB, wherein the additional electrical connector is electrically coupled between the shunt and either the processor, the measurement device, or an additional measurement device.

4. The battery module of claim 2, wherein the processor or measurement device is configured to measure a voltage output of the battery module, a current of the battery module, or both.

5. The battery module of claim 1, comprising a bus bar electrically coupled between an end battery cell of the plurality of battery cells and the shunt of the PCB assembly.

6. The battery module of claim 5, comprising:
   a battery module terminal configured to be coupled to a load powered by the battery module; and
   a connector electrically coupled between the battery module terminal and the shunt.

7. The battery module of claim 6, wherein the bus bar directly contacts an upper shunt surface that is opposite the bottom shunt surface, and wherein the connector directly contacts the upper shunt surface.

8. The battery module of claim 7, wherein the bus bar directly contacts the upper shunt surface on a first end of the shunt, and wherein the connector directly contacts the upper shunt surface on a second end of the shunt opposing the first end of the shunt.

9. The battery module of claim 6, wherein the shunt is configured to provide a low resistance path between the bus bar of the battery module and the battery module terminal.

10. The battery module of claim 1, wherein the electrical connector is configured to enable the PCB to monitor characteristics of an electrical flow through the shunt.

11. The battery module of claim 1, comprising:
    a battery module terminal configured to be coupled to a load powered by the battery module; and
    a bus bar electrically coupled between an end battery cell of the plurality of battery cells and the shunt of the PCB assembly, wherein the shunt is configured to provide a low resistance path between the bus bar of the battery module and the battery module terminal.

12. A method of manufacturing a battery module, comprising:
    exposing an electrical connector through an upper printed circuit board (PCB) surface of a PCB of a PCB assembly;
    disposing a shunt on and above the upper PCB surface such that a bottom shunt surface of the shunt directly contacts the upper PCB surface of the PCB and the electrical connector exposed through the upper PCB surface, and such that the shunt is in electrical communication with the electrical connector;

coupling a bus bar to the shunt, wherein the bus bar is configured to be coupled to a plurality of battery cells of the battery module; and coupling a connector to the shunt, wherein the connector is configured to be coupled to a battery module terminal of the battery module;

wherein the bus bar is coupled directly to a first end of the shunt along an upper shunt surface that is opposite the bottom shunt surface of the shunt, wherein the connector is coupled directly to a second end of the shunt along the upper shunt surface of the shunt.

13. A battery module having a printed circuit board (PCB) assembly, comprising:

a plurality of battery cells;

a PCB of the PCB assembly, wherein the PCB includes an upper PCB surface through which an electrical connector is exposed; and a shunt having a bottom shunt surface in direct contact with the upper PCB surface and with the electrical connector exposed through the upper PCB surface such that the shunt is in electrical communication with the electrical connector, wherein the shunt is configured to provide a low resistance path between an end cell of the plurality of battery cells and a battery module terminal configured to be coupled to a load powered by the battery module.

14. The PCB assembly of claim 13, comprising a processor or measurement device of the PCB assembly, wherein the electrical connector is electrically coupled between the shunt and the processor or measurement device of the PCB assembly.

15. The PCB assembly of claim 14, wherein an additional electrical connector is exposed through the upper PCB surface of the PCB, and wherein the additional electrical connector is electrically coupled between the shunt and either the processor, the measurement device, or an additional measurement device.

16. The PCB assembly of claim 14, wherein the processor or measurement device is configured to measure a voltage output of the battery module, a current of the battery module, or both.

17. The PCB assembly of claim 13, wherein the shunt is in direct contact with both the electrical connector and the upper PCB surface.

* * * * *